United States Patent
Okada et al.

(10) Patent No.: US 8,760,529 B2
(45) Date of Patent: Jun. 24, 2014

(54) SOLID-STATE IMAGE SENSOR AND IMAGE CAPTURE DEVICE INCLUDING THE SENSOR

(71) Applicant: Panasonic Corporation, Osaka (JP)

(72) Inventors: Yusuke Okada, Osaka (JP); Hiroyoshi Komobuchi, Kyoto (JP); Takeo Azuma, Kyoto (JP); Taro Imagawa, Osaka (JP); Sanzo Ugawa, Osaka (JP)

(73) Assignee: Panasonic Corporation, Osaka (JP)

( * ) Notice: Subject to any disclaimer, the term of this patent is extended or adjusted under 35 U.S.C. 154(b) by 21 days.

(21) Appl. No.: 13/727,834

(22) Filed: Dec. 27, 2012

(65) Prior Publication Data

US 2013/0113971 A1 May 9, 2013

Related U.S. Application Data

(63) Continuation of application No. PCT/JP2012/000993, filed on Feb. 15, 2012.

(30) Foreign Application Priority Data

Mar. 24, 2011 (JP) ................................. 2011-066499

(51) Int. Cl.
| | |
|---|---|
| H04N 5/235 | (2006.01) |
| H04N 5/374 | (2011.01) |
| H04N 9/04 | (2006.01) |
| H04N 5/335 | (2011.01) |
| H04N 3/14 | (2006.01) |

(52) U.S. Cl.
CPC ............. *H04N 5/335* (2013.01); *H04N 5/3742* (2013.01); *H04N 9/045* (2013.01)
USPC ........ 348/221.1; 348/241; 348/294; 348/308; 348/316

(58) Field of Classification Search
CPC ... H04N 5/2355; H04N 5/2356; H04N 5/243; H04N 5/2258; H04N 5/3454; H04N 5/2353
USPC .............. 348/221.1, 241, 272, 279, 294, 308, 348/311, 314
See application file for complete search history.

(56) References Cited

U.S. PATENT DOCUMENTS 6,958,778 B2 * 10/2005 Fukushima ................... 348/363
7,095,434 B1    8/2006 Ikeda
(Continued)

FOREIGN PATENT DOCUMENTS

| JP | 08-037628 A | 2/1996 |
|---|---|---|
| JP | 2003-250162 A | 9/2003 |

(Continued)

OTHER PUBLICATIONS

International Search Report for corresponding International Application No. PCT/JP2012/000993 mailed May 22, 2012.
(Continued)

*Primary Examiner* — Hung Lam
(74) *Attorney, Agent, or Firm* — Renner, Otto, Boisselle & Sklar, LLP

(57) ABSTRACT

In an embodiment, an image sensor includes pixels arranged in columns and rows, read signal lines connected to pixels arranged in the row direction. Each pixel is read in either a first exposure time or in a second exposure time shorter than the first exposure time. Each of a first type of read signal lines is connected to a group of pixels associated with the first exposure time, and each of a second type of read signal lines is connected to a group of pixels associated with the second exposure time. In two vertically adjacent horizontal pixel lines, the first type of read signal line is shared by two horizontally adjacent pixels associated with the first exposure time, and the second type of read signal line is shared by two horizontally adjacent pixels associated with the second exposure time.

23 Claims, 42 Drawing Sheets

(56) References Cited

U.S. PATENT DOCUMENTS

| | | | |
|---|---|---|---|
| 7,508,435 B2 * | 3/2009 | Loew et al. | 348/316 |
| 7,719,582 B2 * | 5/2010 | Wada et al. | 348/272 |
| 8,022,994 B2 * | 9/2011 | Luo et al. | 348/208.1 |
| 8,243,160 B2 * | 8/2012 | Azuma et al. | 348/222.1 |
| 8,576,319 B2 * | 11/2013 | Kureta et al. | 348/315 |
| 2009/0091645 A1 | 4/2009 | Trimeche et al. | |
| 2010/0315534 A1 | 12/2010 | Azuma et al. | |
| 2010/0315539 A1 | 12/2010 | Azuma et al. | |
| 2011/0043670 A1 | 2/2011 | Azuma et al. | |

FOREIGN PATENT DOCUMENTS

| | | |
|---|---|---|
| JP | 2007-088842 A | 4/2007 |
| JP | 2009-272820 A | 11/2009 |
| WO | 2009/019823 A1 | 2/2009 |
| WO | 2009/019824 A1 | 2/2009 |
| WO | 2009/044246 A1 | 4/2009 |
| WO | 2010/090025 A1 | 8/2010 |

OTHER PUBLICATIONS

Takeo Azuma et al., "A 2.2/3-inch 4K2K CMOS Image Sensor Based on Dual Resolution and Exposure Technique", Proceedings in IEEE International Solid-State Circuit Conference 2010, pp. 408-410, 2010.

P. Anandan, "A Computational Framework and an Algorithm for the Measurement of Visual Motion", International Journal of Computer Vision, vol. 2, pp. 283-310, 1989.

* cited by examiner

FIG.2C
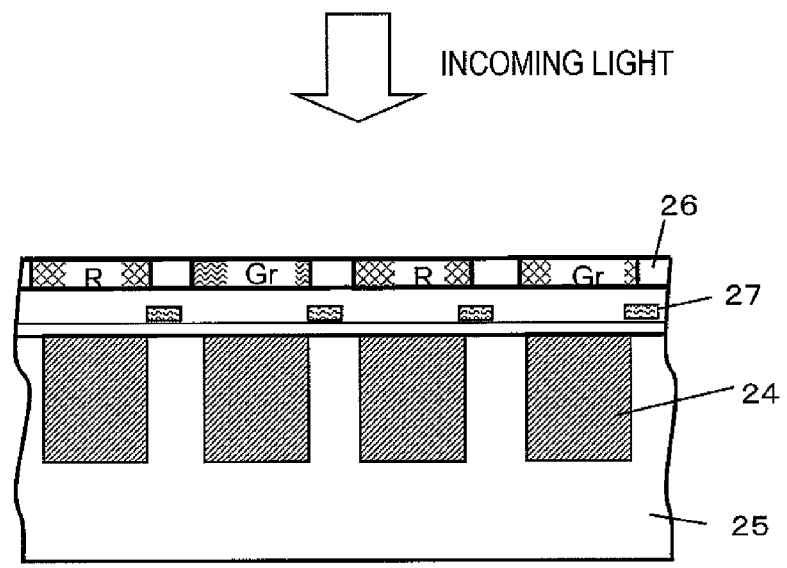
FIG.2D
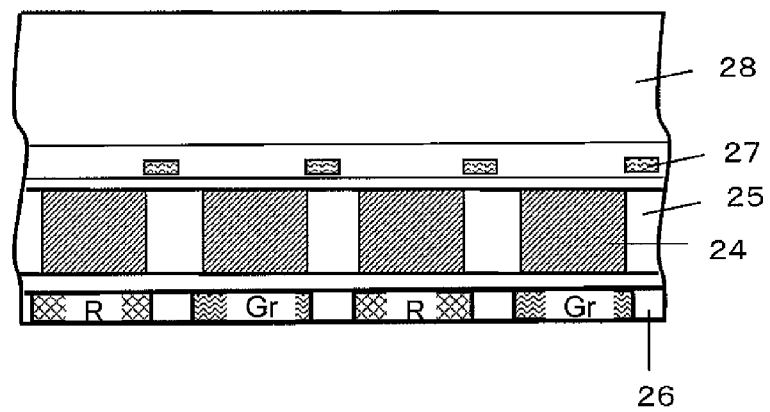

FIG.13
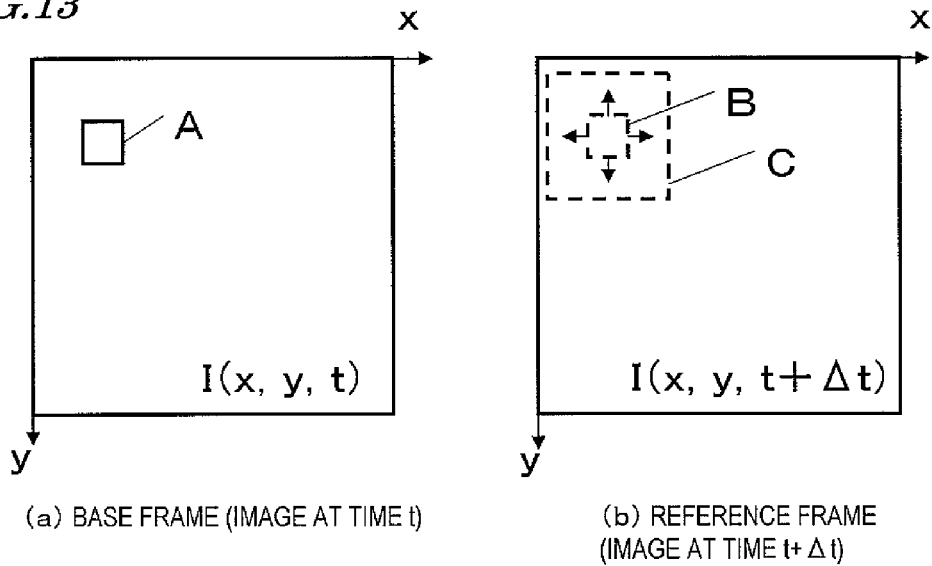
(a) BASE FRAME (IMAGE AT TIME t)
(b) REFERENCE FRAME (IMAGE AT TIME t+Δt)
FIG.14
t=0
| $R_{000}$ | $G_{100}$ | $R_{200}$ | $G_{300}$ |
|---|---|---|---|
| $G_{010}$ | $B_{110}$ | $G_{210}$ | $B_{310}$ |
t=1
| $R_{001}$ | $G_{101}$ | $R_{201}$ | $G_{301}$ |
|---|---|---|---|
| $G_{011}$ | $B_{111}$ | $G_{211}$ | $B_{311}$ |
FIG.15
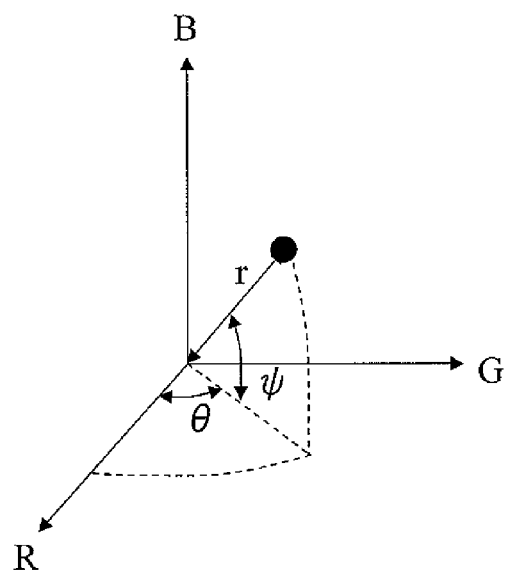

PSNR=36.4

*FIG.32*
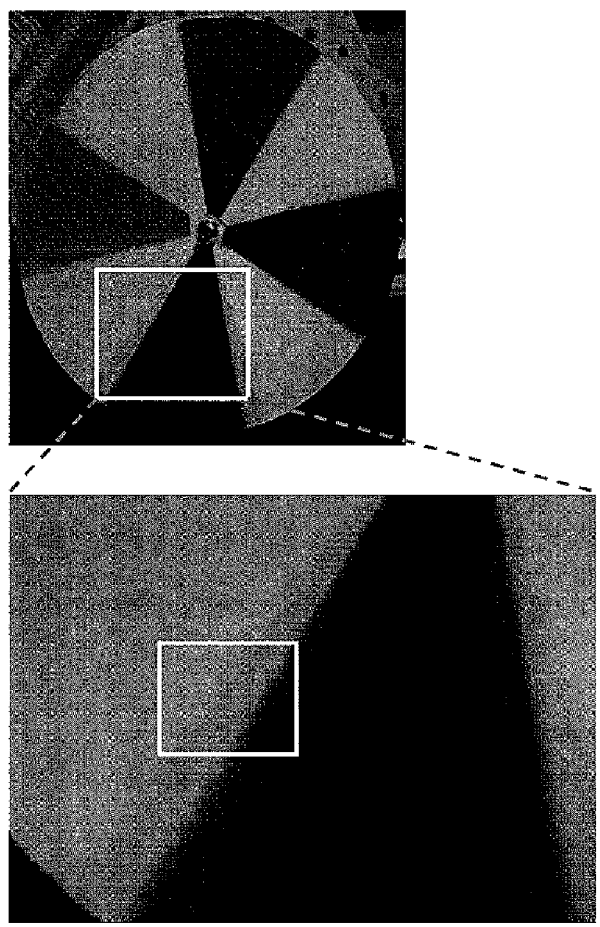
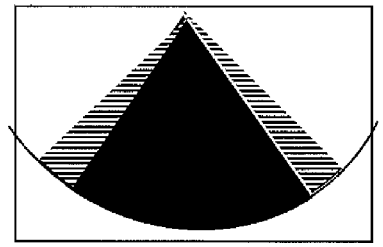
SCHEMATIC REPRESENTATION
PSNR=32.2

PSNR=35.8

FIG.41
(a)
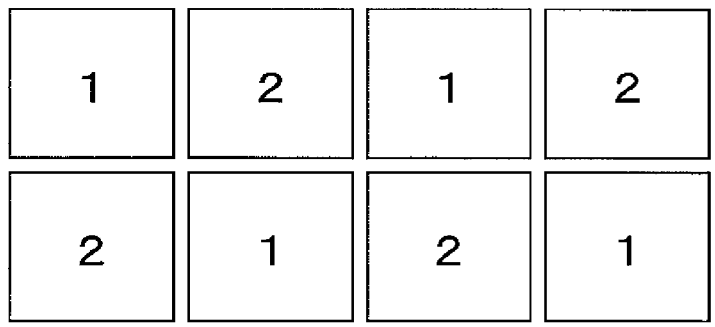
(b)
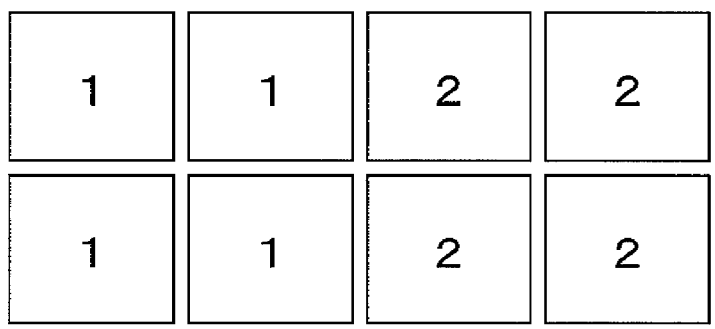
(c)
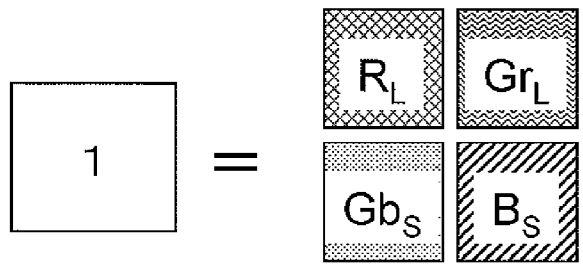
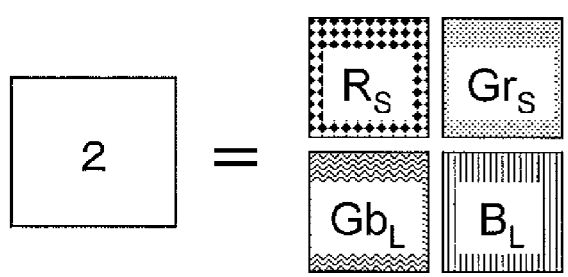

SOLID-STATE IMAGE SENSOR AND IMAGE CAPTURE DEVICE INCLUDING THE SENSOR

This is a continuation of International Application No. PCT/JP2012/000993, with an international filing date of Feb. 15, 2012, which claims priority of Japanese Patent Application No. 2011-066499, filed on Mar. 24, 2011, the contents of which are hereby incorporated by reference.

TECHNICAL FIELD

The present disclosure relates to a solid-state image sensor and an image capture device including the solid-state image sensor. More particularly, the present disclosure relates to a solid-state image sensor and image capture device which can capture an image at multiple different frame rates for respective groups of pixels.

DESCRIPTION OF THE RELATED ART

A known solid-state image sensor includes a semiconductor layer in which photoelectric transducers such as photodiodes are arranged two-dimensionally and an array of color filters which is arranged closer to the light source than the semiconductor layer is. A color filter limits the wavelength of a light ray to be incident on each photoelectric transducer to a particular wavelength range such as the R (red), G (green) or B (blue) wavelength range. In each pixel of the solid-state image sensor, a light ray that has been transmitted through a color filter in the color allocated to that pixel (i.e., an R, G or B ray) is received at the photoelectric transducer. The photoelectric transducer generates a quantity of electric charge corresponding to the quantity of the light ray that has been incident on the pixel and then transmitted through the color filter of that pixel (which will be referred to herein as "incident light quantity").

Those pixels are arranged in rows and columns on the image capturing plane of the solid-state image sensor. In order to address respective pixels and read a signal representing the quantity of electric charge that has been stored in a pixel of interest (i.e., a pixel signal), a lot of signal lines that are connected to those pixels and peripheral circuits that are connected to those signal lines are needed.

In a CMOS image sensor, a photoelectric transducer and a plurality of transistors to read a signal with a level representing the quantity of electric charge that has been generated by the photoelectric transducer are arranged in an area corresponding to one pixel of the image capturing plane. Thus, one "pixel" of a CMOS image sensor is ordinarily made up of a single photoelectric transducer and multiple transistors.

In this specification, a pixel in which a filter that transmits an R ray (i.e., an R filter) is arranged closer to the light source, a pixel in which a filter that transmits a G ray (i.e., a G filter) is arranged closer to the light source, and a pixel in which a filter that transmits a B ray (i.e., a B filter) is arranged closer to the light source will be referred to herein as an "R pixel", a "G pixel" and a "B pixel", respectively, for the sake of simplicity. Also, an image obtained from multiple R pixels that are arranged on an image sensor, an image obtained from multiple G pixels arranged there, and an image obtained from multiple B pixels arranged there will be referred to herein as an "R image", a "G image" and a "B image", respectively. These images can be obtained by reading pixel signals from a lot of pixels that are arranged on the image capturing plane.

The image data is read on a frame-by-frame basis. And the number of times image data is read per second is called a "frame rate".

In order to obtain a high-resolution, high-frame-rate moving picture using such a solid-state image sensor, not just the resolution needs to be increased by reducing the area of each pixel but also the frame rate needs to be increased by shortening the charge storage period (i.e., exposure time) of respective pixels. However, if the area of each pixel were reduced and if the exposure time were shortened, then the quantity of the light incident on each pixel would decrease. And since such a decrease in the quantity of light incident will lower the output level of a pixel signal, the SNR (signal to noise ratio) of a moving picture will eventually decrease, which is a problem.

SUMMARY

The prior art technique needs further improvement in view of image quality.

One non-limiting, and exemplary embodiment provides an image sensor and image capture device that can obtain an image with the occurrence of such color smearing minimized even when an image is captured in a long exposure time for at least some pixels to ensure a sufficient quantity of light.

A solid-state image sensor according to the present disclosure includes: a pixel array including a plurality of pixels that are arranged in columns and rows; a plurality of read signal lines, each of which is connected to a number of pixels that are arranged in a row direction; a plurality of output signal lines, each of which is connected to a number of pixels that are arranged in a column direction; and a color filter array which defines the color components of light rays to be incident on the plurality of pixels. In the pixel array, first pixel groups, each of which is made up of a plurality of pixels that captures an image in a first exposure time, and second pixel groups, each of which is made up of a plurality of pixels that captures an image in a second exposure time that is shorter than the first exposure time, are alternately arranged in either the row direction or the column direction. The plurality of read signal lines are classified into a first type of read signal lines that are connected to the first pixel groups and a second type of read signal lines that are connected to the second pixel groups. The color filter array makes light rays with mutually different color components incident on a number of pixels that are included in each said first pixel group and also makes light rays with mutually different color components incident on a number of pixels that are included in each said second pixel group.

An image processing method according to the present disclosure includes the steps of: receiving, from a solid-state image sensor according to any of the embodiments described above, a first moving picture that has been captured in the first exposure time and a second moving picture that has been captured in the second exposure time; and performing image quality improvement processing by generating, based on the first and second moving pictures, a color moving picture having a higher frame rate than the first moving picture.

A computer program according to the present disclosure is stored on a non-transitory tangible medium and is configured to generate a new moving picture based on a plurality of moving pictures. The computer program makes a computer which executes the computer program perform an image processing method according to any of the embodiments described above.

A storage medium according to the present disclosure has stored thereon the computer program described above.

These general and specific aspects may be implemented using a system, a method, and a computer program, and any combination of systems, methods, and computer programs.

Additional benefits and advantages of the disclosed embodiments will be apparent from the specification and Figures. The benefits and/or advantages may be individually provided by the various embodiments and features of the specification and drawings disclosure, and need not all be pro-vided in order to obtain one or more of the same.

BRIEF DESCRIPTION OF THE DRAWINGS

FIG. 2C is a partial cross-sectional view illustrating an exemplary configuration for the image sensor according to the first embodiment of the present disclosure.

FIG. 2D is a partial cross-sectional view illustrating another exemplary configuration for the image sensor according to the first embodiment of the present disclosure.

FIGS. 13(a) and 13(b) illustrate how a motion detecting section 1101 according to the first embodiment of the present disclosure operates.

FIG. 14 shows exemplary pixel arrangements in an image sensor according to the first embodiment of the present disclosure.

FIG. 15 illustrates how coordinate conversion is carried out in a color space during the image quality improvement processing according to the first embodiment of the present disclosure.

FIG. 32 shows an exemplary result of image quality improvement processing that has been performed by the image capture device with the configuration shown in FIG. 30.

FIGS. 41(a) and 41(b) illustrate exemplary arrangements of Blocks 1 and 2 and FIG. 41(c) illustrates exemplary pixel arrangements of Blocks 1 and 2.

DETAILED DESCRIPTION

Figure 1A:
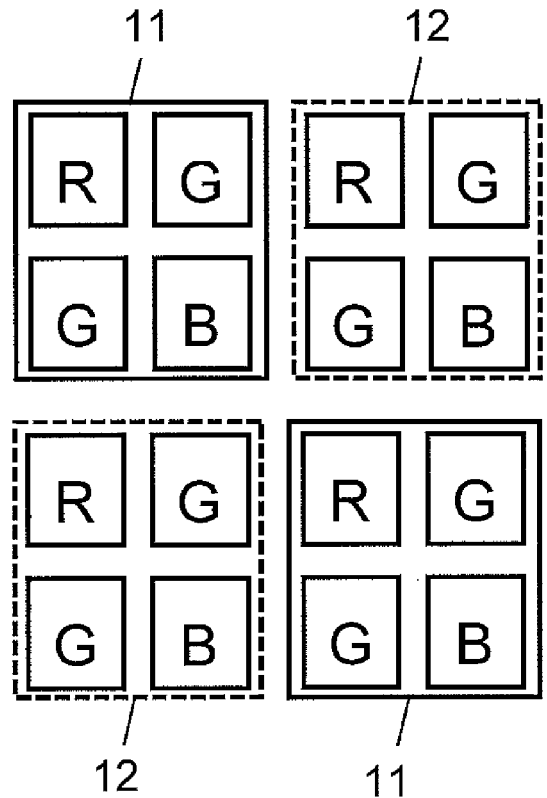
FIG. 1A illustrates an exemplary arrangement of pixel groups in an image sensor according to the present disclosure.

It was proposed that the R, G and B color components be captured at mutually different resolutions and in mutually different exposure times. For that purpose, a technique for separating incident light into R, G and B components and capturing images using two different image sensors for two groups formed by these color components is disclosed in PCT International Application Publication No. 2009/019823 and PCT International Application Publication N 2009/019824. For example, if R and B color components are captured at a low resolution and a high frame rate, images with a temporally high resolution can be obtained for the R and B color components. Meanwhile, if the G color component is captured at a high resolution and a low frame rate, then the exposure time and spatial resolution required can be secured for the G color component and a sufficient quantity of light can be obtained. As a result, a G image with a high SNR can be obtained at a high spatial resolution. And if a high-resolution, high-frame-rate moving picture is restored by performing image processing on those color component images that have been captured at a low resolution and a high frame rate and the color component image that has been captured at a high resolution and a low frame rate, a high-resolution and high-frame-rate color moving picture can be obtained. Meanwhile, a technique for performing such an image capturing and image quality improvement process on a single-panel image sensor is also disclosed in PCT International Application Publication No. 2010/090025.

If images are captured using different exposure times and different frame rates on a color component basis as described above, pixel signals are output from the image sensor at mutually different times from one color component to another. That is why to perform such an image capturing process using a single-plate color image sensor, read signals need to be supplied to multiple groups of pixels associated with the respective color components at respective timings corresponding to their frame rates independently of each other and the pixel signals representing the respective color components need to be output independently of each other.

In order to set the frame rate for obtaining a G image to be lower than the frame rate for obtaining R and B images in a single-panel color image sensor, the time interval at which a signal representing the electric charge that has been stored in G pixels is read needs to be longer than the time interval at which a signal representing the electric charge that has been stored in R and B pixels is read. The article "A 2.2/3-inch 4K2K CMOS Image Sensor Based on Dual Resolution and Exposure Technique" by Takeo Azuma, Taro Imagawa, Sanzo Ugawa, Yusuke Okada, Hiroyoshi Komobuchi, Motonori Ishii, Shigetaka Kasuga, Yoshihisa Kato discloses an image sensor which supplies pixel output read signals to the R, G and B pixels independently of each other and which can read signals from two pixels that are adjacent to each other in the column direction (i.e., vertically) in parallel with each other.

Figure 35:
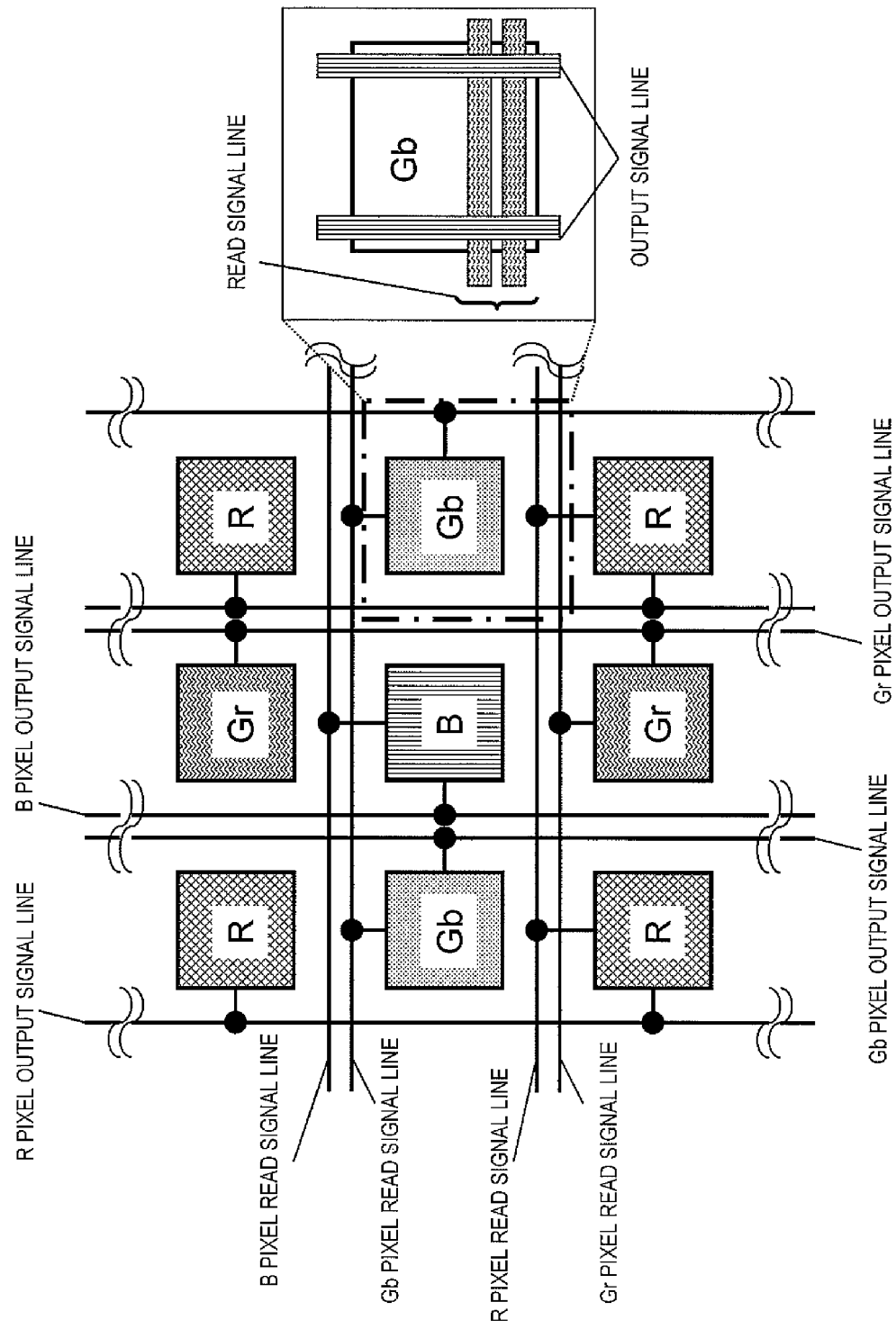
FIG. 35 illustrates how to connect read signal lines and output signal lines in a known single-panel image sensor.

FIG. 35 illustrates a configuration for a single-panel image sensor as disclosed in the article "A 2.2/3-inch 4K2K CMOS Image Sensor Based on Dual Resolution and Exposure Technique". In FIG. 35, the reference sign R denotes pixels that detect the intensity of the R component of incident light, the reference sign B denotes pixels that detect the intensity of the B component of the incident light, and the reference signs Gr and Gb denote pixels that detect the intensity of the G component of the incident light. In this image sensor, rows in which R and G pixels are alternately arranged horizontally (RG rows) and rows in which B and G pixels are alternately arranged horizontally (BG rows) vertically alternate with each other.

In this description, the G pixels of the RG rows will be referred to herein as "Gr pixels" and the G pixels of the BG rows will be referred to herein as "Gb pixels". According to the article "A 2.2/3-inch 4K2K CMOS Image Sensor Based on Dual Resolution and Exposure Technique", the exposure time of the G pixels is supposed to be longer than that of the R and B pixels and the G pixel signals are supposed to be output at a low frame rate. As shown in FIG. 35, read signal lines for passing read signals to respective pixels and output signal lines for passing the pixel output signals to the processing of the next stage, including A/D conversion, are separately provided for R, G and B pixels. As a result, as shown on the right-hand side of this drawing, two signal lines, namely one read signal line that is connected to the R or B pixels and another read signal line that is connected to the G pixels, run horizontally along each row of pixels.

Meanwhile, two more signal lines, namely one output signal line that is connected to the R or B pixels and another output signal line that is connected to the G pixels, run vertically along each column of pixels. By adopting such a configuration, read signals can be supplied independently of each other to the R, B and G pixels and outputs can be obtained (i.e., signals can be read) in parallel with each other from the pixels in respective colors.

Japanese Laid-Open Patent Publication No. 2009-272820 discloses a solid-state image sensor including multiple groups of pixels with mutually different frame rates. Meanwhile, PCT International Application Publication No. 2009/044246 discloses an image sensor including multiple groups of pixels that have the same frame rate but have mutually different exposure times.

However, if the subject is moving, such a color component image that has been captured at a high resolution and a low frame rate will be an image with motion blur. Particularly, the G component image is captured through a long exposure process according to those techniques of the related art. That is why especially when the subject is moving so significantly as to exceed the system defined detection range or moving in a complicated pattern that involves deformation of the subject, motion could not be detected successfully from the RB component image. In that case, the motion blur of the G component could not be removed perfectly but would be left in the image that has been subjected to the image quality improvement processing. As a result, smearing of the color green or its complementary color magenta would occur. Thus, although the quality of the moving picture obtained is generally high in most cases, such color smearing is sometimes observed in a part of an image where it is difficult to detect the motion successfully even after that image has been subjected to the image quality improvement processing. That is to say, there is still room for improvement of the image quality.

Also, if those color component images are captured with the frame rate changed on a color-by-color basis as described above by using a single-panel color image sensor, the arrangement of pixels in the respective colors, the arrangement of long-exposure pixels (i.e., low-frame-rate pixels) and the arrangement of short-exposure pixels (i.e., high-frame-rate pixels) all need to be symmetric ones, considering the performance of the processing of restoring a high-resolution, high-frame-rate output color image. In this case, the "symmetric arrangement of pixels in the respective colors" does not refer to an arrangement in which pixels in the same color are arranged in a row either vertically or horizontally on the image capturing plane but does refer to an arrangement in which RGB pixels are arranged alternately and distributed uniformly on the image capturing plane as is generally known as a "Bayer arrangement". Also, the "symmetric arrangement of long-exposure pixels or short-exposure pixels" does not refer to an arrangement in which long-exposure or short-exposure pixels are concentrated at a particular location but refers to an arrangement in which the arrangement of long-exposure pixels alternates with the arrangement of short-exposure pixels every certain number of pixels as in the arrangement of pixels in the respective colors.

Furthermore, an image sensor that generates an input image by such an image quality improving method suitably has a configuration that can ensure as large an aperture area as possible with the number of metal lines over each pixel reduced in order to increase the sensitivity of the pixel itself. However, in a known single-panel image sensor with a configuration in which the exposure time is changed on a pixel by pixel basis, two read signal lines are arranged for each row of pixels and two output signal lines are arranged for each column of pixels as shown in FIG. 35, for example. That is why since those signal lines account for a greater percentage of the given image capturing area, the aperture area of each pixel decreases, so does the light condensing ability of each pixel, thus eventually causing a decrease in sensitivity. It should be noted that a problem with the solid-state image sensor disclosed in Japanese Laid-Open Patent Publication No. 2009-272820 is an increase in the number of lines to provide. On the other hand, in the image sensor disclosed in PCT International Application Publication No. 2009/044246, every pixel has the same frame rate, which is also a problem.

The present inventors perfected our disclosure in order to overcome these problems, and an object of the present disclosure is to provide an image sensor and image capture device that can obtain an image with the occurrence of such color smearing minimized even when an image is captured in a long exposure time for at least some pixels to ensure a sufficient quantity of light.

Another object of the present disclosure is to provide an image processing method, by which a high-resolution moving picture can be generated based on the output of the image sensor, and also provide a computer program for carrying out that processing method.

A solid-state image sensor according to the present disclosure includes: a pixel array including a plurality of pixels that are arranged in columns and rows; a plurality of read signal lines, each of which is connected to a number of pixels that are arranged in a row direction; a plurality of output signal lines, each of which is connected to a number of pixels that are arranged in a column direction; and a color filter array which defines the color components of light rays to be incident on the plurality of pixels.

First of all, an exemplary arrangement of pixels in a pixel array according to the present disclosure will be described with reference to FIG. 1A. In the example illustrated in FIG. 1A, a first pixel group 11 comprised of multiple pixels to capture an image in a first exposure time and a second pixel group 12 comprised of multiple pixels to capture an image in a second exposure time, which is shorter than the first exposure time, are arranged alternately in the pixel array either in the row direction or in the column direction. In FIG. 1A, illustration of read signal lines and output signal lines is omitted for the sake of simplicity. In FIG. 1A, the rectangular areas identified by the signs R, G and B represent pixels on which red (R), green (G) and blue (B) rays that have been transmitted through color filters are incident. In the real pixel array, a much greater number of pixels are actually arranged in columns and rows. Although four pixel groups are illustrated in FIG. 1A, these pixel groups are actually arranged alternately in the row and column directions.

Although not shown in FIG. 1A, the read signal lines are classified into a first type of read signal lines, which are connected to the first pixel groups 11, and a second type of read signal lines, which are connected to the second pixel groups 12. It will be described in detail later exactly how those read signal lines are connected to those pixels.

In the example illustrated in FIG. 1A, each of the first and second pixel groups 11 and 12 includes pixels in multiple different colors. In other words, the color filter array is configured to make light rays with multiple different color components incident on each of the first and second pixel groups 11 and 12.

In the example illustrated in FIG. 1A, each of the first and second pixel groups 11 and 12 is formed of four pixels that are arranged in two columns and two rows. However, the pixel group does not have to have such an arrangement. Stating more generally, each first pixel group 11 may be formed of pixels that are arranged in M rows and N columns (where M and N are integers that satisfy M≥1, N≥1, and M×N≥2). On the other hand, each second pixel group 12 may be formed of pixels that are arranged in M' rows and N' columns (where M' and N' are integers that satisfy M'≥1, N'≥1, and M'×N≥2).

Figure 1B:
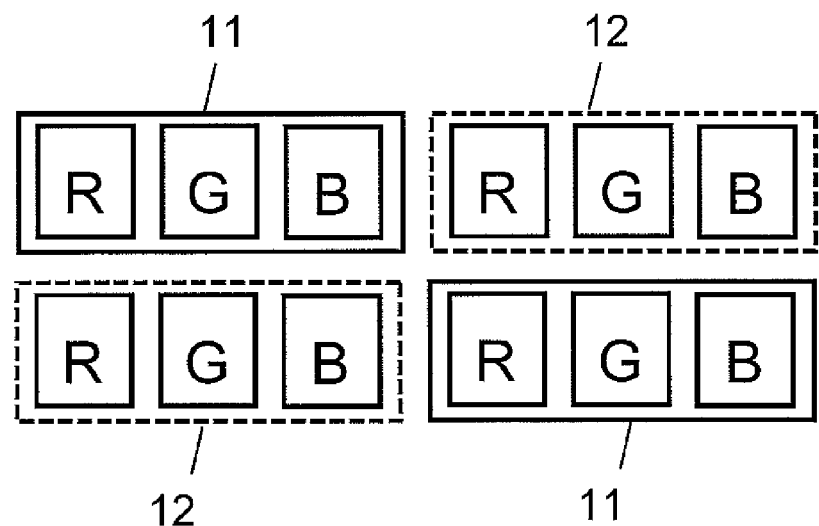
FIG. 1B illustrates another exemplary arrangement of pixel groups in an image sensor according to the present disclosure.

FIG. 1B illustrates another exemplary arrangement of pixels. In this example, each of the first and second pixel groups 11 and 12 is formed of pixels that are arranged in one row and three columns. As in the exemplary pixel arrangement shown in FIG. 1A, the first and second pixel groups 11 and 12 are arranged alternately in the row and column directions in the exemplary pixel arrangement shown in FIG. 1B, too. If each group of pixels is comprised of pixels that are arranged in one row and L columns (where L is an integer that is equal to or greater than two), the wiring structure can be simplified.

By transmitting a read signal through a read signal line of the first type, a pixel signal that has been generated in the first exposure time can be read from the first pixel group 11 to an output signal line. On the other hand, by transmitting a read signal through a read signal line of the second type, a pixel signal that has been generated in the second exposure time can be read from the second pixel group 12 to an output signal line.

Hereinafter, embodiments of the present disclosure will be described with reference to the accompanying drawings.

Embodiment 1

Figure 2A:
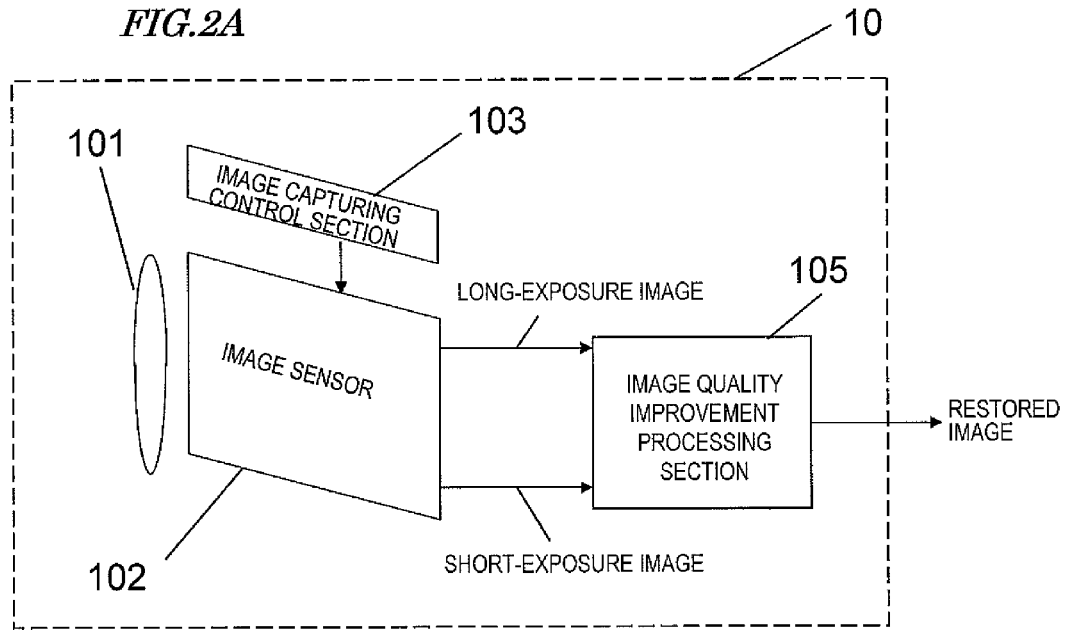
FIG. 2A is a block diagram illustrating an overall configuration for an image capture device as a first embodiment of the present disclosure.

FIG. 2A is a block diagram illustrating an exemplary configuration for an image capture device as a first embodiment of the present disclosure.

As shown in FIG. 2A, the image capturing section 10 of the image capture device of this embodiment includes a shooting lens 101, a solid-state image sensor (which will be simply referred to herein as an "image sensor") which receives the light that has been transmitted through the shooting lens 101, an image capturing control section 103 which controls the image capturing operation by the image sensor 102, and an image quality improvement processing section 105 which processes and improves the image quality of color moving pictures that have been shot in two different exposure times and that have been supplied from the image sensor 102. The image sensor 102 of this embodiment is a single-panel color image sensor. The configurations and operations of the image sensor 102, the image capturing control section 103 and the image quality improvement processing section 105 will be described in detail later.

The shooting lens 101 has a known structure and may actually be implemented as a lens unit that is made up of multiple lenses. The shooting lens 101 is driven by a mechanism (not shown) to carry out operations to get optical zooming and auto-focusing (AF) done as needed.

The image capture device of this embodiment is characterized, first and foremost, by the image sensor 102. Thus, the configuration and operation of the image sensor 102 will be described in detail.

Figure 2B:
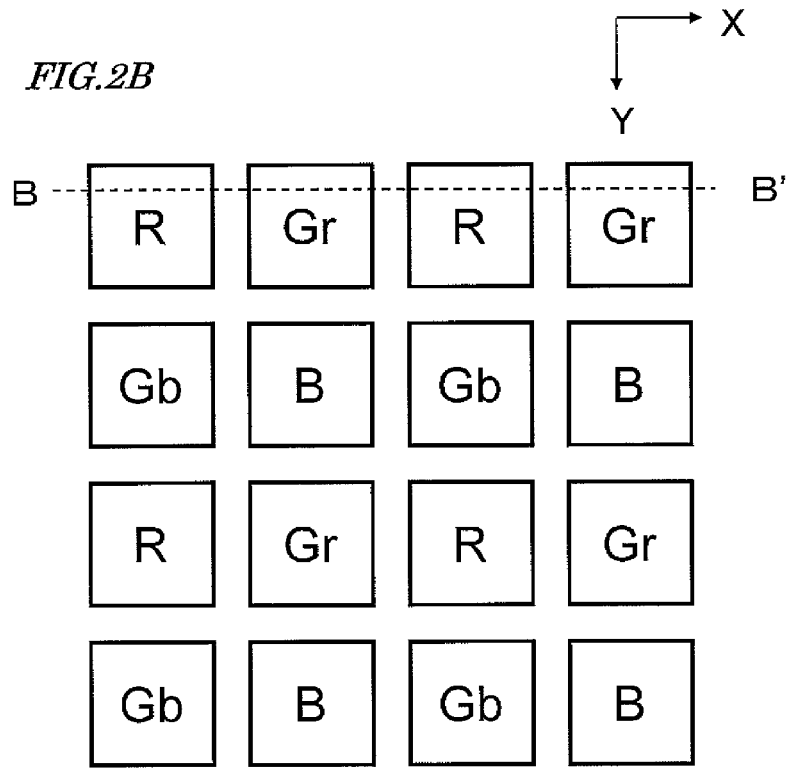
FIG. 2B illustrates an exemplary arrangement of pixels in an image sensor according to the first embodiment of the present disclosure.

FIG. 2B illustrates an exemplary arrangement of pixels in the image sensor 102 of the image capture device of this embodiment. In FIG. 2B, the reference sign R denotes pixels that detect the intensity of the R (red) component of the incident light, the reference sign B denotes pixels that detect the intensity of the B (blue) component of the incident light, and the reference signs Gr and Gb denote pixels that detect the intensity of the G (green) component of the incident light. In the real arrangement, those pixels do not have to have such a square shape but may also be rectangular, polygonal, circular or elliptical ones.

In this image sensor 102, rows in which R and G pixels are alternately arranged horizontally (which will be referred to herein as "RG rows") and rows in which G and B pixels are alternately arranged horizontally (which will be referred to herein as "BG rows") alternate vertically. In the following description, the G pixels on the RG rows will be referred to herein as "Gr pixels", while the G pixels on the BG rows will be referred to herein as "Gb rows". In the real-world image sensor 102, a huge number of pixels are arranged in columns and rows. In this embodiment, however, four adjacent pixels that are arranged in two columns and two rows form a single basic unit, and a number of such basic units are periodically arranged both horizontally and vertically. FIG. 2B illustrates only a portion of the image capturing plane. In this description, the "vertical direction" is supposed to be the direction that is parallel to the Y direction shown in FIG. 2B, while the "horizontal direction" is supposed to be the direction that is parallel to the X direction shown in FIG. 2B.

FIG. 2C schematically illustrates a cross section of the image sensor as viewed on the plane B-B' shown in FIG. 2B. In this example, an interconnect layer 27 and a color filter array 26 are stacked in this order on the light incident side of a semiconductor layer 25 in which photoelectric transducers 24 are formed. In the example illustrated in FIG. 2C, the semiconductor layer 25 is thick enough to function as a self-standing substrate, and therefore, is usually called a "semiconductor substrate". The photoelectric transducers 24 have been formed by doping selected regions of the semiconductor substrate with dopant ions, which have been introduced there through the surface of the substrate.

As will be described later, the present disclosure is also applicable to a solid-state image sensor of a so-called "backside illumination type". FIG. 2D schematically illustrates a cross section of the image sensor of the backside illumination type as also viewed on the plane B-B' shown in FIG. 2B. In the example illustrated in FIG. 2D, a color filter array 26 is arranged on the back surface of a semiconductor layer 25 in which photoelectric transducers 24 have been formed, and incoming light enters this image sensor through the back surface of the semiconductor layer 25. An interconnect layer 27 is arranged on the surface of the semiconductor layer 25 and a base member 28 is provided to support the semiconductor layer 25. In such a backside illumination type, photoelectric transducers 24 are formed by doping selected regions of the semiconductor substrate with dopant ions through its surface, and then the semiconductor substrate is partially etched from its back surface. In this manner, the semiconductor layer 25 is formed from the surface of the semiconductor substrate. The light that has entered this image sensor through the back surface of the semiconductor layer 25 can be incident on the photoelectric transducers 24 that have been formed in the semiconductor layer 25. As can be seen easily from FIG. 2D, in such a solid-state image sensor of the backside illumination type, the interconnect layer 27 does not cut off the incoming light.

Figure 3:
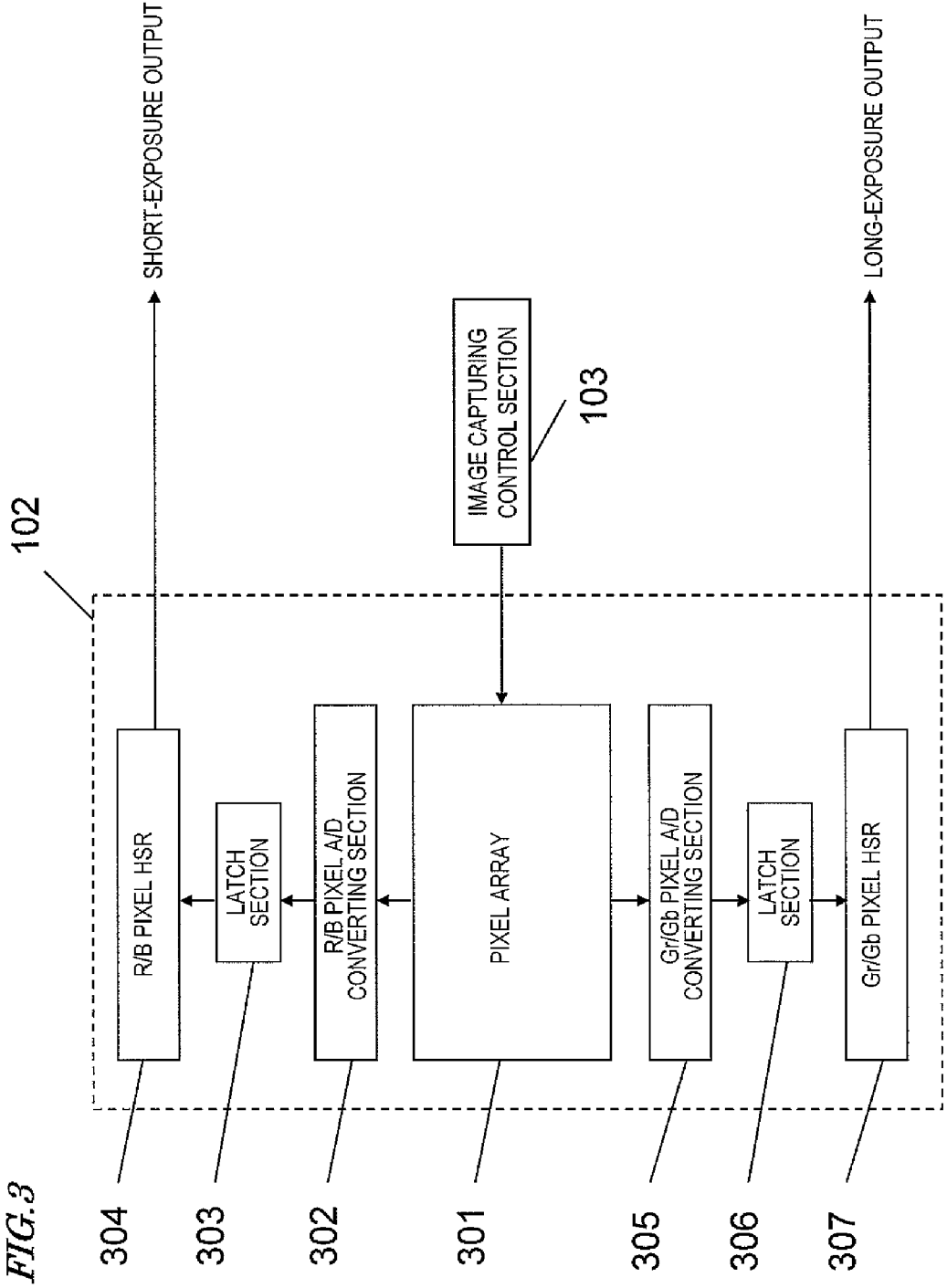
FIG. 3 illustrates an exemplary configuration for the image sensor according to the first embodiment of the present disclosure.

FIG. 3 is a block diagram illustrating an exemplary configuration for the image sensor 102 of this embodiment.

A pixel array 301 has a photoelectric conversion function of converting the intensity of incoming light into an electrical signal with respect to R, G and B components of a color image of the same scene.

An R/B pixel A/D converting section 302 performs an analog-to-digital conversion on the respective outputs of R and B pixels of the pixel array 302. An R/B pixel HSR (horizontal shift register) 304 receives the outputs of the R/B pixel A/D converting section 302 via a latch section 303, and horizontally transfers the outputs received, thereby outputting the pixel signals of the R and B pixels to a device outside of this image sensor.

A Gr/Gb pixel A/D converting section 305 performs an analog-to-digital conversion on the respective output signals of Gr and Gb pixels of the pixel array 302. A Gr/Gb pixel HSR (horizontal shift register) 307 receives the outputs of the Gr/Gb pixel A/D converting section 305 via a latch section 306, and horizontally transfers the outputs received, thereby outputting the pixel signals of the Gr and Gb pixels to a device outside of this image sensor.

In this embodiment, none of the R/B pixel A/D converting section 302, the Gr/Gb pixel A/D converting section 305, the R/B pixel HSR 304 and the Gr/Gb pixel HSR 307 performs A/D conversion and horizontal transfer on those two color components on a single circuit, but an A/D converting mechanism and horizontal shift register are supposed to be provided for each set of R pixels, B pixels, Gr pixels and Gb pixels. Thus, each of those names is used herein to collectively refer to those A/D converting mechanisms and horizontal shift registers. Also, in this embodiment, the pixel signals output from the pixel array 301 are sorted into R/B pixels and Gr/Gb pixels. And this image sensor is configured so that signals of R pixels of an image that has been captured through a short exposure process and those of R pixels of an image that has been captured through a long exposure process are both input to the A/D converting section for the R pixels, for example. Such an operation of performing analog-to-digital conversion on the output signals of pixels of an image that has been captured through exposure processes of two different lengths using a single A/D converting mechanism will be described in detail later.

Also, in the following description, such pixels of an image that has been captured through a short exposure process will be referred to herein as "short-time pixels" and such pixels of an image that has been captured through a long exposure process will be referred to herein as "long-time pixels" for the sake of simplicity.

The latch section 303 controls the timing of inputting the digital output signals supplied from the R/B pixel A/D converting section 302 to the R/B pixel HSR 304. Likewise, the latch section 306 controls the timing of inputting the digital output signals supplied from the Gr/Gb pixel A/D converting section 305 to the Gr/Gb pixel HSR 307. An image capturing control section 103 controls the operation of the pixel array 301 as described above.

Hereinafter, it will be described in detail how these components operate.

The pixel array 301 has the R, B, Gr and Gb pixels that are arranged as shown in FIG. 2.

In the pixel array of this embodiment, those pixels and signal lines are connected together differently from known ones. This point will be described in detail later. The pixel array 301 can output the respective output signals of four adjacent pixels (namely, R, B, Gr and Gb pixels), which are arranged in two columns and two rows, through the horizontal shift registers 304 and 307 to a device outside of the image sensor 102 in four parallel channels.

In this embodiment, the "high frame rate" is supposed to fall within the range of approximately 30 to 60 fps (frames per second). Also, in this embodiment, the "short exposure" refers to an exposure process to be carried out within at most the upper limit of one frame period (e.g., approximately one-thirtieth to one-sixtieth second in this embodiment), which is determined by the frame rate.

Also, in this embodiment, the "low frame rate" is supposed to be a few to twenty times as low as the frame rate for a first color component. Furthermore, in this embodiment, the "long exposure" is an exposure time, of which the upper limit is one frame period that is determined by that frame rate and which is longer than the "short exposure". The "long exposure" time (which will be referred to herein as a "first exposure time") is longer than one frame period of the "short exposure", while the "short exposure" time (which will be referred to herein as a "second exposure time") is equal to or shorter than one frame period of the "short exposure".

It should be noted that these terms "short exposure", "long exposure", "high frame rate" and "low frame rate" have just relative meanings. That is to say, the exposure time of the short-time pixels just needs to be shorter than that of the long-time pixels, and the frame rate of the short-time pixels just needs to be higher than that of the long-time pixels. And those exposure times and frame rates do not always have to fall within the exemplary numerical value ranges defined above.

The R/B pixel A/D converting section 302 converts the analog output signals of R and B pixels into digital ones.

The latch section 303 temporarily holds the output of the R/B A/D converting section 302 in order to synchronize outputting the digital signals supplied from the R and B pixels from the R/B pixel HSR 304 to a device outside of the image sensor with outputting the digital signals supplied from the Gr and Gb pixels from the Gr/Gb pixel HSR 307 to a device outside of the image sensor.

The R/B pixel HSR 304 horizontally transfers the pixel signals of the R and B pixels, which have been converted into digital signals by the R/B pixel A/D converting section 302, and outputs them to a device outside of the image sensor.

The Gr/Gb pixel A/D converting section 305 converts the analog output signals of Gr and Gb pixels into digital ones.

The latch section 306 temporarily holds the output of the Gr/Gb A/D converting section 305 in order to synchronize outputting the digital signals supplied from the Gr and Gb pixels from the Gr/Gb pixel HSR 307 to a device outside of the image sensor with outputting the digital signals supplied from the R and B pixels from the R/B pixel HSR 304 to a device outside of the image sensor.

The Gr/Gb pixel HSR 307 horizontally transfers the pixel signals of the Gr and Gb pixels, which have been converted into digital signals by the Gr/Gb pixel A/D converting section 305, and outputs them to a device outside of the image sensor.

The image capturing control section 103 outputs a control signal to the pixel array 301 and instructs the pixel array 301 to output read signals and select input signals for the A/D converting sections 302 and 305.

Figure 4:
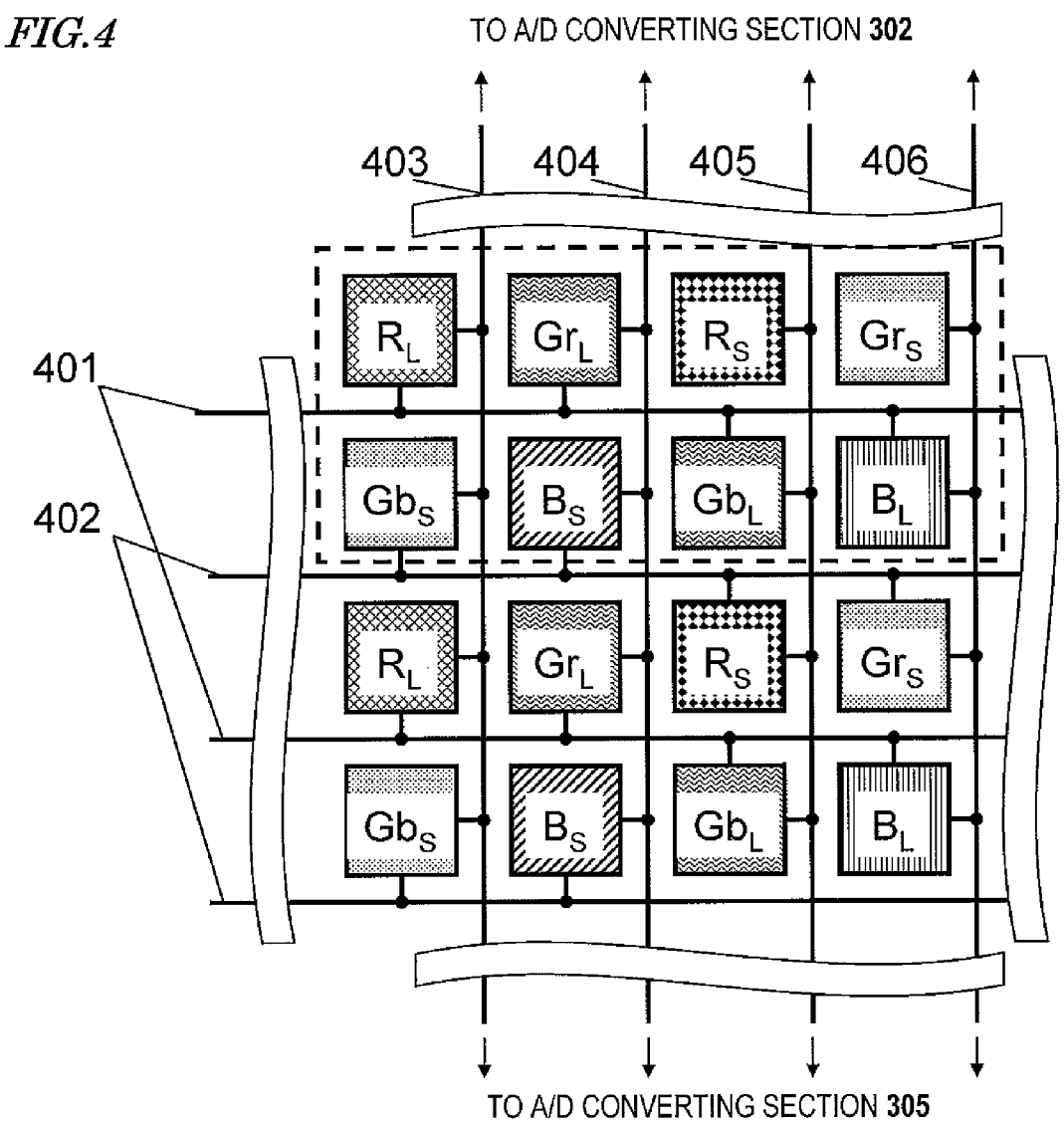
FIG. 4 illustrates how to connect read signal lines and output signal lines in a pixel array according to the first embodiment of the present disclosure.

FIG. 4 illustrates a detailed configuration for the pixel array 301. As shown in FIG. 4, the solid-state image sensor of this embodiment includes a plurality of pixels (including R, Gr, Gb, B pixels and so on) which are arranged in columns and rows, a plurality of read signal lines 401, 402, each of which is connected to a number of pixels that are arranged in the row direction, and a plurality of output signal lines 403, 404, 405, 406, each of which is connected to a number of pixels that are arranged in the column direction. The color components of light rays to be incident on those pixels (including R, Gr, Gb, B pixels and so on) are adjusted by the color filter array.

The read signal lines 401 and 402 are classified into first type of read signal lines 401, each of which is connected to a group of pixels to capture an image through the long exposure process, and a second type of read signal lines 402, each of which is connected to a group of pixels to capture an image through the short exposure process.

In the example illustrated in FIG. 4, two long time pixels (which are identified by $R_L$, $Gr_L$, $Gb_L$ and $B_L$) are horizontally arranged in a row. In this description, the subscript "L" stands for "long" and the subscript "S" stands for "short". The long-time and short-time pixels at Gr pixel locations shown in FIG. 2 will be referred to herein as a "$Gr_L$ pixel" and a "$Gr_S$ pixel", respectively. In the same way, the long-time and short-time pixels at Gb pixel locations shown in FIG. 2 will be referred to herein as a "$Gb_L$ pixel" and a "$Gb_S$ pixel", respectively.

In the example shown in FIG. 4, the long-time pixels $R_L$, $Gr_L$, $Gb_L$ and $B_L$ are connected to the first type of signal line 401. Among these long-time pixels, two pairs of pixels (i.e., $R_L$ and $Gr_L$, and $Gb_L$ and $B_L$), each pair of which belongs to two adjacent columns, are arranged on two opposite sides with respect to the first type of signal line 401. In other words, to the same first type of read signal line 401, connected are long-time pixels $R_L$ and $Gr_L$, which are located over the read signal line 401 in FIG. 4, and long-time pixels $Gb_L$ and $B_L$, which are located under the read signal line 401 in FIG. 4.

Also, two short time pixels (which are identified by $R_S$, $Gr_S$, $Gr_S$ and $B_S$) are horizontally arranged in a row. The short-time pixels are connected to the second type of signal line 402. Among these short-time pixels, two pairs of pixels, each pair of which belongs to two adjacent columns, are arranged on two opposite sides with respect to the second type of signal line 402. In other words, to the same second type of read signal line 402, connected are short-time pixels $Gb_S$ and $B_S$, which are located over the read signal line 402 in FIG. 4, and short-time pixels $R_S$ and $Gr_S$, which are located under the read signal line 402 in FIG. 4.

As shown in FIG. 4, the first type of read signal line 401 is shared by the set of long-time pixels on two horizontal scan lines, which are vertically adjacent to each other, and the second type of read signal line 402 is shared by the set of short-time pixels on two horizontal scan lines, which are vertically adjacent to each other. For example, in the two columns of pixels which are enclosed in the dashed lines in FIG. 4 and which are arranged horizontally, the long-time pixels (identified by the subscript L) belonging to the respective pixel columns share the same read signal line 401.

The output signal line 403 is shared by the $R_L$ and $Gb_S$ pixels. The output signal line 404 is shared by the $Gr_L$ and $B_S$ pixels. The output signal line 405 is shared by the $R_S$ and $Gb_L$ pixels. And the output signal line 406 is shared by the $Gr_S$ and $B_L$ pixels.

The output signal line 403 transmits the pixel output signals of the $R_L$ and $Gb_S$ pixels. The output signal line 404 transmits the pixel output signals of the $Gr_L$ and $B_S$ pixels. The output signal line 405 transmits the pixel output signals of the $R_S$ and $Gb_L$ pixels. And the output signal line 406 transmits the pixel output signals of the $Gr_S$ and $B_L$ pixels. More specifically, the output signals of the $R_S$, $R_L$, $B_S$ and $B_L$ pixels are output upward on the paper through the output signal lines 403, 405, 404 and 406, respectively. In the same way, the output signals of the $Gr_S$, $Gr_L$, $Gb_S$ and $Gb_L$ pixels are output downward on the paper through the output signal lines 404, 406, 403 and 405, respectively, to the A/D converting section 305.

Figure 5:
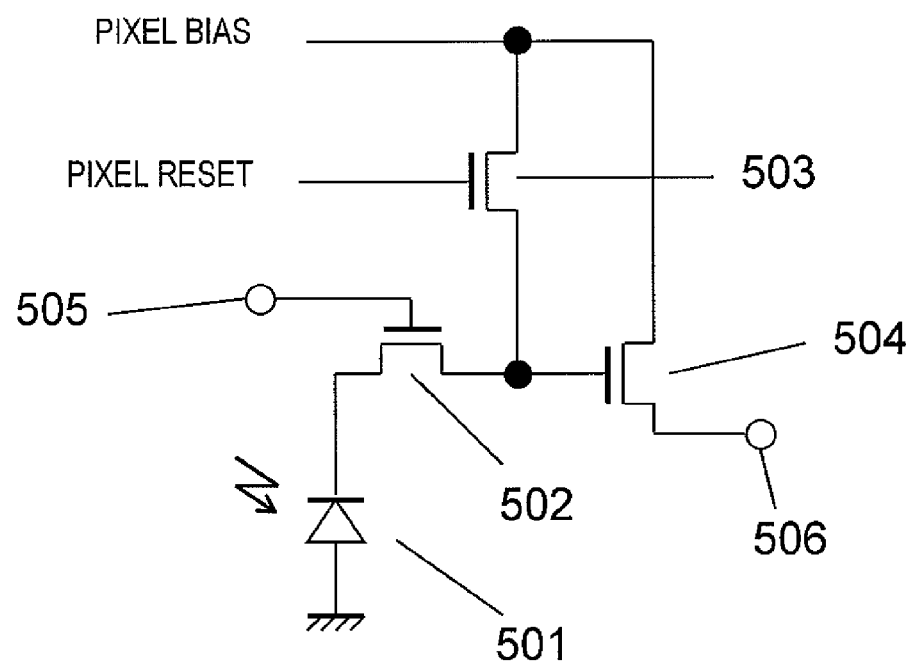
FIG. 5 illustrates an exemplary circuit representing a pixel of the image sensor 102 according to the first embodiment of the present disclosure.

Next, a read signal and a pixel output signal will be described with reference to FIG. 5, which illustrates an exemplary circuit diagram representing a pixel.

A photodiode 501 converts the intensity of incident light into an electrical signal. A switch 502 outputs the electrical signal, which has been generated by the photodiode 501 through the photoelectric conversion, to an output signal line. A switch 503 performs pixel resetting. An analog buffer 504 receives the pixel output signal. The read signal is input through an input terminal 505. The output signal is output through an output terminal 506. In FIG. 5, a pixel bias signal is input to the switch 503 and the drain of the analog buffer 504. A pixel reset signal is input to the gate of the switch 503. The read signal is input to the gate of the switch 502. And the pixel output signal is output from the analog buffer 504. That is to say, the read signal is a signal indicating the timing to output the electrical signal, which has been generated by the photodiode 501 through the photoelectric conversion, to the output signal line. The pixel output signal is the electrical signal that has been generated by the photodiode 501 through the photoelectric conversion.

Figure 6A:
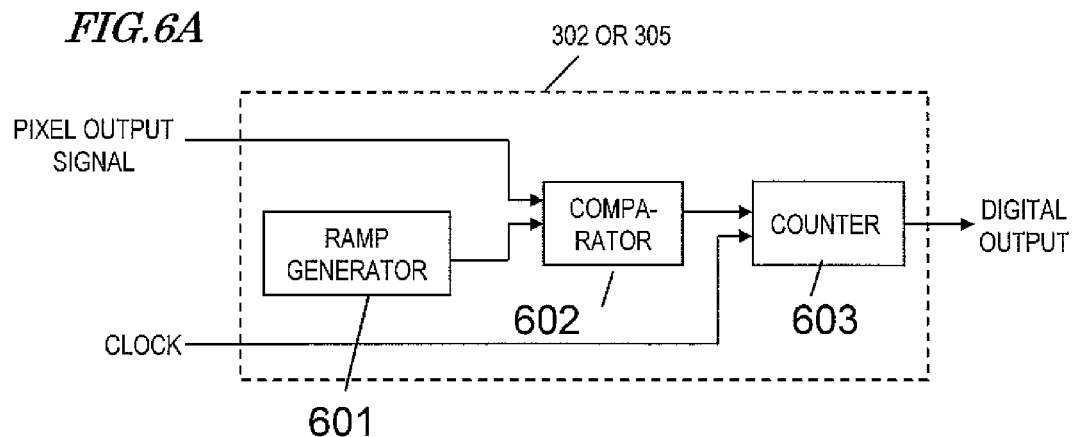
FIG. 6A illustrates an exemplary configuration for an A/D converting section in the image sensor 102 according to the first embodiment of the present disclosure.
Figure 6B:
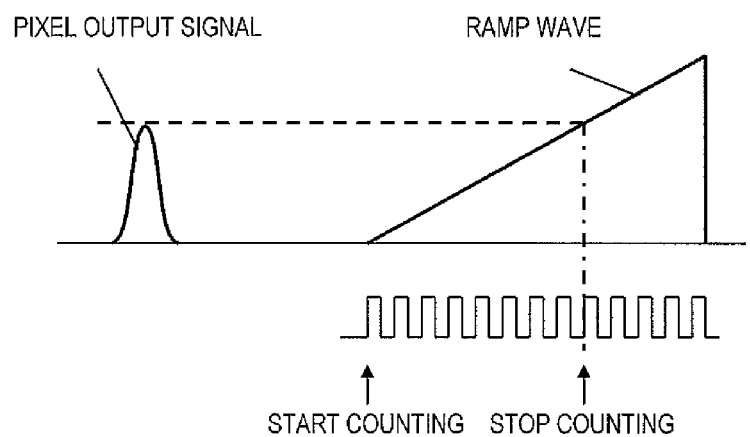
FIG. 6B illustrates how the A/D converting section operates in the image sensor 102 according to the first embodiment of the present disclosure.

The A/D converters 302 and 305 may have a configuration consisting of a ramp generator 601, a comparator 602 and a counter 603 as shown in FIG. 6A, for example. As shown in FIG. 6B, a ramp wave generated by the ramp generator 601 is compared to the pixel output signal, and the counter 603 is driven while the ramp wave is less than the pixel output signal. And when the ramp wave exceeds the pixel output signal, the counter is stopped and the digital value of the pixel output signal is obtained as the output of the counter.

Figure 7:
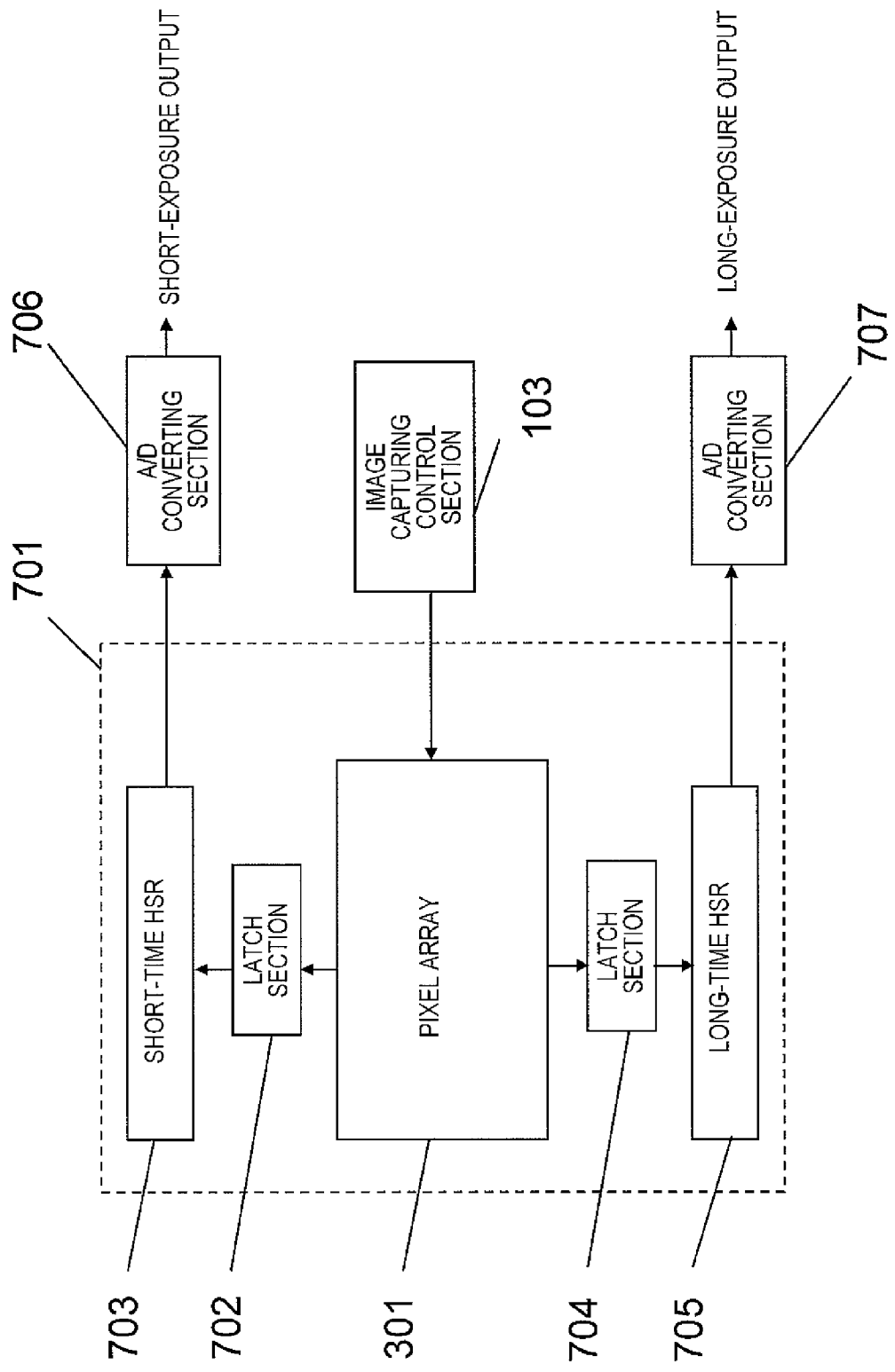
FIG. 7 illustrates another exemplary configuration for the image sensor according to the first embodiment of the present disclosure.

In the example illustrated in FIG. 3, the A/D converting sections 302 and 305 are arranged inside of the image sensor 102. However, the image sensor 102 may be configured to output an analog pixel signal with the A/D converting sections 302 and 305 arranged outside of the image sensor 102. FIG. 7 is a block diagram illustrating such a configuration in which the A/D converting sections 302 and 305 are arranged outside of the image sensor 102. In the image sensor of this example, the pixel output signal supplied from the pixel array 301 is once held in analog latch sections 702 and 704 and then output from a short-time HSR 703 and a long-time HSR 705, which transfer an analog signal, to a device outside of the image sensor 701. After that, the pixel output signal is converted into a digital signal by the A/D converting sections 706 and 707 outside of the image sensor. The analog latch sections 702 and 704 may be configured to have electric charge stored in a capacitor which is inserted in parallel to the output signal lines 403 to 406 shown in FIG. 4, for example.

Next, it will be described how the image capturing control section 103 operates.

Figure 8:
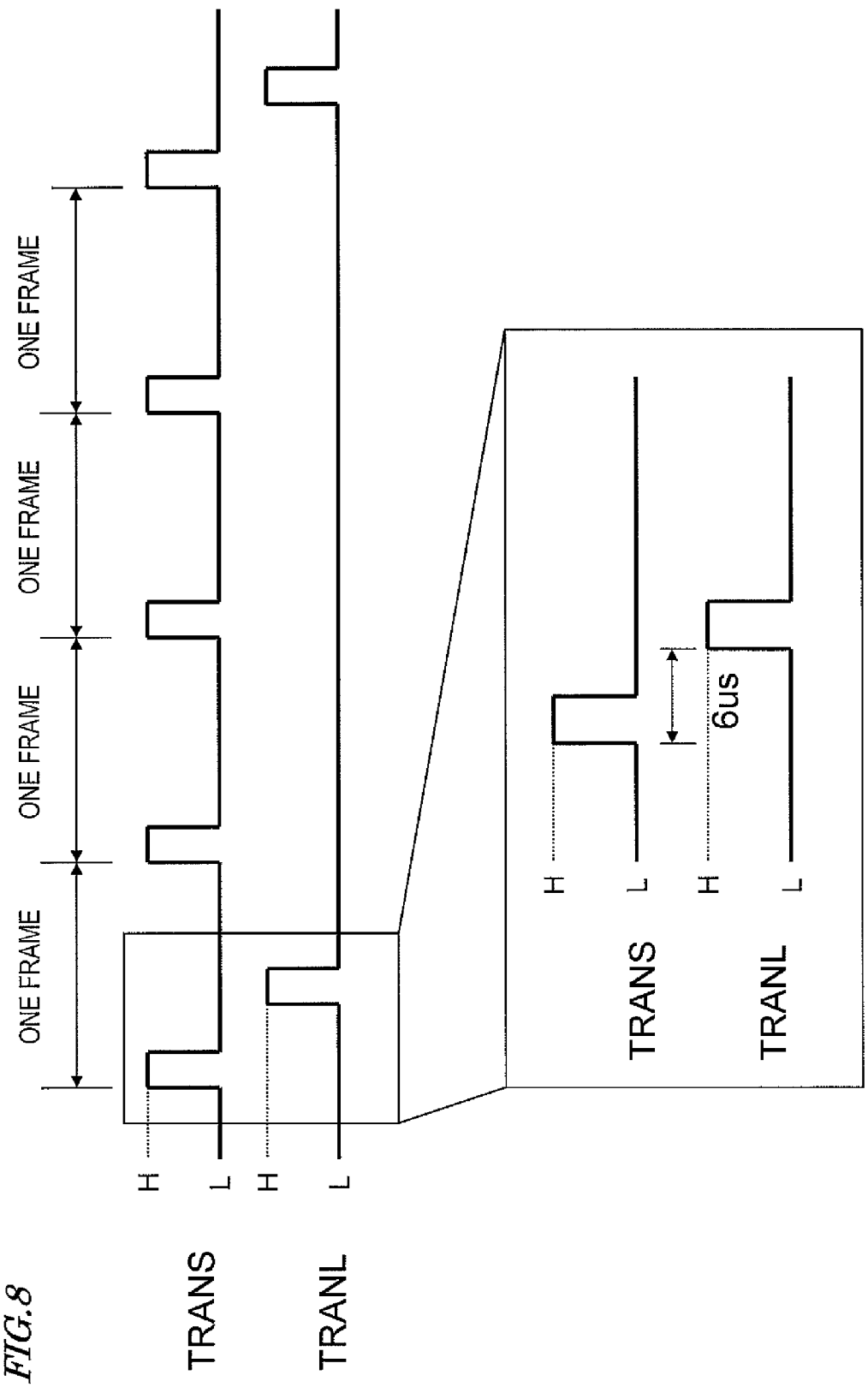
FIG. 8 shows the waveforms of read signals that are output from the image capturing control section according to the first embodiment of the present disclosure.

FIG. 8 shows the waveforms of read signals that are output from the image capturing control section 103 to the pixel array 301. TRANS denotes the read signal of a pixel output to capture an image through a short exposure process and will be supplied to the read signal line 401. On the other hand, TRANL denotes the read signal of a pixel output to capture an image through a long exposure process and will be supplied to the read signal line 402. In FIG. 8, shown are the waveforms of read signals to be supplied to a single pixel. The frame rate and exposure time of the short-time pixel are respectively four times and one-fourth of those of the long-time pixel. In other words, when TRANS rises to H level every four times, the long-time pixel read signal TRANL rises to H level once. However, the frame rate and exposure time do not have to have these values. It should be noted that one of the frame rate and the exposure time is substantially the inverse number of the other. That is to say, if the frame rate is 30 fps (frames per second), then one frame period becomes one-thirtieth second, and therefore, the exposure time also becomes approximately one-thirtieth second.

In the example shown in FIG. 8, in a frame in which TRANS and TRANL are both asserted (i.e., rise to the H level in FIG. 8), TRANL rises to the H level 6 μs later than TRANS. However, the time lag shown in FIG. 8 is only an example. That is to say, the time lag between the time when TRANL rises to the H level and the time when TRANS rises to the H level does not have to have that value. Instead, that time lag may be set to be as long as the time it takes for the output signal of a short-time pixel to be output to the output signal lines 403 through 407 when TRANS rises to the H level, reach the A/D converting section 302 shown in FIG. 3 and then get A/D converted there, or the time it takes for the output signal of the short-time pixel to reach the latch section 702 shown in FIG. 7.

The lower limit of the time lag between the respective times when TRANS and TRANL rise to the H level can be as short as the time it takes for the output of the short-time pixel to reach the A/D converting section 302 shown in FIG. 3 and be output from it or the time it takes for the output of the short-time pixel to reach the latch section 702 shown in FIG. 7 and the upper limit of the time lag can be as long as the exposure time of one frame of the short-time pixel. The time lag may be set to be any arbitrary value as long as it falls within the range defined by these lower and upper limits. It should be noted that in the configuration shown in FIG. 3, the time lag between TRANS and TRANL is supposed to include the time for getting the A/D conversion done. The reason is that the A/D converting sections 302 and 305 need to perform A/D conversion on both of short-time and long-time pixels in the same color. In addition, this is also done in order to prevent the pixel outputs with the two different exposure times from getting mixed on the same A/D converting section. Although the read signal TRANS is supposed to rise to the H level earlier than the read signal TRANL in the example shown in FIG. 8, TRANL may rise to the H level earlier than TRANS.

Next, it will be described with reference to FIGS. 9 and 10 how the pixel array 301 operates in a frame in which the read signals TRANS and TRANL both rise to the H level. In the following example, the solid-state image sensor with the configuration shown in FIG. 3 is supposed to be taken as an example.

Figure 9:
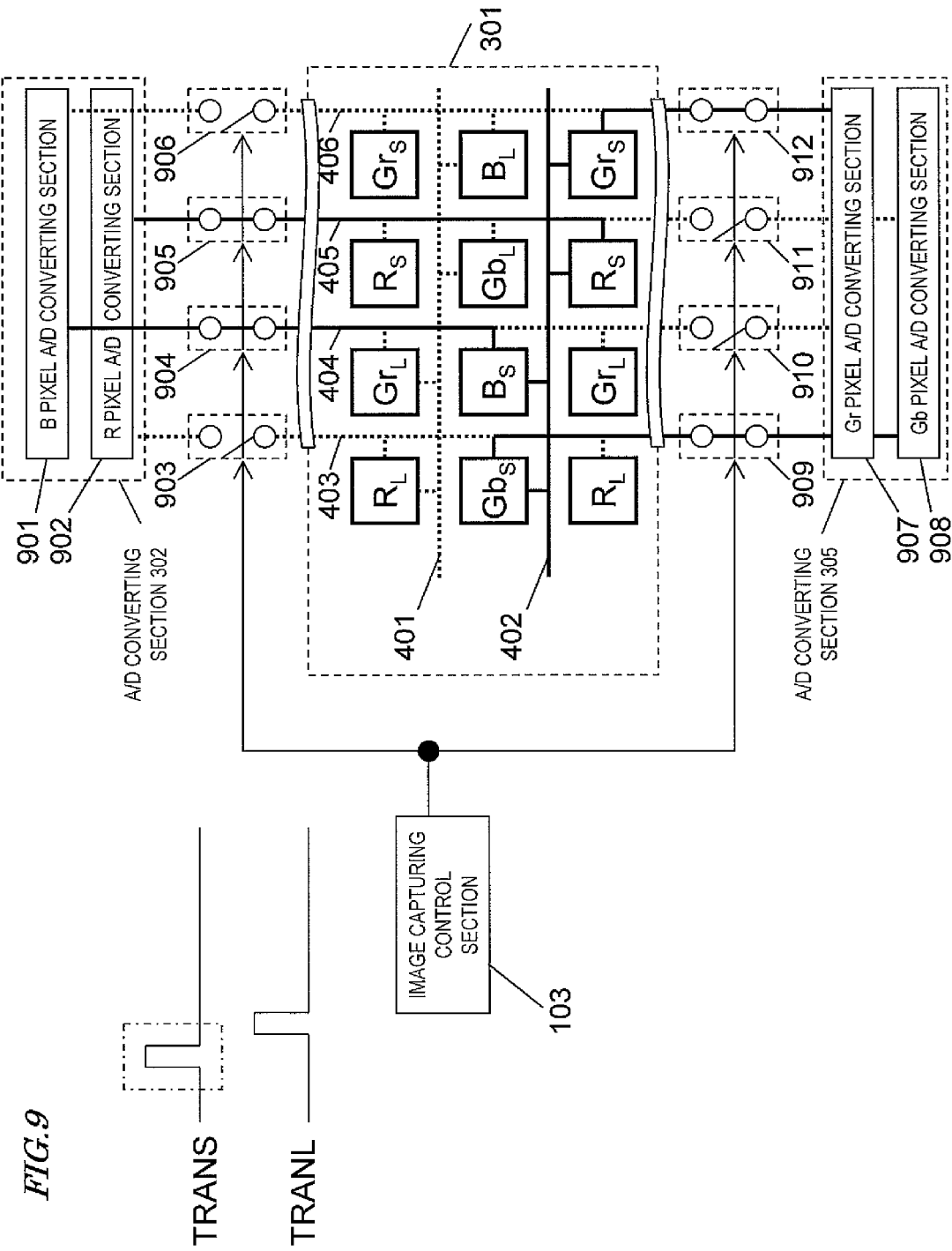
FIG. 9 illustrates conceptually how the pixel array according to the first embodiment of the present disclosure operates at a point in time when a short-time pixel read signal is asserted.
Figure 10:
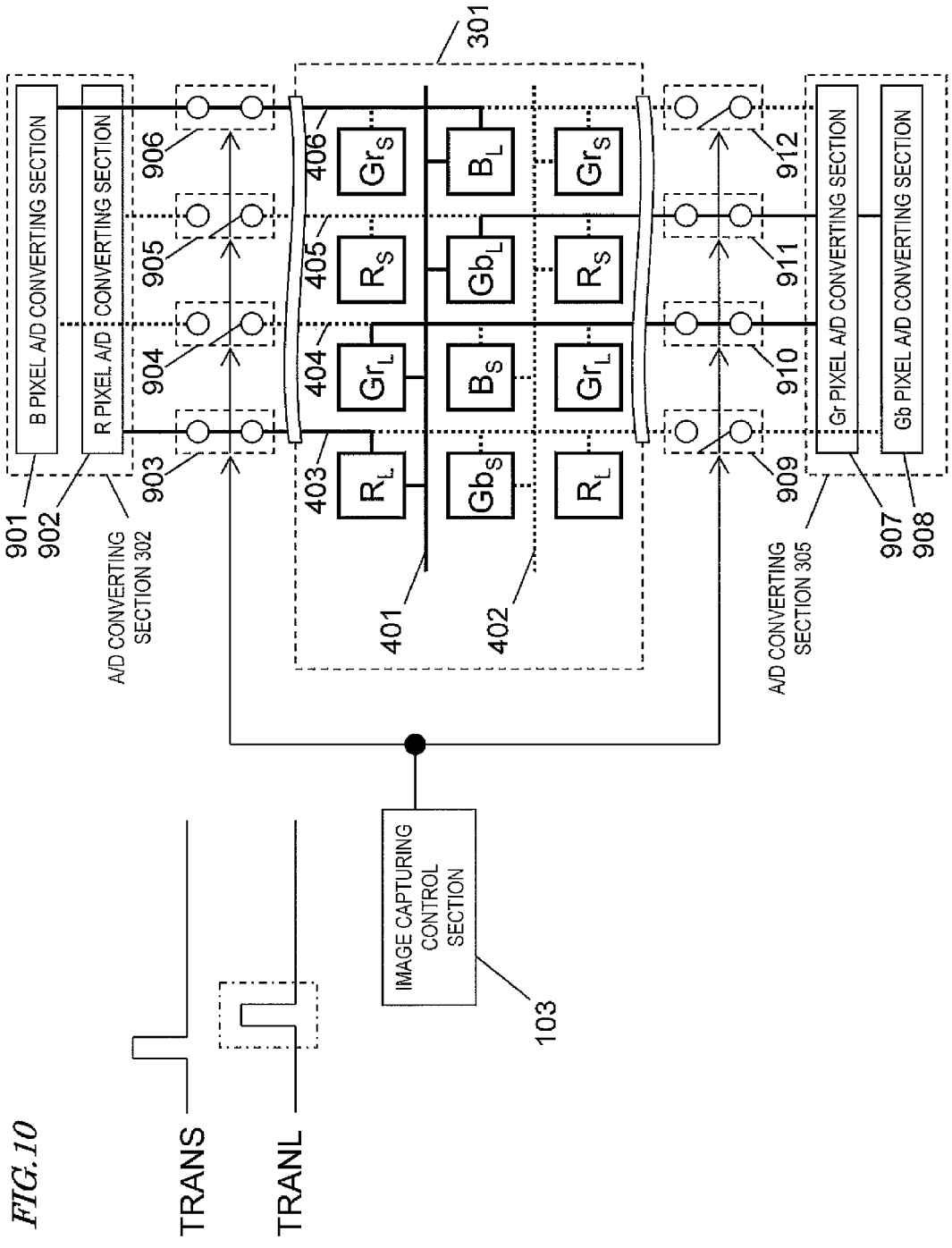
FIG. 10 illustrates conceptually how the pixel array according to the first embodiment of the present disclosure operates at a point in time when a long-time pixel read signal is asserted.

FIG. 9 illustrates how the image capturing control section 103 and the pixel array 301 operate when TRANS rises to the H level. Specifically, when TRANS rises to the H level, the signal transmitted through the read signal line 402 indicated by the solid line in FIG. 9 also rises to the H level. At this point in time, the pixel output signals of $Gb_S$, $B_S$, $R_S$ and $Gr_S$ pixels are transmitted through the output signal lines 403, 404, 405 and 406, respectively. In addition, at this point in time, the image capturing control section 103 turns ON the switches 904 and 905 leading to the R/B pixel A/D converting section 302 and the switches 909 and 912 leading to the Gr/Gb pixel A/D converting section 305. As a result, the pixel output signals of the $R_S$ and $B_S$ pixels are respectively transmitted to the R pixel A/D converting section 901 and the B pixel A/D converting section 902 in the R/B pixel A/D converting section 302. On the other hand, the pixel output signals of the $Gr_S$ and $Gb_S$ pixels are respectively transmitted to the Gr pixel A/D converting section 907 and the Gb pixel A/D converting section 908 in the Gr/Gb pixel A/D converting section 305.

Thereafter, when the read and A/D conversion operations in response to the previous TRANS signal get done on every target short-time pixel (e.g., in 6 μs in the example shown in FIG. 8), TRANL rises to the H level, so does the signal transmitted through the read signal line 401. FIG. 10 illustrates how the pixel array 301 operates in such a situation. Specifically, at this point in time, the pixel output signals of $R_L$, $Gr_L$, $Gb_L$ and $B_L$ pixels are transmitted through the output signal lines 403, 404, 405 and 406, respectively. In addition, at this point in time, the image capturing control section 103 turns ON the switches 903 and 906 leading to the R/B pixel A/D converting section 302 and the switches 910 and 911 leading to the Gr/Gb pixel A/D converting section 305. As a result, the pixel output signals of the $R_L$ and $B_L$ pixels are respectively transmitted to the R pixel A/D converting section 901 and the B pixel A/D converting section 902 in the R/B pixel A/D converting section 302. On the other hand, the pixel output signals of the $Gr_L$ and $Gb_L$ pixels are respectively transmitted to the Gr pixel A/D converting section 907 and the Gb pixel A/D converting section 908 in the Gr/Gb pixel A/D converting section 305.

Figure 11:
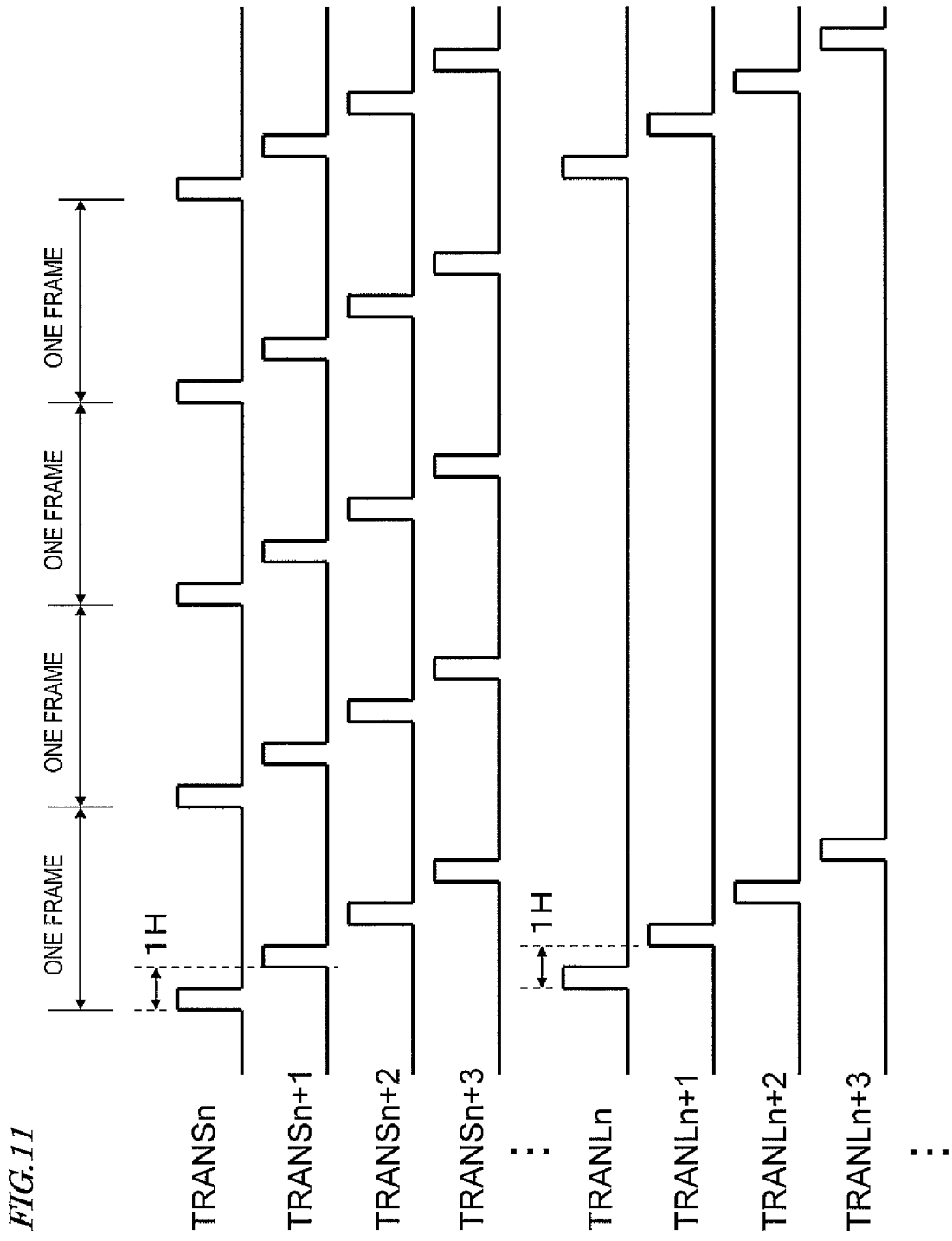
FIG. 11 shows the signal waveforms of read signals that are output from an image capturing control section and supplied to multiple horizontal pixel arrangements in the first embodiment of the present disclosure.

FIG. 11 illustrates examples of read signals to be supplied to the read signal lines 401 and 402 in the image sensor of this embodiment. In FIG. 11, TRANSn, TRANSn+1, TRANSn+2, and TRANSn+3 denote the read signals of short-time pixels (i.e., the signals to be transmitted through the read signal line 402), and TRANLn, TRANLn+1, TRANLn+2, and TRANLn+3 denote the read signals of long-time pixels (i.e., the signals to be transmitted through the read signal line 401). More specifically, TRANSn denotes the read signal to be supplied to the vertically $n^{th}$ set of short-time pixels and TRANLn denotes the read signal to be supplied to the vertically $n^{th}$ set of long-time pixels. The same rule applies to the other read signals that follow TRANSn and TRANLn. That is to say, TRANSn+1 and TRANLn+1 denote read signals to be supplied to (n+1)$^{th}$ set of short- and long-time pixels, respectively.

In the image sensor of this embodiment, read signals are supplied at the same time to either the long-time pixels (e.g., $R_L$, $Gr_L$, $Gb_L$ and $B_L$ pixels) belonging to two vertically adjacent horizontal pixel lines or the short-time pixels (e.g., $Gb_S$, $B_S$, $R_S$ and $Gr_S$ pixels) belonging to two vertically adjacent horizontal pixel lines as shown in FIG. 4. Thus, the image capturing control section 103 generates one read signal for each set of short- or long-time pixels.

FIG. 11 illustrates a situation where the frame rate of long-time pixels is one quarter as high as that of short-time pixels as in FIG. 8. Thus, TRANL rises to the H level once when TRANS rises to the H level every four times. Also, as in FIG. 8, in a frame in which the signals of the long- and short-time pixels are both read, one of the TRANS and TRANL signals to be supplied to the same pair of horizontal pixel lines (e.g., TRANSn and TRANLn) rises to the H level in 6 μs after the other signal has risen to the H level. Furthermore, the read signals supplied to mutually different pairs of horizontal pixel lines (such as TRANSn, TRANSn+1, TRANSn+2, TRANSn+3) rise to the H level with a time lag of one horizontal scan period (identified by 1H in FIG. 11) left between each pair. The same can be said about TRANL, too.

By adopting such a configuration, the single-panel color image sensor can have a balanced pixel arrangement in which every horizontal line includes both long-time pixels and short-time pixels and in which those pixels are alternately arranged at regular intervals. In addition, with such a pixel arrangement adopted, the respective color components of the color filters are no less balanced than a normal Bayer arrangement is and the long- and short-time pixels are both allocated to each of those color components.

Furthermore, even if the same output signal line is shared by multiple pixels, the pixel output signals of respective pixels can also be obtained without mixing the output signal between those pixels. More specifically, even though the ratio of the number of signal lines to the number of pixels is smaller than in a known arrangement, the output signals of the short- and long-time pixels which are arranged on multiple rows can still be read in parallel with each other. Likewise, the output signals of pixels that are arranged over multiple rows (e.g., $Gr_L$ and $Gb_L$ pixels) can also be read in parallel with each other.

In this embodiment, pixel signals representing a first group of color components (R, B) and pixel signals representing a second group of color components (G) are read from the pixel array 301 using mutually different circuit sections. Thus, the circuit section for reading pixel signals representing the R and B pixels from the same pixel array 301 can be referred to herein as a "first reading section" and the circuit section for reading pixel signals representing the Gr and Gb pixels from the same pixel array 301 can be referred to herein as a "second reading section". In the example illustrated in FIG. 3, the minimum constituting element of the "first reading section" is the R/B pixel A/D converting section 302, while the minimum constituting element of the "second reading section" is the Gr/Gb pixel A/D converting section 305. Optionally, the "first reading section" may further include additional components such as the latch section 303 and the R/B pixel HSR (horizontal shift register) 304. Likewise, the "second reading section" may also include additional components such as the latch section 306 and the Gr/Gb pixel HSR (horizontal shift register) 307.

Those latch sections 303 and 306 synchronize outputting pixel output digital signals representing the color components that have been obtained by the first reading section from the horizontal shift register 304 to a device outside of the image sensor with outputting pixel output digital signals representing the color components that have been obtained by the second reading section from the horizontal shift register 307 to a device outside of the image sensor. As described above, in a configuration in which the read signals are output at different timings between the short-time and long-time pixels, there is a time lag between a point in time when the pixel output signals of the short-time pixels reaches the A/D converting section 302 or 305 from the pixel array 301 and a point in time when the pixel output signals of the long-time pixels reaches the A/D converting section from the pixel array 301. However, outputting the color-by-color pixel signals may be synchronized when the signals are output from the horizontal shift registers 304 and 307 to a device outside of the image sensor 102, and the flow of the pixel output signals inside of the image sensor may be timed arbitrarily. In any case, by adopting such a configuration in which the latch sections 303 and 306 synchronize outputting the pixel output signal before those pixel output signals representing the respective color components are output to a device outside of the image sensor 102, there is no time lag between the pixel output signals of the same color when output from this image sensor 102.

In the example illustrated in FIG. 3, the latch sections 303 and 306 are arranged after the A/D converting sections 302 and 305, respectively, and the timing adjustment is made when the pixel output signals are converted into digital signals. However, the latch sections 303 and 306 do not always have to be arranged at those locations. Alternatively, the latch sections 303 and 306 may also be arranged just before the A/D converting sections 302 and 305 and may be configured to hold analog signals. In that case, a capacitor may be added to the input terminal of the A/D converting sections 302 and 305 and the image sensor may be configured so that it is not until the pixel output signals obtained by the first and second reading sections are both held in the capacitor that those pixel output signals are passed to the A/D converting sections 302 and 305.

The image capturing control section 103 may be arranged inside of the image sensor 102 so as to generate the read signals and the switch control signals inside of the image sensor 102. Or the image capturing control section 103 may also be arranged outside of the image sensor 102. If the image capturing control section 103 is arranged outside of the image sensor, the image capturing control section 103 supplies the read signals and switch control signal from outside of the image sensor 102.

Optionally, in the configuration of this embodiment, an on-chip micro lens may be arranged on each pixel in order to further increase the ability to condense the incoming light.

Next, it will be described how the image quality improvement processing section 105 operates. The image quality improvement processing section 105 of this embodiment receives data of an image that has been captured in a different exposure time from one horizontal pair of pixels to another. For example, a pair of $R_L$ and $Gr_L$ pixels has a longer exposure time than a pair of $R_S$ and $Gr_S$ pixels. And by subjecting the data to image quality improvement processing, the image quality improvement processing section 105 estimates the pixel values of respective pixels (e.g., R, G and B pixel values), thereby getting a color image.

Figure 12:
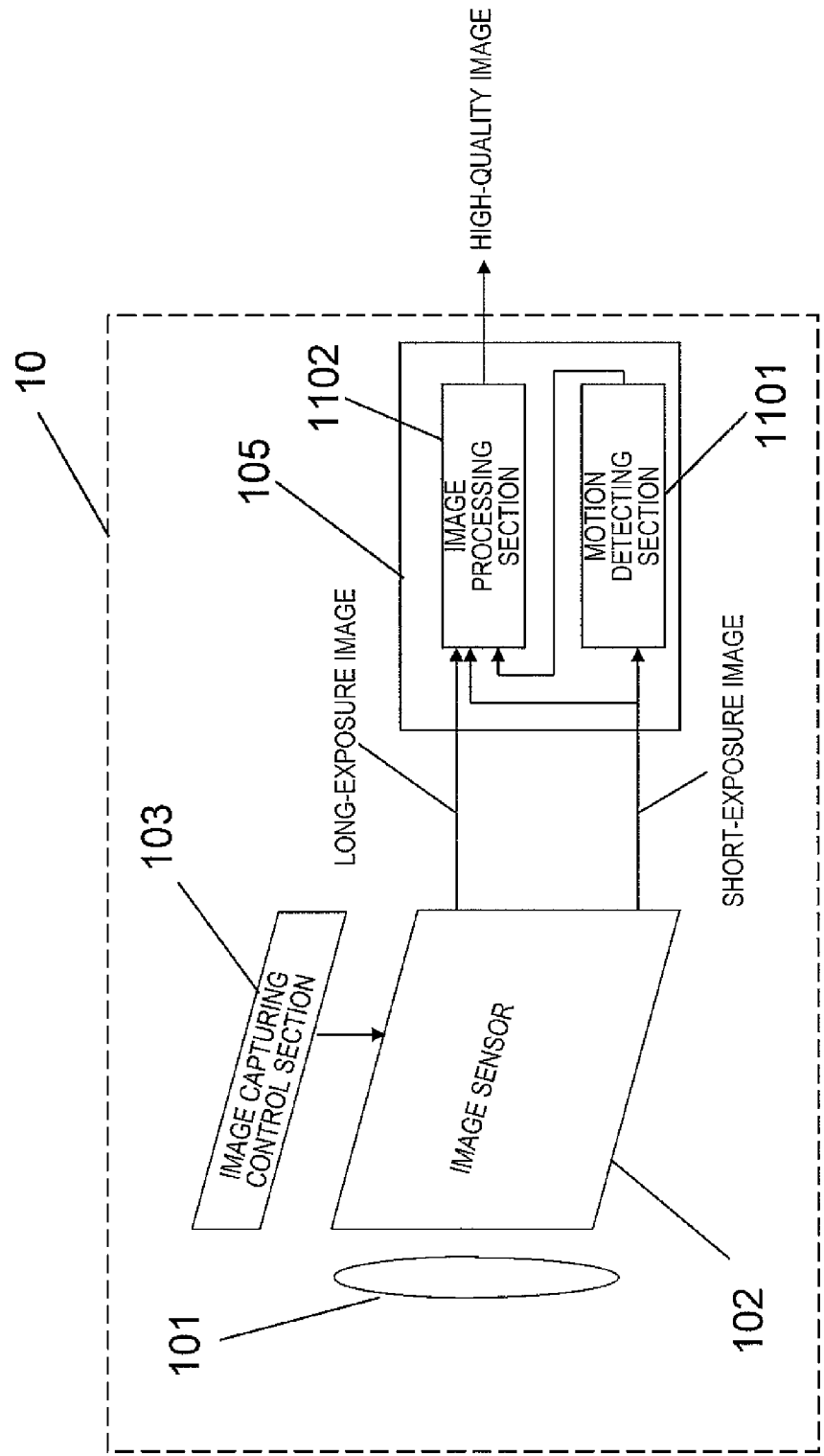
FIG. 12 illustrates a configuration for an image quality improvement processing section 105 according to the first embodiment of the present disclosure.

FIG. 12 illustrates an exemplary detailed configuration for the image quality improvement processing section 105. Other than the image quality improvement processing section 105, however, the configuration of the image capturing section 10 shown in FIG. 12 is the same as what is shown in FIG. 2C. The image quality improve processing section 105 includes a motion detection section 1011 and an image processing section 1102.

The motion detection section 1101 detects a motion (as an optical flow) based on pixel values that have been obtained through a short exposure process by using known techniques such as block matching, gradient method, and phase correlation method. The known techniques are disclosed by P. Anandan in "Computational Framework and an Algorithm for the Measurement of Visual Motion", International Journal of Computer Vision, Vol. 2, pp. 283-310, 1989, for example.

FIGS. 13($a$) and 13($b$) respectively illustrate a base frame and a reference frame for use to detect a motion by block matching. Specifically, the motion detection section 1101 sets a window area A shown in FIG. 13($a$) in the base frame (i.e., a picture in question at a time t, from which the motion needs to be detected), and then searches the reference frame for a pattern that is similar to the pattern inside the window area. As the reference frame, the frame that follows the base frame is often used. As shown in FIG. 13($b$), the search range is usually defined to be a predetermined range (which is identified by C in FIG. 13($b$)) with respect to a point B, at which the magnitude of motion is zero. Also, the degree of similarity between the patterns is estimated by calculating, as an estimate, either the sum of squared differences (SSD) represented by the following Equation (1) or the sum of absolute differences (SAD) represented by the following Equation (2):

$$SSD = \sum_{x,y \in W} (I(x+u, y+v, t+\Delta t) - I(x, y, t))^2 \quad (1)$$

$$SAD = \sum_{x,y \in W} |I(x+u, y+v, t+\Delta t) - I(x, y, t)| \quad (2)$$

In Equations (1) and (2), I (x, y, t) represents the temporal or spatial distribution of images (i.e., pixel values) and x, y∈W means the coordinates of pixels that fall within the window area in the base frame. In this embodiment, the motion is detected by obtaining the luminance component by the following Equation (3):

$$I(x,y,t)=0.30R(x,y,t)+0.59G(x,y,t)+0.11B(x,y,t) \quad (3)$$

I (x, y, t) does not have to be calculated by this Equation (3) but may also be obtained by simply adding together RGB values, for example.

The motion detecting section 1101 changes (u, v) within the search range, thereby searching for a set of (u, v) coordinates that minimizes the estimate value and defining the (u, v) coordinates to be a motion vector between the frames. And by sequentially shifting the positions of the window areas set, the motion is detected either on a pixel-by-pixel basis or on the basis of a block (which may consist of 8 pixels×8 pixels, for example), thereby generating a motion vector.

By applying a linear function or a quadratic function to the distribution of (u, v) coordinates in the vicinity of the (u, v) coordinates thus obtained that minimize either Equation (1) or (2), motion detection is carried out on a subpixel basis. The linear function or quadratic function may be applied by a known technique called "conformal fitting" or "parabolic fitting".

<How to Perform Image Quality Improvement Processing on the G Pixel Value of Each Pixel>

The image processing section 1102 calculates the R, G and B pixel values of each pixel by minimizing the evaluation function J represented by the following Equation (4):

$$J=|H_1 f-g_L|^M+|H_2 f-g_S|^M+Q \tag{4}$$

where $H_1$ represents the long-exposure sampling process, $H_2$ represents the short-exposure sampling process, f represents an RGB picture with a high spatial resolution and a high temporal resolution, of which the image quality needs to be improved, $g_L$ represents an RGB picture that has been captured by the image capturing section 101 through the long exposure process, $g_S$ represents an RGB picture that has been captured by the image capturing section 101 through the short exposure process, M represents the exponent, and Q represents the condition to be satisfied by the picture f to have its image quality improved, i.e., a constraint. Also, in Equation (4), |•| represents the norm of the vector.

The first term of Equation (4) means calculating the difference between the picture that has been obtained by sampling an RGB picture f with a high spatial resolution and a high temporal resolution to have its image quality improved through the long-exposure sampling process $H_1$ and $g_L$ that has been actually obtained through the long exposure process. If the long-exposure sampling process $H_1$ is defined in advance and if f that minimizes that difference is obtained, then it can be said that f will best match $g_L$ that has been obtained through the long exposure process. The same can be said about the second term. That is to say, it can be said that f that minimizes the difference will best match $g_S$ obtained through the short exposure process.

Furthermore, it can be said that f that minimizes Equation (4) will match well enough as a whole both $g_L$ and $g_S$ that have been obtained through the long and short exposure processes, respectively. The image quality improvement processing section 1102 calculates f that minimizes Equation (4), thereby generating the pixel values of an RGB picture with high spatial and temporal resolutions.

Hereinafter, Equation (4) will be described in further detail.

f, $g_L$ and $g_S$ are column vectors, each of which consists of the respective pixel values of a moving picture. In the following description, a vector representation of a picture means a column vector in which pixel values are arranged in the order of raster scan. On the other hand, a function representation means the temporal or spatial distribution of pixel values. If a pixel value is a luminance value, one pixel may have one pixel value. Supposing the moving picture to have improved image quality consists of 2000 horizontal pixels by 1000 vertical pixels in 30 frames, for example, the number of elements of f becomes 60000000 (=2000×1000×30).

The vertical and horizontal numbers of pixels of f and the number of frames for use to carry out signal processing are set by the image quality improvement processing section 105. In the long-exposure sampling process $H_1$, $H_1$ is a matrix, of which the number of rows is equal to the number of elements of $g_L$ and the number of columns is equal to the number of elements of f. On the other hand, in the short-exposure sampling process $H_2$, $H_2$ is a matrix, of which the number of rows is equal to the number of elements of $g_S$ and the number of columns is equal to the number of elements of f.

If the moving picture to have improved image quality has a size of 2000 horizontal pixels by 1000 vertical pixels in 30 frames as in the example described above, it is very difficult for computers used extensively today to obtain the values of all of those pixels (60000000 pixels) of the moving picture at a time in view of the cost of getting such computations done. In that case, by repeatedly performing the processing of obtaining f on temporal and spatial partial regions, the moving picture f to have improved image quality can be calculated.

Hereinafter, it will be described by way of a simple example how to formulate the long-exposure sampling process $H_1$. Specifically, it will be described how to capture $g_L$ in a situation where an image consisting of four horizontal pixels (where x=0, 1, 2, 3) by two vertical pixels (where y=0, 1) in two frames (where t=0, 1) is captured by an image sensor with a Bayer arrangement and two pixels on the line where y=0 on the left-hand side of the paper (i.e., R and G pixels) and two pixels on the line where y=1 on the right-hand side of the paper (i.e., G and B pixels) are added together for two frame periods as shown in FIG. 14.

$$f = (R_{000}\ G_{100}\ R_{200}\ G_{300}\ G_{010}\ B_{110}\ G_{210}\ B_{310}\ R_{001}\ G_{101}\ R_{201}\ G_{301}\ G_{011}\ B_{111}\ G_{211}\ B_{311})^T \tag{5}$$

$$H_1 = \begin{pmatrix} 1 & 0 & 0 & 0 & 0 & 0 & 0 & 0 & 1 & 0 & 0 & 0 & 0 & 0 & 0 & 0 \\ 0 & 1 & 0 & 0 & 0 & 0 & 0 & 0 & 0 & 1 & 0 & 0 & 0 & 0 & 0 & 0 \\ 0 & 0 & 0 & 0 & 0 & 0 & 1 & 0 & 0 & 0 & 0 & 0 & 0 & 0 & 1 & 0 \\ 0 & 0 & 0 & 0 & 0 & 0 & 0 & 1 & 0 & 0 & 0 & 0 & 0 & 0 & 0 & 1 \end{pmatrix} \tag{6}$$

In this case, the long-exposure image capturing process may be formulated as follows:

$$g_L = H_1 f = \begin{pmatrix} R_{000} + R_{001} \\ G_{100} + G_{101} \\ G_{210} + G_{211} \\ B_{310} + B_{311} \end{pmatrix} \tag{7}$$

Next, it will be described by way of a simple example how to formulate the short-exposure sampling process $H_2$. Specifically, it will be described how to capture two pixels on the line where y=0 on the right-hand side of the paper (i.e., R and G pixels) and two pixels on the line where y=1 on the left-hand side of the paper (i.e., G and B pixels) in the pixel arrangement shown in FIG. 14.

$$H_2 = \begin{pmatrix} 0 & 0 & 1 & 0 & 0 & 0 & 0 & 0 & 0 & 0 & 0 & 0 & 0 & 0 & 0 & 0 \\ 0 & 0 & 0 & 1 & 0 & 0 & 0 & 0 & 0 & 0 & 0 & 0 & 0 & 0 & 0 & 0 \\ 0 & 0 & 0 & 0 & 1 & 0 & 0 & 0 & 0 & 0 & 0 & 0 & 0 & 0 & 0 & 0 \\ 0 & 0 & 0 & 0 & 0 & 1 & 0 & 0 & 0 & 0 & 0 & 0 & 0 & 0 & 0 & 0 \\ 0 & 0 & 0 & 0 & 0 & 0 & 0 & 0 & 0 & 1 & 0 & 0 & 0 & 0 & 0 & 0 \\ 0 & 0 & 0 & 0 & 0 & 0 & 0 & 0 & 0 & 0 & 1 & 0 & 0 & 0 & 0 & 0 \\ 0 & 0 & 0 & 0 & 0 & 0 & 0 & 0 & 0 & 0 & 0 & 0 & 1 & 0 & 0 & 0 \\ 0 & 0 & 0 & 0 & 0 & 0 & 0 & 0 & 0 & 0 & 0 & 0 & 0 & 1 & 0 & 0 \end{pmatrix} \tag{8}$$

In this case, the short-exposure-line image capturing process may be formulated as follows:

$$g_s = H_2 f = \begin{pmatrix} R_{200} \\ G_{300} \\ G_{010} \\ B_{110} \\ R_{201} \\ G_{301} \\ G_{011} \\ B_{111} \end{pmatrix} \quad (9)$$

The value of the exponent M in Equation (4) is not particularly limited but is suitably one or two from the standpoint of computational load.

Equations (7) and (9) represent the process of obtaining $g_L$, $g_S$ by changing the exposure time of f on a line-by-line basis using an image sensor with a Bayer arrangement. Conversely, the problem of restoring f from $g_L$, $g_S$ is generally called a "reverse problem". If there are no constraints Q, there is an infinite number of f that minimizes the following Expression (10):

$$|H_1 f - g_L|^M + |H_2 f - g_S|^M \quad (10)$$

This can be explained easily because this Expression (10) is satisfied even if an arbitrary value is substituted for a pixel value not to be sampled. That is why f cannot be solved uniquely just by minimizing Expression (10).

Thus, to obtain a unique solution with respect to f, a constraint Q is introduced. A smoothness constraint on the distribution of the pixel values f or a smoothness constraint on the distribution of motions of the picture derived from f is given as Q.

The smoothness constraint on the distribution of the pixel values f may be given by any of the following constraint equations (11) and (12):

$$Q = \sum_{i=1}^{3} \lambda_{Ci} Q_{Ci} = \sum_{i=1}^{3} \lambda_{Ci} \left( \left| \frac{\partial C_i(f)}{\partial x} \right|^m + \left| \frac{\partial C_i(f)}{\partial y} \right|^m \right) \quad (11)$$

$$Q = \sum_{i=1}^{3} \lambda_{Ci} Q_{Ci} = \sum_{i=1}^{3} \lambda_{Ci} \left( \left| \frac{\partial^2 C_i(f)}{\partial x^2} \right|^m + \left| \frac{\partial^2 C_i(f)}{\partial y^2} \right|^m \right) \quad (12)$$

The value of the exponent m in these Equations (11) and (12) is suitably one or two just like the exponent M in Equations (4) and (10). In Equations (11) and (12), Ci is obtained by transforming the R, G and B values, which are elements of f, by the following Equation (13):

$$\begin{pmatrix} C_1 \\ C_2 \\ C_3 \end{pmatrix} = \begin{pmatrix} c_{11} & c_{12} & c_{13} \\ c_{21} & c_{22} & c_{23} \\ c_{31} & c_{32} & c_{33} \end{pmatrix} \begin{pmatrix} R \\ G \\ B \end{pmatrix} \quad (13)$$

In Equation (13), by setting $C_1$, $C_2$ and $C_3$ to be the first through third principal components of the distribution of RGB pixel values in a general image, the normalizing parameters on the smoothness constraint can be adjusted more easily than in an RGB space. That is to say, by adjusting $\lambda i$ individually on the supposition that the $C_1$ component is substantially equivalent to the luminance and that the $C_2$ and $C_3$ components are two color difference components, the influence of the respective terms of the smoothness constraint on the image to have improved image quality can be controlled. If the pixel values that have been read from every pixel by three-panel image capturing process, for example, can be provided in advance, the $\lambda_{C1}$ through $\lambda_{C3}$ values may be determined so that the image that has been subjected to the image quality improvement processing has the best PSNR.

Otherwise, the $\lambda_{C1}$ through $\lambda_{C3}$ values may be determined by checking out the image quality of the image that has been subjected to the image quality improvement processing through a manual operation based on the values described above.

Optionally, these partially differentiated values $\partial Ci/\partial x$, $\partial Ci/\partial y$, $\partial^2 Ci/\partial x^2$ and $\partial^2 Ci/\partial y^2$ may be approximated by the following Equation (14), for example, by expanding the differences with the values of pixels surrounding the pixel in question:

$$\frac{\partial C_i(x, y, t)}{\partial x} = \frac{C_i(x+1, y, t) - C_i(x-1, y, t)}{2} \quad (14)$$

$$\frac{\partial C_i(x, y, t)}{\partial y} = \frac{C_i(x, y+1, t) - C_i(x, y-1, t)}{2}$$

$$\frac{\partial^2 C_i(x, y, t)}{\partial x^2} = C_i(x+1, y, t) - 2C_i(x, y, t) + C_i(x-1, y, t)$$

$$\frac{\partial^2 C_i(x, y, t)}{\partial y^2} = C_i(x, y+1, t) - 2C_i(x, y, t) + f(x, y-1, t)$$

To expand the differences, this Equation (14) does not always have to be used but other surrounding pixels may also be used as reference pixels as in the following Equation (15):

$$\frac{\partial C_i(x, y, t)}{\partial x} = \quad (15)$$

$$\frac{1}{6}(C_i(x+1, y-1, t) - C_i(x-1, y-1, t) + C_i(x+1, y, t) -$$

$$C_i(x-1, y, t) + C_i(x+1, y+1, t) - C_i(x-1, y+1, t))$$

$$\frac{\partial C_i(x, y, t)}{\partial y} = \frac{1}{6}(C_i(x-1, y+1, t) - C_i(x-1, y-1, t) + C_i(x, y+1,$$

$$t) - C_i(x, y-1, t) + C_i(x+1, y+1, t) - C_i(x+1, y-1, t))$$

$$\frac{\partial^2 C_i(x, y, t)}{\partial x^2} = \frac{1}{3}(C_i(x+1, y-1, t) - 2C_i(x, y-1, t) +$$

$$C_i(x-1, y-1, t) + C_i(x+1, y, t) -$$

$$2C_i(x, y, t) + C_i(x-1, y, t) + C_i(x+1, y+1, t) -$$

$$2C_i(x, y+1, t) + C_i(x-1, y+1, t))$$

$$\frac{\partial^2 C_i(x, y, t)}{\partial y^2} = \frac{1}{3}(C_i(x-1, y+1, t) - 2C_i(x-1, y, t) +$$

$$C_i(x-1, y-1, t) + C_i(x, y+1, t) -$$

$$2C_i(x, y, t) + C_i(x, y-1, t) + C_i(x+1, y+1, t) -$$

$$2C_i(x+1, y, t) + C_i(x+1, y-1, t))$$

According to this Equation (15), neighboring ones of the values calculated by Equation (14) are averaged. As a result, the spatial resolution does decrease but the influence of noise can be reduced. As an intermediate one between these two methods, the following Equation (16) in which α falling within the range 0≤α≤1 is added as a weight may also be used:

$$\frac{\partial C_i(x, y, t)}{\partial x} = \frac{1-\alpha}{2} \frac{C_i(x+1, y-1, t) - C_i(x-1, y-1, t)}{2} + \quad (16)$$

$$\alpha \frac{C_i(x+1, y, t) - C_i(x-1, y, t)}{2} +$$

$$\frac{1-\alpha}{2} \frac{C_i(x+1, y+1, t) - C_i(x-1, y+1, t)}{2}$$

$$\frac{\partial C_i(x, y, t)}{\partial y} = \frac{1-\alpha}{2} C_i(x-1, y+1, t) - C_i(x-1, y-1, t) +$$

$$\alpha \frac{C_i(x, y+1, t) - C_i(x, y-1, t)}{2} +$$

$$\frac{1-\alpha}{2} \frac{C_i(x+1, y+1, t) - C_i(x+1, y-1, t)}{2}$$

$$\frac{\partial^2 C_i(x, y, t)}{\partial x^2} =$$

$$\frac{1-\alpha}{2}(C_i(x+1, y-1, t) - 2C_i(x, y-1, t) + C_i(x-1, y-1, t)) +$$

$$\alpha(C_i(x+1, y, t) - 2C_i(x, y, t) + C_i(x-1, y, t)) +$$

$$\frac{1-\alpha}{2}(C_i(x+1, y+1, t) - 2C_i(x, y+1, t) + C_i(x-1, y+1, t))$$

$$\frac{\partial^2 C_i(x, y, t)}{\partial y^2} = \frac{1-\alpha}{2}$$

$$(C_i(x-1, y+1, t) - 2C_i(x-1, y, t) + C_i(x-1, y-1, t)) +$$

$$\alpha(C_i(x, y+1, t) - 2C_i(x, y, t) + C_i(x, y-1, t)) +$$

$$\frac{1-\alpha}{2}(C_i(x+1, y+1, t) - 2C_i(x+1, y, t) + C_i(x+1, y-1, t))$$

As to how to expand the differences, $\alpha$ may be determined in advance according to the noise level so that the image quality will be improved as much as possible through the processing. Or to cut down the circuit scale or computational load as much as possible, Equation (14) may be used as well.

It should be noted that the smoothness constraint on the distribution of the pixel values of the picture f does not always have to be calculated by Equation (11) or (12) but may also be the $m^{th}$ power of the absolute value of the second-order directional differential value given by the following Equation (17):

$$Q = \sum_{i=1}^{3} \lambda_{Ci} \left| \frac{\partial}{\partial n_{min}} \left( \frac{\partial C_i}{\partial n_{min}} \right) \right|^m \quad (17)$$

$$= \sum_{i=1}^{3} \lambda_{Ci} \left| \frac{\partial}{\partial n_{min}} \left( -\sin\theta \frac{\partial C_i}{\partial x} + \cos\theta \frac{\partial C_i}{\partial y} \right) \right|^m$$

$$= \sum_{i=1}^{3} \lambda_{Ci} \left| \begin{array}{l} -\sin\theta \frac{\partial}{\partial x}\left(-\sin\theta \frac{\partial C_i}{\partial x} + \cos\theta \frac{\partial C_i}{\partial y}\right) + \\ \cos\theta \frac{\partial}{\partial y}\left(-\sin\theta \frac{\partial C_i}{\partial x} + \cos\theta \frac{\partial C_i}{\partial y}\right) \end{array} \right|^m$$

$$= \sum_{i=1}^{3} \lambda_{Ci} \left| \begin{array}{l} \sin^2\theta \frac{\partial^2 C_i}{\partial x^2} - \sin\theta\cos\theta \frac{\partial^2 C_i}{\partial x \partial y} - \\ \sin\theta\cos\theta \frac{\partial^2 C_i}{\partial y \partial x} + \cos^2\theta \frac{\partial^2 C_i}{\partial y^2} \end{array} \right|^m$$

In Equation (17), the angle $\theta$ of the vector $n_{min}$ indicates the direction in which the square of the first-order directional differential value becomes minimum and is given by the following Equation (18):

$$n_{min} = \left( \frac{-\frac{\partial f}{\partial y}}{\sqrt{\left(\frac{\partial f}{\partial x}\right)^2 + \left(\frac{\partial f}{\partial y}\right)^2}} \quad \frac{\frac{\partial f}{\partial x}}{\sqrt{\left(\frac{\partial f}{\partial x}\right)^2 + \left(\frac{\partial f}{\partial y}\right)^2}} \right)^T \quad (18)$$

$$= (-\sin\theta \quad \cos\theta)^T$$

Furthermore, the smoothness constraint on the distribution of the pixel values of the picture f may also be changed adaptively to the gradient of the pixel value of f by using Q that is calculated by one of the following Equations (19), (20) and (21):

$$Q = w(x, y) \left| \left( \frac{\partial C_i}{\partial x} \right)^2 + \left( \frac{\partial C_i}{\partial y} \right)^2 \right| \quad (19)$$

$$Q = w(x, y) \left| \left( \frac{\partial^2 C_i}{\partial x^2} \right)^2 + \left( \frac{\partial^2 C_i}{\partial y^2} \right)^2 \right| \quad (20)$$

$$Q = w(x, y) \left| \frac{\partial}{\partial n_{min}} \left( \frac{\partial C_i}{\partial n_{min}} \right) \right|^m \quad (21)$$

In Equations (19) to (21), w (x, y) is a function representing the gradient of the pixel value and is also a weight function with respect to the constraint. The constraint can be changed adaptively to the gradient of f so that the w (x, y) value is small if the sum of the $m^{th}$ powers of the pixel value gradient components as represented by the following Expression (22) is large but is large if the sum is small:

$$\left| \frac{\partial C_i}{\partial x} \right|^m + \left| \frac{\partial C_i}{\partial y} \right|^m \quad (22)$$

By introducing such a weight function, it is possible to prevent the picture f to have improved image quality from being smoothed out excessively.

Alternatively, the weight function w(x, y) may also be defined by the magnitude of the $m^{th}$ power of the directional differential value as represented by the following Equation (23) instead of the sum of squares of the luminance gradient components represented by Expression (22):

$$\left| \frac{\partial C_i}{\partial n_{max}} \right|^m = \left| \cos\theta \frac{\partial C_i}{\partial x} + \sin\theta \frac{\partial C_i}{\partial y} \right|^m \quad (23)$$

In Equation (24), the vector $n_{max}$ and the angle $\theta$ represent the direction in which the directional differential value becomes maximum and which is given by the following Equation (24):

$$n_{max} = \left( \frac{\frac{\partial C_i}{\partial x}}{\sqrt{\left(\frac{\partial C_i}{\partial x}\right)^2 + \left(\frac{\partial C_i}{\partial y}\right)^2}} \quad \frac{\frac{\partial C_i}{\partial y}}{\sqrt{\left(\frac{\partial C_i}{\partial x}\right)^2 + \left(\frac{\partial C_i}{\partial y}\right)^2}} \right)^T \quad (24)$$

$$= (\cos\theta \quad \sin\theta)^T$$

The problem of solving Equation (4) by introducing a smoothness constraint on the distribution of the pixel values of a moving picture f as represented by Equations (11), (12)

and (17) through (21) can be calculated by a known solution (i.e., a solution for a variational problem such as a finite element method).

As the smoothness constraint on the distribution of motions of the picture included in f, one of the following Equations (25) and (26) may be used:

$$Q = \left|\frac{\partial u}{\partial x}\right|^m + \left|\frac{\partial u}{\partial y}\right|^m + \left|\frac{\partial v}{\partial x}\right|^m + \left|\frac{\partial v}{\partial y}\right|^m \quad (25)$$

$$Q = \left|\frac{\partial^2 u}{\partial x^2}\right|^m + \left|\frac{\partial^2 u}{\partial y^2}\right|^m + \left|\frac{\partial^2 v}{\partial x^2}\right|^m + \left|\frac{\partial^2 v}{\partial y^2}\right|^m \quad (26)$$

where u is a column vector, of which the elements are x-direction components of motion vectors of respective pixels obtained from the moving picture f, and v is a column vector, of which the elements are y-direction components of motion vectors of respective pixels obtained from the moving picture f.

The smoothness constraint on the distribution of motions of the picture obtained from f does not have to be calculated by Equation (21) or (22) but may also be the first- or second-order directional differential value as represented by the following Equation (27) or (28):

$$Q = \left|\frac{\partial u}{\partial n_{min}}\right|^m + \left|\frac{\partial v}{\partial n_{min}}\right|^m \quad (27)$$

$$Q = \left|\frac{\partial}{\partial n_{min}}\left(\frac{\partial u}{\partial n_{min}}\right)\right|^m + \left|\frac{\partial}{\partial n_{min}}\left(\frac{\partial v}{\partial n_{min}}\right)\right|^m \quad (28)$$

Still alternatively, as represented by the following Equations (29) to (32), the constraints represented by the Equations (21) through (24) may also be changed adaptively to the gradient of the pixel value of f:

$$Q = w(x, y)\left(\left|\frac{\partial u}{\partial x}\right|^m + \left|\frac{\partial u}{\partial y}\right|^m + \left|\frac{\partial v}{\partial x}\right|^m + \left|\frac{\partial v}{\partial y}\right|^m\right) \quad (29)$$

$$Q = w(x, y)\left(\left|\frac{\partial^2 u}{\partial x^2}\right|^m + \left|\frac{\partial^2 u}{\partial y^2}\right|^m + \left|\frac{\partial^2 v}{\partial x^2}\right|^m + \left|\frac{\partial^2 v}{\partial y^2}\right|^m\right) \quad (30)$$

$$Q = w(x, y)\left(\left|\frac{\partial u}{\partial n_{min}}\right|^m + \left|\frac{\partial v}{\partial n_{min}}\right|^m\right) \quad (31)$$

$$Q = w(x, y)\left(\left|\frac{\partial}{\partial n_{min}}\left(\frac{\partial u}{\partial n_{min}}\right)\right|^m + \left|\frac{\partial}{\partial n_{min}}\left(\frac{\partial v}{\partial n_{min}}\right)\right|^m\right) \quad (32)$$

where w(x, y) is the same as the weight function on the gradient of the pixel value of f and is defined by either the sum of the $m^{th}$ powers of pixel value gradient components as represented by Expression (22) or the $m^{th}$ power of the directional differential value represented by Equation (23).

By introducing such a weight function, it is possible to prevent the motion information of f from being smoothed out unnecessarily. As a result, it is possible to avoid an unwanted situation where the picture f to be subjected to the image quality improvement processing is smoothed out excessively.

In dealing with the problem of solving Equation (4) by introducing the smoothness constraint on the distribution of motions obtained from the picture f as represented by Equations (25) through (32), more complicated calculations need to be done compared to the situation where the smoothness constraint on f is used. The reason is that the picture f to have improved image quality and the motion information (u, v) depend on each other.

To avoid such an unwanted situation, the calculations may also be done by a known solution (e.g., a solution for a variational problem using an EM algorithm). In that case, to perform iterative calculations, the initial values of the picture f to have improved image quality and the motion information (u, v) are needed.

As the initial f value, an interpolated enlarged version of the input picture may be used. On the other hand, as the motion information (u, v), what has been calculated by the motion detecting section 1101 using Equation (1) or (2) may be used. In that case, if the image quality improvement processing section 105 solves Equation (4) by introducing the smoothness constraint on the distribution of motions obtained from the picture f as in Equations (25) through (32) and as described above, the image quality can be improved as a result of the super-resolution processing.

The image quality improvement processing section 105 may perform its processing by using, in combination, the smoothness constraint on the distribution of pixel values as represented by one of Equations (11), (12) and (17) through (21) and the smoothness constraint on the distribution of motions as represented by Equations (25) through (32) as in the following Equation (33):

$$Q = \lambda_1 Q_f + \lambda_2 Q_{uv} \quad (33)$$

where $Q_f$ is the smoothness constraint on the pixel value gradient of f, $Q_{uv}$ is the smoothness constraint on the distribution of motions of the picture obtained from f, and $\lambda_1$ and $\lambda_2$ are weights added to the constraints $Q_f$ and $Q_{uv}$, respectively.

The problem of solving Equation (4) by introducing both the smoothness constraint on the distribution of pixel values and the smoothness constraint on the distribution of motions of the picture can also be calculated by a known solution (e.g., a solution for a variational problem using an EM algorithm).

The constraint on the motion does not have to be the constraint on the smoothness of the distribution of motion vectors as represented by Equations (25) through (32) but may also use the residual between two associated points (i.e., the difference in pixel value between the starting and end points of a motion vector) as an estimate value so as to reduce the residual as much as possible. If f is represented by the function f (x, y, t), the residual between the two associated points can be represented by the following Expression (34):

$$f(x+u, y+v, t+\Delta t) - f(x, y, t) \quad (34)$$

If f is regarded as a vector that is applied to the entire picture, the residual of each pixel can be represented as a vector as in the following Expression (35):

$$H_m f \quad (35)$$

The sum of squared residuals can be represented by the following Equation (36):

$$|H_m f|^2 = f^T H_m^T H_m f \quad (36)$$

In Expressions (35) and (36), $H_m$ represents a matrix consisting of the number of elements of the vector f (i.e., the total number of pixels in the temporal or spatial range)×the number of elements of f. In $H_m$, only two elements of each row that are associated with the starting and end points of a motion vector have non-zero values, while the other elements have a zero value. Specifically, if the motion vector has an integral precision, the elements associated with the starting and end points have values of −1 and 1, respectively, but the other elements have a value of 0.

On the other hand, if the motion vector has a subpixel precision, multiple elements associated with multiple pixels around the end point will have non-zero values according to the subpixel component value of the motion vector.

Optionally, the constraint may be represented by the following Equation (37) with Equation (36) replaced by $Q_m$:

$$Q = \lambda_1 Q_f + \mu_2 Q_{uv} + \mu_3 Q_m \qquad (37)$$

where $\lambda_3$ is the weight with respect to the constraint $Q_m$.

According to the method described above, by using the motion information that has been obtained from low-resolution moving pictures of $G_S$, R and B by the motion detecting section 201, an RGB moving picture that has been captured by an image sensor with a Bayer arrangement can have its temporal and spatial resolutions increased by the image quality improvement processing section 105.

The method of calculating R, G and B pixel values that is used by the image quality improvement processing section 105 as described above is only an example. Thus, any other calculating method may be adopted as well. Specifically, the image quality improvement processing section 105 sets an evaluation function J representing the degree of similarity between the spatial variation patterns of respective color pictures the target color picture f should have, and looks for the target picture f that minimizes the evaluation function J. If their spatial variation patterns are similar, it means that the blue, red and green moving pictures cause similar spatial variations.

The following Equation (38) shows an example of the evaluation function J:

$$J(f) = \mu \|H_1 f - g_L\|^2 + \|H_2 f - g_S\|^2 + \lambda_\theta \|Q_S C_\theta f\|^p + \lambda_\phi \|Q_S C_\phi f\|^p + \lambda_\psi \|Q_S C_\psi f\|^p \qquad (38)$$

The evaluation function J is defined herein as a function of respective color pictures in red, green and blue that form the high-resolution color picture f to generate (i.e., the target picture). In Equation (38), the first and second terms of its right side are the same as what is calculated by Equation (4) by setting the exponent M to be two.

The sum of squared differences between the pixel values at multiple pixel locations on the low resolution picture and the ones at their associated pixel locations on the input picture is set to be an evaluation condition for the evaluation function (see the first and second terms of Equation (38)). That is to say, these evaluation conditions represent the magnitude of the differential vector between a vector consisting of the respective pixel values of the low resolution picture and a vector consisting of the respective pixel values of the input picture.

$Q_S$ in the third, fourth and fifth terms on the right side of Equation (38) is an evaluation condition for evaluating the spatial smoothness of a pixel value. $Q_{S1}$ and $Q_{S2}$, which are examples of $Q_S$, are represented by the following Equations (39) and (40), respectively:

$$Q_{s1} = \qquad (39)$$
$$\sum_x \sum_y \left[ \lambda_\theta(x,y) \cdot \left\{ \begin{array}{c} 4 \cdot \theta_H(x,y) - \theta_H(x,y-1) - \theta_H(x,y+1) - \\ \theta_H(x-1,y) - \theta_H(x+1,y) \end{array} \right\}^2 + \right.$$
$$\lambda_\varphi(x,y) \cdot \left\{ \begin{array}{c} 4 \cdot \varphi_H(x,y) - \varphi_H(x,y-1) - \varphi_H(x,y+1) - \\ \varphi_H(x-1,y) - \varphi_H(x+1,y) \end{array} \right\}^2 +$$
$$\left. \lambda_r(x,y) \cdot \left\{ \begin{array}{c} 4 \cdot r_H(x,y) - r_H(x,y-1) - r_H(x,y+1) - \\ r_H(x-1,y) - r_H(x+1,y) \end{array} \right\}^2 \right]$$

In Equation (39), $\theta_H(x, y)$, $\psi_H(x, y)$ and $r_H(x, y)$ are coordinates when a position in a three-dimensional orthogonal color space (i.e., a so-called "RGB color space") that is represented by red, green and blue pixel values at a pixel location (x, y) on the target picture is represented by a spherical coordinate system ($\theta$, $\psi$, r) corresponding to the RGB color space. In this case, $\theta_H(x, y)$ and $\psi_H(x, y)$ represent two kinds of arguments and $r_H(x, y)$ represents the radius.

FIG. 15 illustrates an exemplary correspondence between the RGB color space and the spherical coordinate system ($\theta$, $\psi$, r).

In the example illustrated in FIG. 15, the direction in which $\theta=0$ degrees and $\psi=0$ degrees is supposed to be positive R-axis direction in the RGB color space, and the direction in which $\theta=90$ degrees and $\psi=0$ degrees is supposed to be positive G-axis direction in the RGB color space. However, the reference directions of the arguments do not have to be the ones shown in FIG. 15 but may also be any other directions. In accordance with such correspondence, red, green and blue pixel values, which are coordinates in the RGB color space, are converted into coordinates in the spherical coordinate system ($\theta$, $\psi$, r).

Suppose the pixel value of each pixel of the target moving picture is represented by a three-dimensional vector in the RGB color space. In that case, if the three-dimensional vector is represented by the spherical coordinate system ($\theta$, $\psi$, r) that is associated with the RGB color space, then the brightness (which is synonymous with the signal intensity and the luminance) of the pixel corresponds to the r-axis coordinate representing the magnitude of the vector. On the other hand, the directions of vectors representing the color (i.e., color information including the hue, color difference and color saturation) of the pixel are defined by $\theta$-axis and $\psi$-axis coordinate values. That is why by using the spherical coordinate system ($\theta$, $\psi$, r), the three parameters r, $\theta$ and $\psi$ that define the brightness and color of each pixel can be dealt with independently of each other.

Equation (39) defines the sum of squared second-order differences in the xy space direction between pixel values that are represented by the spherical coordinate system of the target picture. Equation (39) also defines a condition $Q_{S1}$ on which the more uniformly the spherical coordinate system pixel values, which are associated with spatially adjacent pixels in the target picture, vary, the smaller their values become. Generally speaking, if pixel values vary uniformly, then it means that the colors of those pixels are continuous with each other. Also, if the condition $Q_{S1}$ should have a small value, then it means that the colors of spatially adjacent pixels in the target picture should be continuous with each other.

In a picture, the variation in the brightness of a pixel and the variation in the color of that pixel may be caused by two physically different events. That is why by separately setting a condition on the continuity of a pixel's brightness (i.e., the degree of uniformity of the variation in r-axis coordinate value) as in the third term in the bracket of Equation (39) and a condition on the continuity of the pixel's color (i.e., the degree of uniformity in the variations in $\theta$- and $\psi$-axis coordinate values) as in the first and second terms in the bracket of Equation (39), the target image quality can be achieved more easily.

$\lambda\theta(x, y)$, $\lambda\psi(x, y)$ and $\lambda_r(x, y)$ represent the weights to be applied to a pixel location (x, y) on the target picture with respect to the conditions that have been set with the $\theta$-, and $\psi$-axis coordinate values, respectively. These values are determined in advance. To simplify the computation, these weights may be set to be constant irrespective of the pixel location or the frame so that $\lambda\theta(x, y) = \lambda\psi(x, y) = 1.0$, and $\lambda_r(x,$ y)=0.01, for example. Alternatively, these weights may be set to be relatively small in a portion of the image where it is known in advance that pixel values should be discontinuous, for instance. Optionally, pixel values can be determined to be discontinuous with each other if the absolute value of the difference or the second-order difference between the pixel values of two adjacent pixels in a frame image of the input picture is equal to or greater than a particular value.

It is recommended that the weights applied to the condition on the continuity of the color of pixels be heavier than the weights applied to the condition on the continuity of the brightness of the pixels. This is because the brightness of pixels in an image tends to vary more easily (i.e., vary less uniformly) than its color when the orientation of the subject's surface (i.e., a normal to the subject's surface) changes due to the unevenness or the movement of the subject's surface.

In Equation (39), the sum of squared second-order differences in the xy space direction between the pixel values, which are represented by the spherical coordinate system on the target picture, is set as the condition $Q_{S1}$. Alternatively, the sum of the absolute values of the second-order differences or the sum of squared first-order differences or the sum of the absolute values of the first-order differences may also be set as that condition $Q_{S1}$.

Also, in the foregoing description, the color space condition is set using the spherical coordinate system ($\theta$, $\psi$, r) that is associated with the RGB color space. However, the coordinate system to use does not always have to be the spherical coordinate system. Rather the same effects as what has already been described can also be achieved by setting a condition on a different orthogonal coordinate system with axes of coordinates that make the brightness and color of pixels easily separable from each other.

The axes of coordinates of the different orthogonal coordinate system may be set in the directions of eigenvectors (i.e., may be the axes of eigenvectors), which are defined by analyzing the principal components of the RGB color space frequency distribution of pixel values that are included in the input moving picture or another moving picture as a reference.

$$Q_{S2} = \sum_x \sum_y \left[ \lambda_{C1}(x, y) \cdot \left\{ \begin{array}{c} 4 \cdot C_1(x, y) - C_1(x, y-1) - C_1(x, y+1) - \\ C_1(x-1, y) - C_1(x+1, y) \end{array} \right\}^2 + \lambda_{C2}(x, y) \cdot \left\{ \begin{array}{c} 4 \cdot C_2(x, y) - C_2(x, y-1) - C_2(x, y+1) - \\ C_2(x-1, y) - C_2(x+1, y) \end{array} \right\}^2 + \lambda_{C3}(x, y) \cdot \left\{ \begin{array}{c} 4 \cdot C_3(x, y) - C_3(x, y-1) - C_3(x, y+1) - \\ C_3(x-1, y) - C_3(x+1, y) \end{array} \right\}^2 \right]$$

(40)

In Equation (40), $C_1(x, Y)$, $C_2(x, y)$ and $C_3(x, Y)$ represent rotational transformations that transform RGB color space coordinates, which are red, green and blue pixel values at a pixel location (x, y) on the target picture, into coordinates on the axes of $C_1$, $C_2$ and $C_3$ coordinates of the different orthogonal coordinate system.

Equation (40) defines the sum of squared second-order differences in the xy space direction between pixel values of the target picture that are represented by the different orthogonal coordinate system. Also, Equation (40) defines a condition $Q_{S2}$. In this case, the more uniformly the pixel values of spatially adjacent pixels in each frame image of the target moving picture, which are represented by the different orthogonal coordinate system, vary (i.e., the more continuous those pixel values), the smaller the value of the condition $Q_{S2}$.

And if the value of the condition $Q_{S2}$ should be small, it means that the colors of spatially adjacent pixels on the target moving picture should have continuous colors.

$\lambda_{C1}(x, y)$, $\lambda_{C2}(x, y)$ and $\lambda_{C3}(x, y)$ are weights applied to a pixel location (x, y) on the target picture with respect to a condition that has been set using coordinates on the $C_1$, $C_2$ and $C_3$ axes and need to be determined in advance.

If the $C_1$, $C_2$ and $C_3$ axes are axes of eigenvectors, then the $\lambda_{C1}(x, y)$, $\lambda_{C2}(x, y)$ and $\lambda_{C3}(x, y)$ values are suitably set along those axes of eigenvectors independently of each other. Then, the best $\lambda$ values can be set according to the variance values that are different from one axis of eigenvectors to another. Specifically, in the direction of a non-principal component, the variance should be small and the sum of squared second-order differences should decrease, and therefore, the $\lambda$ value is increased. Conversely, in the principal component direction, the $\lambda$ value is decreased.

Two conditions $Q_{S1}$ and $Q_{S2}$ have been described as examples. And the condition $Q_S$ may be any of the two conditions $Q_{S1}$ and $Q_{S2}$ described above.

For example, if the condition $Q_{S1}$ defined by Equation (39) is adopted, the spherical coordinate system ($\theta$, $\psi$, r) may be introduced. Then, the condition can be set using the coordinates on the $\theta$- and $\psi$-axes that represent color information and the coordinate on the r-axis that represents the signal intensity independently of each other. In addition, in setting the condition, appropriate weight parameters $\lambda$ can be applied to the color information and the signal intensity, respectively. As a result, a picture of quality can be generated more easily, which is beneficial.

On the other hand, if the condition $Q_{S2}$ defined by Equation (40) is adopted, then the condition is set with coordinates of a different orthogonal coordinate system that is obtained by performing a linear (or rotational) transformation on RGB color space coordinates. Consequently, the computation can be simplified, which is also advantageous.

On top of that, by defining the axes of eigenvectors as the axes of coordinates $C_1$, $C_2$ and $C_3$ of the different orthogonal coordinate system, the condition can be set using the coordinates on the axes of eigenvectors that reflect a color variation to affect an even greater number of pixels. As a result, the quality of the target picture obtained should improve compared to a situation where the condition is set simply by using the pixel values of the respective color components in red, green and blue.

The evaluation function J does not have to be the one described above. Alternatively, terms of Equation (38) may be replaced with terms of a similar equation or another term representing a different condition may be newly added thereto.

Next, respective pixel values of a target picture that will make the value of the evaluation function J represented by Equation (38) as small as possible (and ideally minimize it) are obtained, thereby generating respective color pictures $R_H$, $G_H$ and $B_H$ of the target picture.

The target picture g that will minimize the evaluation function J may also be obtained by solving the following Equation (41) in which every J differentiated by the pixel value component of each color picture $R_H$, $G_H$, $B_H$ is supposed to be zero:

$$\frac{\partial J}{\partial R_H(x, y)} = \frac{\partial J}{\partial G_H(x, y)} = \frac{\partial J}{\partial B_H(x, y)} = 0 \quad (41)$$

The differentiation expression on each side becomes equal to zero when the gradient of each second-order expression represented by an associated first, second or third term of Equation (38) becomes equal to zero. $R_H$, $G_H$ and $B_H$ in such a situation can be said to be the ideal target picture that gives the minimum value of each second-order expression.

Alternatively, the target picture may also be obtained by an optimizing technique that requires iterative computations such as the steepest gradient method.

In the embodiment described above, the color picture to output is supposed to consist of R, G and B components. Naturally, however, a color picture consisting of non-RGB components (e.g., Y, Pb and Pr) may also be output. That is to say, the change of variables represented by the following Equation (43) can be done based on Equations (41) and (42):

$$\begin{pmatrix} R \\ G \\ B \end{pmatrix} = \begin{pmatrix} 1 & -0.00015 & 1.574765 \\ 1 & -0.18728 & -0.46812 \\ 1 & 1.85561 & 0.000106 \end{pmatrix} \begin{pmatrix} Y \\ Pb \\ Pr \end{pmatrix} \quad (42)$$

$$\begin{pmatrix} \frac{\partial J}{\partial Y_H(x,y)} \\ \frac{\partial J}{\partial Pb_H(x,y)} \\ \frac{\partial J}{\partial Pr_H(x,y)} \end{pmatrix} = \begin{pmatrix} \frac{\partial J}{\partial R_H(x,y)} \frac{\partial R_H(x,y)}{\partial Y_H(x,y)} + \frac{\partial J}{\partial G_H(x,y)} \frac{\partial G_H(x,y)}{\partial Y_H(x,y)} + \frac{\partial J}{\partial B_H(x,y)} \frac{\partial B_H(x,y)}{\partial Y_H(x,y)} \\ \frac{\partial J}{\partial R_H(x,y)} \frac{\partial R_H(x,y)}{\partial Pb_H(x,y)} + \frac{\partial J}{\partial G_H(x,y)} \frac{\partial G_H(x,y)}{\partial Pb_H(x,y)} + \frac{\partial J}{\partial B_H(x,y)} \frac{\partial B_H(x,y)}{\partial Pb_H(x,y)} \\ \frac{\partial J}{\partial R_H(x,y)} \frac{\partial R_H(x,y)}{\partial Pr_H(x,y)} + \frac{\partial J}{\partial G_H(x,y)} \frac{\partial G_H(x,y)}{\partial Pr_H(x,y)} + \frac{\partial J}{\partial B_H(x,y)} \frac{\partial B_H(x,y)}{\partial Pr_H(x,y)} \end{pmatrix} \quad (43)$$

$$= \begin{pmatrix} 1 & 1 & 1 \\ -0.00015 & -0.18728 & 1.85561 \\ 1.574765 & -0.46812 & 0.000106 \end{pmatrix} \begin{pmatrix} \frac{\partial J}{\partial R_H(x,y)} \\ \frac{\partial J}{\partial G_H(x,y)} \\ \frac{\partial J}{\partial B_H(x,y)} \end{pmatrix}$$

$$= 0$$

Furthermore, considering that Pb and Pr have a half the number of horizontal pixels as Y in the YPbPr=4:2:2 format, simultaneous equations can be formulated with respect to $Y_H$, $Pb_L$ and $Pr_L$ by using the relations represented by the following Equations (44):

$$Pb_L(x+0.5)=0.5(Pb_H(x)+Pb_H(x+1))$$

$$Pr_L(x+0.5)=0.5(Pr_H(x)+Pr_H(x+1)) \quad (44)$$

In that case, the total number of variables to be obtained by solving the simultaneous equations can be reduced to two-thirds compared to the situation where the color image to output consists of R, G and B components. As a result, the computational load can be cut down.

Figure 36:
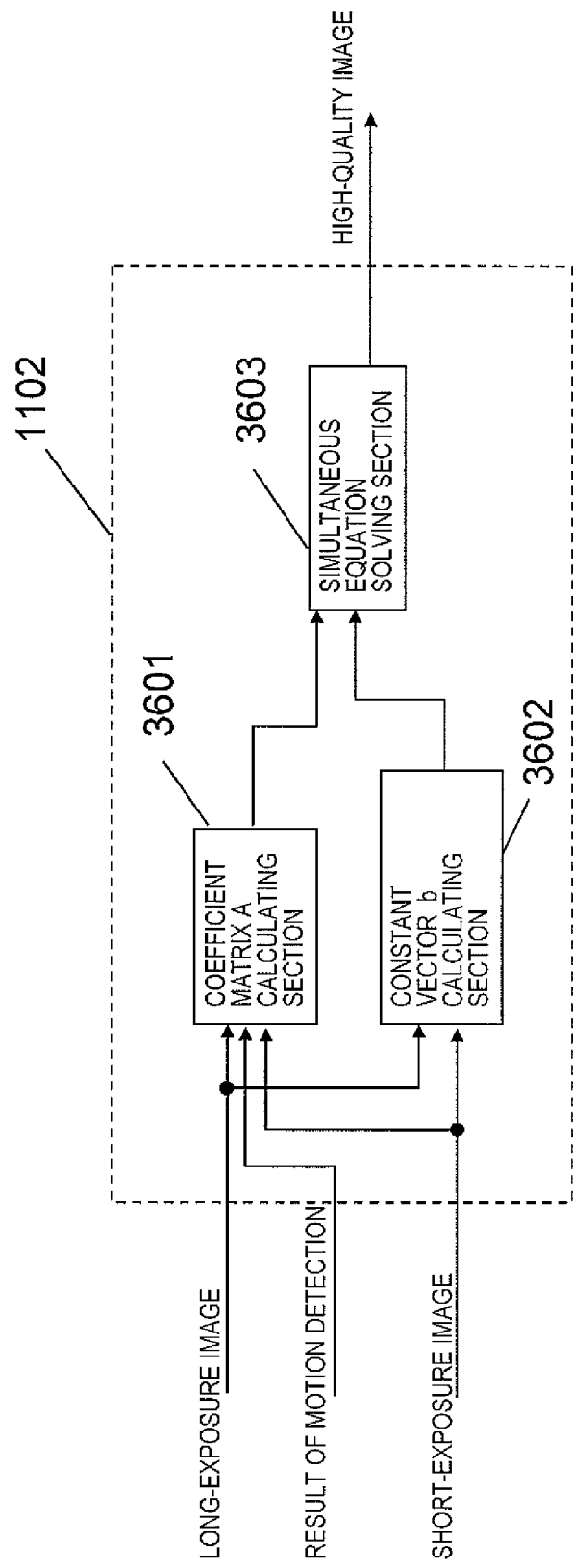
FIG. 36 shows an exemplary internal configuration for an image processing section according to the first embodiment of the present disclosure.

FIG. 36 illustrates an exemplary configuration for the image processing section 1102 that carries out the image quality improvement processing described above. If M of Equation (4) is 2, if Equation (37) is used as Q, if m in those equations is 2, and if one of Equations (14), (15) and (16) is used as differential expansion of first- or second-order differentiation, then the evaluation function J becomes a quadratic function of f. In that case, f that minimizes the evaluation function is calculated by $$\frac{\partial J}{\partial f} = 0 \quad (45)$$

Since Equation (45) is reduced to solving a simultaneous linear equation with respect to f, the simultaneous equation to solve can be represented as:

$$Af=b \quad (46)$$

where A represents the coefficient matrix of the equation and b represents the right side vector. The image processing section 1102 shown in FIG. 36 includes a coefficient matrix A calculating section 3601 and a constant vector b calculating section 3602 which respectively calculate the coefficient matrix A and right side vector b in Equation (46) based on the long exposure image and the short exposure image, and also includes a simultaneous equation solving section 3603 which solves this Equation (46).

Figure 34:
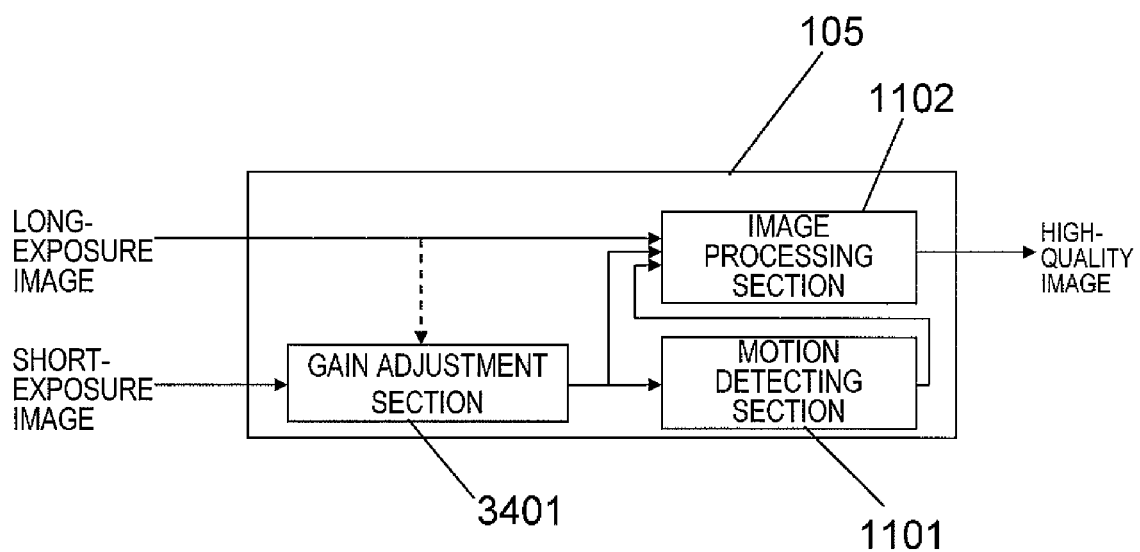
FIG. 34 shows another exemplary configuration for the image quality improvement processing section 105 according to the first embodiment of the present disclosure.

Also, as the long-time and short-time pixels have mutually different exposure times in the image sensor of this embodiment, output signals obtained from those pixels could have different levels. For example, if the exposure time of the long-time pixels is set to be four times as long as that of the short-time pixels as in FIG. 11, the pixel output signals of the long-time pixels could have twice to four times as high a level as those of the short-time pixels. That is why the image quality improvement processing section 105 of this embodiment may include a gain adjustment section 3401 which equalizes the output signal level of the short-time pixels with that of the long-time pixels as shown in FIG. 34. The gain value, by which the output signal of the short-time pixels is multiplied by the gain adjustment section 3401, may be either determined in advance to be 2 or changed dynamically while measuring the pixel signal of each frame. If the gain value is determined while measuring the pixel signal of each frame, then a path to transmit the long exposure image data to the gain adjustment section 3401 may be provided as indicated by the dashed arrow in FIG. 34, the ratios of the respective pixel values of the long- and short-exposure images may be calculated in the gain adjustment section 3401, and the average of the ratios of those pixels may be used as the optimum gain.

Hereinafter, the effects of the present disclosure will be described. First of all, it will be described, by reference to images representing the results of actual processing, how effective the arrangement of the long-time and short-time pixels and image quality improvement processing of this embodiment are.

Figure 26:
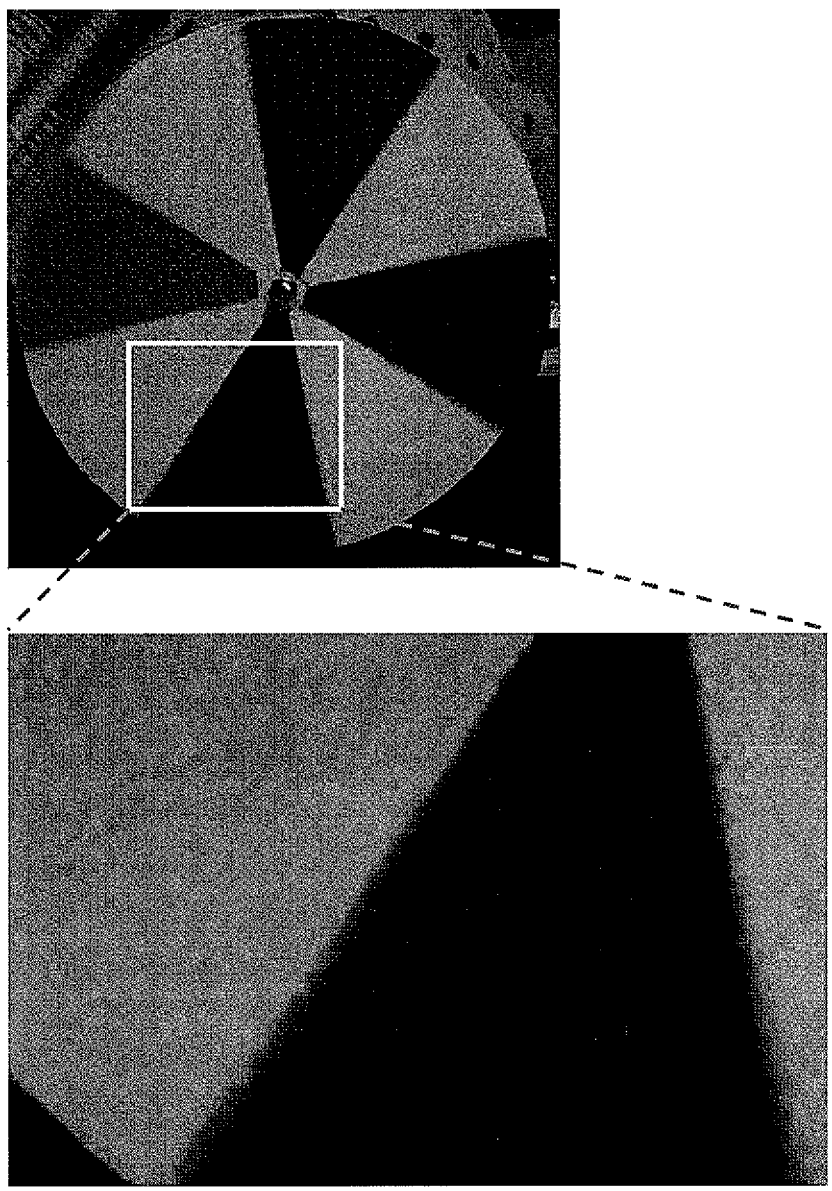
FIG. 26 shows an example of an input image (true image) given to the image capture device according to the present disclosure.
Figure 27:
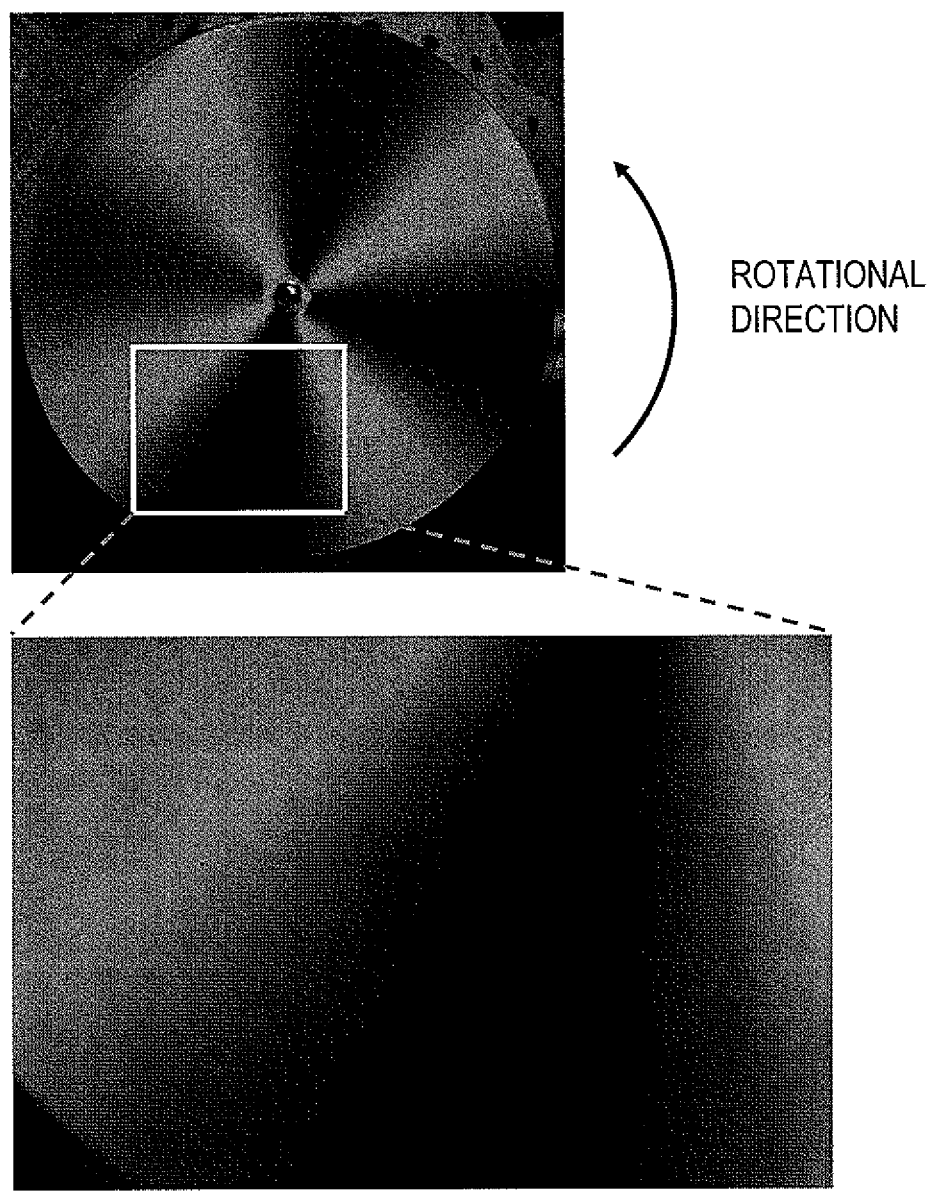
FIG. 27 shows how the input image given to the image capture device according to the present disclosure is captured at long-time pixels.
Figure 28:
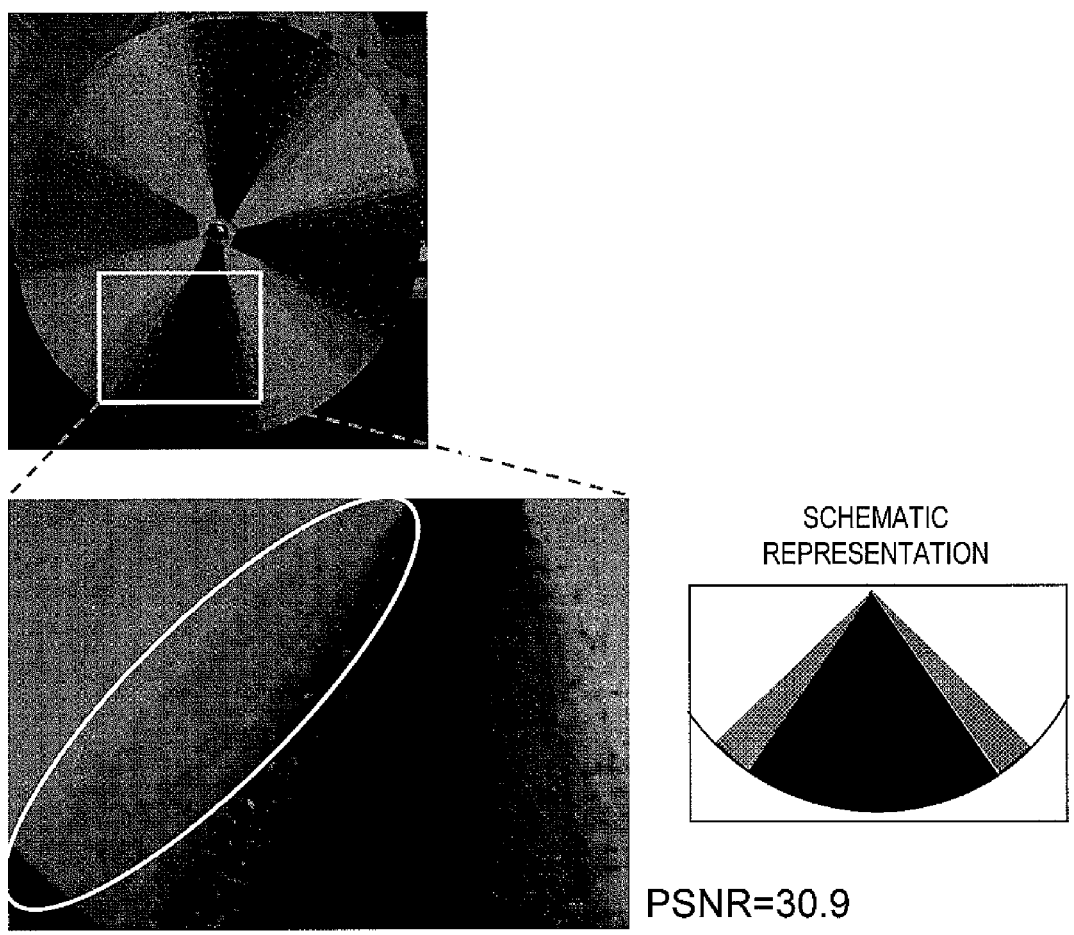
FIG. 28 shows an exemplary result of known image quality improvement processing.

Suppose the subject shown in FIG. 26 is now rotating counterclockwise at high speeds, the exposure process has been performed on the long-time pixels for a period of time corresponding to four frame periods of the short-time pixels, and an image with motion blur has been captured as shown in FIG. 27. FIG. 28 shows a result of image quality improvement processing that was carried out by the known technique disclosed in Patent Documents Nos. 1 and 2 using the image shown in FIG. 27 as a G component input and an image (not shown) with a low resolution but no motion blur as having been subjected to the short exposure process as R and B component inputs. FIG. 28 also shows the value of PSNR which is extensively used as an objective index to the performance of the image quality improvement processing. This is a value corresponding to the difference from the true image (shown in FIG. 26) and is defined by the following Equation (47):

$$PSNR = 10\log_{10} \frac{I_{max}^2}{\frac{1}{N}\sum_{x,y}(I(x,y) - I_{true}(x,y))^2} \quad (47)$$

In Equation (47), I(x, y) represents the pixel value of the image quality improvement processing output image at a location (x, y), $I_{true}$(x, y) represents the pixel value of the true image at the location (x, y), N represents the total number of pixels of the image, and $I_{max}$ represents the maximum value of the pixel values of the image (which may be 255 if each pixel value is described in eight bits). This means that the larger the PSNR value, the more similar to the true image $I_{true}$ I(x, y) gets.

A false contour was generated due to a color shift in a portion of the image encircled with the white ellipse in FIG. 26. In a color image, such a false contour is sensed as color smearing of the color green. That false contour was generated because the subject's motion was so significant as to exceed the motion detection range and prevent the motion detecting section 1101 shown in FIG. 12 from detecting the motion properly and sufficiently removing the motion blur from the G component image that had been captured through the long exposure process.

Figure 29:
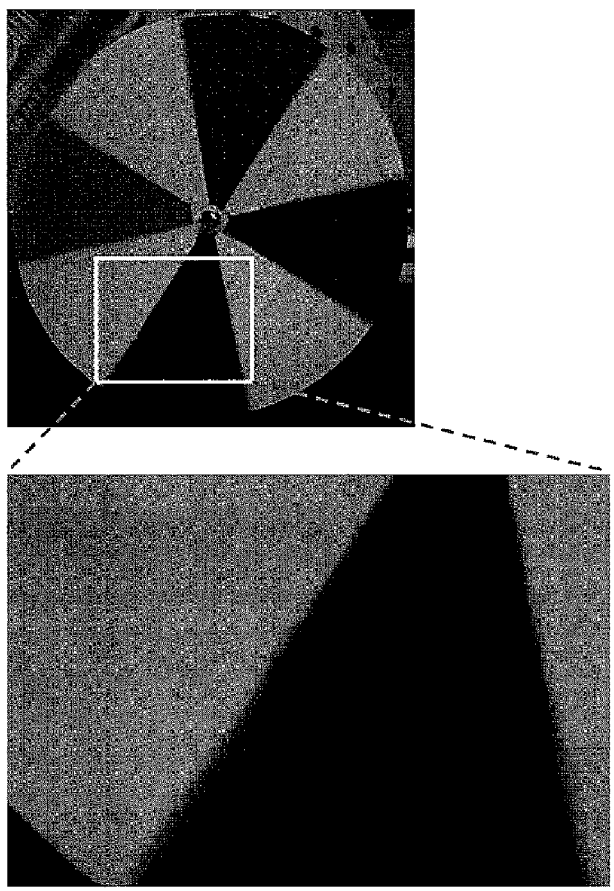
FIG. 29 shows an exemplary result of image quality improvement processing that has been performed by the image capture device according to the present disclosure.

FIG. 29 shows an image that was subjected to the image quality improvement processing by the image capturing method and image quality improvement processing of the present disclosure. As shown in FIG. 29, the image that had been subjected to the image quality improvement processing according to the image capturing method of the present disclosure was free from the color shift that was observed noticeably in the image shown in FIG. 28 and even closer to the true image. In addition, the PSNR shown in FIG. 29 is also larger than the one shown in FIG. 28.

Also, in the image sensor of the present disclosure, it is recommended that the long-time and short-time pixels be arranged symmetrically, i.e., arranged alternately and repetitively both horizontally and vertically on the image capturing plane. FIG. 41 illustrates an example of a symmetrical arrangement and an example of an unsymmetrical arrangement. Each of Blocks 1 and Blocks 2 shown in FIG. 41 is supposed to be a pixel set consisting of long-time and short-time pixels of the respective color component pixels of R, Gr, Gb and B as shown in FIG. 41(c). That is to say, each block is a group of pixels in which some or all of the eight different kinds of pixels (consisting of $R_L$, $Gr_L$, $Gb_L$, $B_L$, $R_S$, $Gr_S$, $Gb_S$, and $B_S$) are arranged in a certain order. Examples of such blocks are shown in FIG. 41(c). For example, Block 1 may be a group of pixels in which $R_L$, $Gr_L$, $Gb_S$ and $B_S$ pixels are arranged as shown in FIG. 41(c) and Block 2 may be a group of pixels in which $R_S$, $Gr_S$, $Gb_L$ and $B_L$ pixels are arranged as shown in FIG. 41(c). A symmetrical pixel arrangement refers to an arrangement in which Blocks 1 and 2 are alternately arranged both horizontally and vertically as shown in FIG. 41(a). On the other hand, an unsymmetrical arrangement refers to an arrangement in which Blocks 1 are arranged only on the left-hand side of the image capturing plane and Blocks 2 are arranged only on the right-hand side of the image capturing plane as shown in FIG. 41(b).

Figure 30:
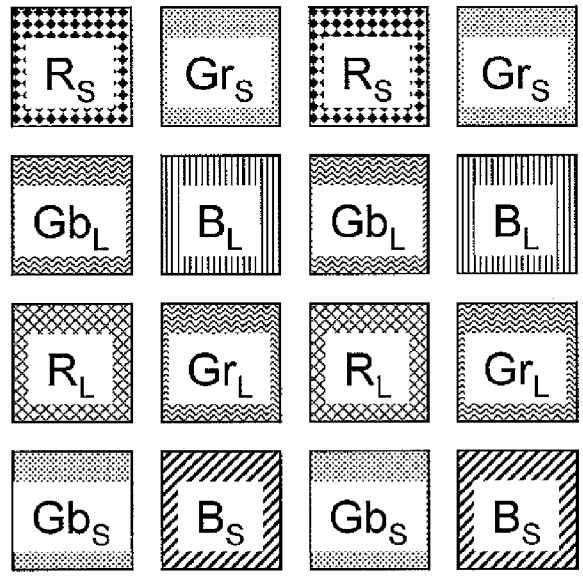
FIG. 30 illustrates another exemplary pixel arrangement in which long- and short-time pixels with respective color components are included in the same mix on an image capturing plane.
Figure 31:
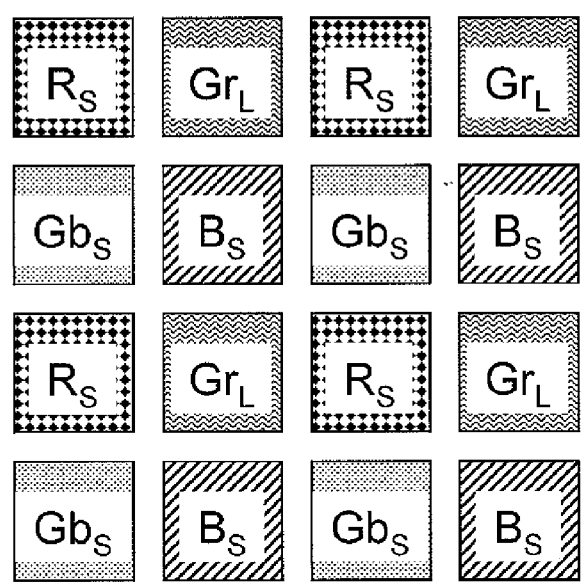
FIG. 31 illustrates still another exemplary pixel arrangement in which long- and short-time pixels with respective color components are included in the same mix on the image capturing plane.

To prove the effectiveness of the present disclosure, an image that has been subjected to the image quality improvement processing in a situation where those pixels are not arranged symmetrically will be shown and compared to the output image according to the present disclosure. In this example, images that have been subjected to the image quality improvement processing in a situation where the long-time and short-time pixels are arranged as shown in FIGS. 30 and 31, respectively, will be used as the images to compare. Specifically, FIG. 30 illustrates an arrangement in which the exposure time is set to be long or short on a horizontal pixel line basis on the image capturing plane and in which the symmetry of the arrangement of the long-time and short-time pixels has been destroyed. On the other hand, FIG. 31 illustrates an arrangement in which the R and B pixels of a Bayer arrangement are set to be short-exposure pixels and in which one of Gr and Gb pixels (e.g., the Gr pixels in this example) are set to be long-exposure pixels and the other kind of pixels are set to be short-exposure pixels.

In that case, although the symmetry of the arrangement of the long-time and short-time pixels has not been destroyed significantly, there are fewer long-time pixels. In a situation where image quality improvement processing is carried out on the output of the image sensors with any of these configurations, the only difference from the image quality improvement method and processing content of this embodiment is the shapes of the matrices $H_1$ and $H_2$ represented by Equations (6) and (8). The other calculations can be made in quite the same way as in the method of this embodiment. If an image in which pixels are arranged as a matrix of four horizontal pixels (i.e., x=0, 1, 2, 3) by two vertical pixels (i.e., y=0, 1) in two frames (i.e., t=0, 1) is represented in the same way as Equation (6), then the matrices $H_1$ and $H_2$ with respect to the configuration shown in FIG. 30 are given in the form specified by the following Equations (48) and the matrices $H_1$ and $H_2$ with respect to the configuration shown in FIG. 31 are given in the form specified by the following Equations (49):

$$H_1 = \begin{pmatrix} 1 & 0 & 0 & 0 & 0 & 0 & 0 & 1 & 0 & 0 & 0 & 0 & 0 & 0 \\ 0 & 1 & 0 & 0 & 0 & 0 & 0 & 0 & 1 & 0 & 0 & 0 & 0 & 0 \\ 0 & 0 & 1 & 0 & 0 & 0 & 0 & 0 & 0 & 1 & 0 & 0 & 0 & 0 \\ 0 & 0 & 0 & 1 & 0 & 0 & 0 & 0 & 0 & 0 & 1 & 0 & 0 & 0 \end{pmatrix} \quad (48)$$

-continued $$H_2 = \begin{pmatrix} 0 & 0 & 0 & 0 & 1 & 0 & 0 & 0 & 0 & 0 & 0 & 0 & 0 & 0 & 0 & 0 \\ 0 & 0 & 0 & 0 & 0 & 1 & 0 & 0 & 0 & 0 & 0 & 0 & 0 & 0 & 0 & 0 \\ 0 & 0 & 0 & 0 & 0 & 0 & 1 & 0 & 0 & 0 & 0 & 0 & 0 & 0 & 0 & 0 \\ 0 & 0 & 0 & 0 & 0 & 0 & 0 & 1 & 0 & 0 & 0 & 0 & 0 & 0 & 0 & 0 \\ 0 & 0 & 0 & 0 & 0 & 0 & 0 & 0 & 0 & 0 & 0 & 0 & 1 & 0 & 0 & 0 \\ 0 & 0 & 0 & 0 & 0 & 0 & 0 & 0 & 0 & 0 & 0 & 0 & 0 & 1 & 0 & 0 \\ 0 & 0 & 0 & 0 & 0 & 0 & 0 & 0 & 0 & 0 & 0 & 0 & 0 & 0 & 1 & 0 \\ 0 & 0 & 0 & 0 & 0 & 0 & 0 & 0 & 0 & 0 & 0 & 0 & 0 & 0 & 0 & 1 \end{pmatrix}$$

In Equations (48), the pixels on the upper row (i.e., y=0) in FIG. 14 are described as long-time pixels, while the pixels on the lower row (i.e., y=1) in FIG. 14 are described as short-time pixels.

$$H_1 = \begin{pmatrix} 0 & 1 & 0 & 0 & 0 & 0 & 0 & 0 & 1 & 0 & 0 & 0 & 0 & 0 & 0 \\ 0 & 0 & 0 & 1 & 0 & 0 & 0 & 0 & 0 & 0 & 1 & 0 & 0 & 0 & 0 \end{pmatrix} \quad (49)$$

$$H_2 = \begin{pmatrix} 1 & 0 & 0 & 0 & 0 & 0 & 0 & 0 & 0 & 0 & 0 & 0 & 0 & 0 & 0 \\ 0 & 0 & 1 & 0 & 0 & 0 & 0 & 0 & 0 & 0 & 0 & 0 & 0 & 0 & 0 \\ 0 & 0 & 0 & 0 & 1 & 0 & 0 & 0 & 0 & 0 & 0 & 0 & 0 & 0 & 0 \\ 0 & 0 & 0 & 0 & 0 & 1 & 0 & 0 & 0 & 0 & 0 & 0 & 0 & 0 & 0 \\ 0 & 0 & 0 & 0 & 0 & 0 & 1 & 0 & 0 & 0 & 0 & 0 & 0 & 0 & 0 \\ 0 & 0 & 0 & 0 & 0 & 0 & 0 & 1 & 0 & 0 & 0 & 0 & 0 & 0 & 0 \\ 0 & 0 & 0 & 0 & 0 & 0 & 0 & 0 & 1 & 0 & 0 & 0 & 0 & 0 & 0 \\ 0 & 0 & 0 & 0 & 0 & 0 & 0 & 0 & 0 & 0 & 1 & 0 & 0 & 0 & 0 \\ 0 & 0 & 0 & 0 & 0 & 0 & 0 & 0 & 0 & 0 & 0 & 1 & 0 & 0 & 0 \\ 0 & 0 & 0 & 0 & 0 & 0 & 0 & 0 & 0 & 0 & 0 & 0 & 1 & 0 & 0 \\ 0 & 0 & 0 & 0 & 0 & 0 & 0 & 0 & 0 & 0 & 0 & 0 & 0 & 1 & 0 \\ 0 & 0 & 0 & 0 & 0 & 0 & 0 & 0 & 0 & 0 & 0 & 0 & 0 & 0 & 1 \end{pmatrix}$$

According to the arrangement of long-time and short-time pixels shown in FIG. 31, there are fewer long-time pixels than in the other arrangements. That is why if the exposure time of the long-time pixels is set to be as long as in the other arrangements, then the overall quantity of light that the image sensor can obtain becomes less than in other arrangements. That is why in order to obtain as large a quantity of incident light as in the other arrangements, the exposure time of the long-time pixels is doubled according to this arrangement compared to the other arrangements, i.e., eight times as long as that of the short-time pixels.

FIG. 32 shows what image was output as a result of the image quality improvement processing in a situation where the long-time and short-time pixels were arranged as shown in FIG. 30. As shown in the white frame in FIG. 32, a comb-shaped artifact was generated horizontally on the screen in an edge portion of the rotating subject. In addition, the PSNR value shown in FIG. 32 is also smaller than the one shown in FIG. 29. The reason is that the blur of the image that was captured on the lines of long-exposure pixels could not be removed completely. In the pixel arrangement shown in FIG. 30, each horizontal line is formed of either long-time pixels or short-time pixels. That is why each of those long-time pixels obtains motion information from only vertically adjacent short-time pixels and cannot obtain any motion information horizontally. As can be seen, if the symmetry of arrangement of the long-time and short-time pixels has been destroyed, a noticeable artifact would be generated and the symmetry of the pixel arrangement has significant influence on the performance of the image quality improvement processing section 105. On the other hand, by adopting the configuration of the image sensor of the present disclosure shown in FIG. 29, generation of such an artifact can be minimized thanks to the symmetry of the horizontal pixel arrangement.

Figure 33:
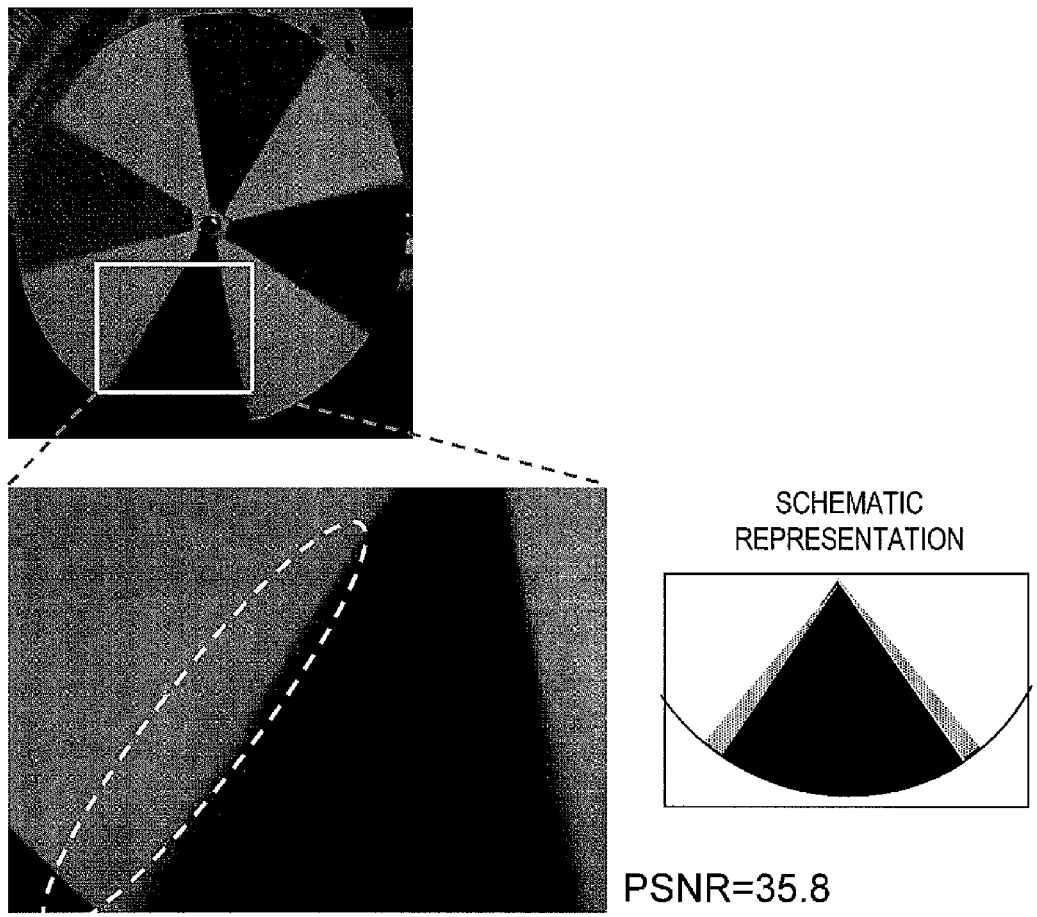
FIG. 33 shows an exemplary result of image quality improvement processing that has been performed by the image capture device with the configuration shown in FIG. 31.

FIG. 33 shows what image was output as a result of the image quality improvement processing in a situation where the long-time and short-time pixels were arranged as shown in FIG. 31. In this case, the output image did not have any noticeable artifact unlike the output image obtained by the known technique shown in FIG. 28 and its image quality did not deteriorate as significantly as in FIG. 28. However, a false contour was still generated due to a color shift in a portion of the image indicated by the white ellipse in FIG. 33 and was much more noticeable than in a color image. The PSNR value was also smaller than that of the output image obtained with the configuration of the present disclosure shown in FIG. 29.

This difference was made because the number of long-time pixels on the image capturing plane is smaller in the arrangement shown in FIG. 31 than in the image sensor of the present disclosure and particularly because the second and fourth horizontal pixel lines as counted from the top of FIG. 31 consist of only short-time pixels. Since there are no long-time pixels in any of those horizontal pixel lines, no long-time pixel signal with a high SNR can be caught during the image quality improvement processing, and therefore, the SNR of the overall image that has been subjected to the image quality improvement processing will drop. Even though the overall quantity of light used can be increased by extending the exposure time of the long-time pixels, the SNR of the image processed can be hardly increased for the reason just described. In addition, the longer the exposure time of the long-time pixels, the more difficult it is to improve the performance during the subsequent image quality improvement processing. As a result, the quality of the image processed deteriorates as a whole. In contrast, since long-time pixels are included in every horizontal pixel line in the image sensor of this embodiment, a sufficient quantity of light can be secured even without extending the exposure time of the long-time pixels too much and the image quality improvement processing can be carried out easily.

Figure 16A:
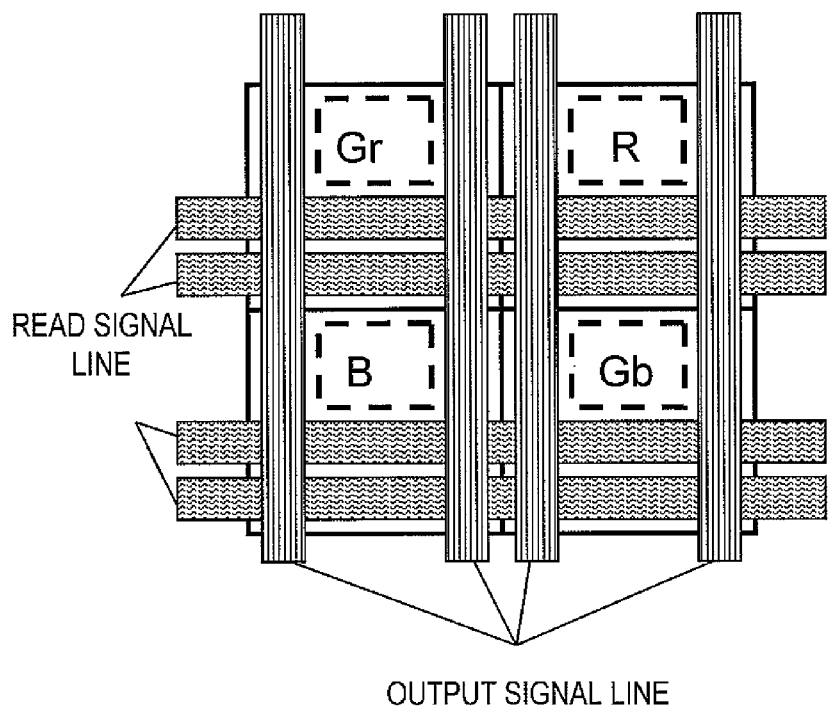
FIG. 16A illustrates the areas occupied by lines in a known arrangement.
Figure 16B:
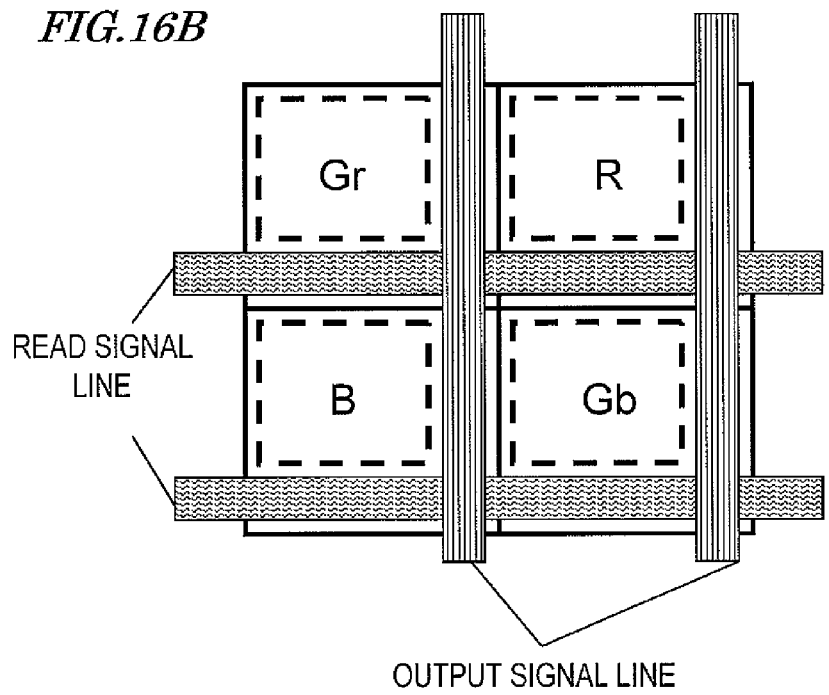
FIG. 16B illustrates the areas occupied by lines in the first embodiment of the present disclosure.

Next, another effect to be achieved by this embodiment will be described with reference to FIGS. 16A and 16B.

In the image sensor of this embodiment, not only the long-time or short-time pixels are arranged symmetrically as shown in FIG. 4 but also the number of read signal lines and the number of output signal lines to provide are smaller than in the known arrangement disclosed in the article "A 2.2/3-inch 4K2K CMOS Image Sensor Based on Dual Resolution and Exposure Technique", Proceedings in IEEE International Solid-State Circuit Conference 2010, pp. 408-410, 2010. FIG. 16A illustrates the known arrangement, while FIG. 16B illustrates the arrangement of this embodiment. In FIGS. 16A and 16B, the bold dashed lines indicate the apertures of pixels. By adopting the arrangement of this embodiment, each aperture can have a larger area than in the known arrangement. For example, if the apertures have a size of 2.5 µm×2.5 µm, the read signal lines have a width of 0.23 µm, and the output signal lines have a width of 0.26 µm in the known arrangement, the aperture area of each pixel can be increased by approximately 21% by adopting the arrangement shown in FIG. 16B.

Figure 39:
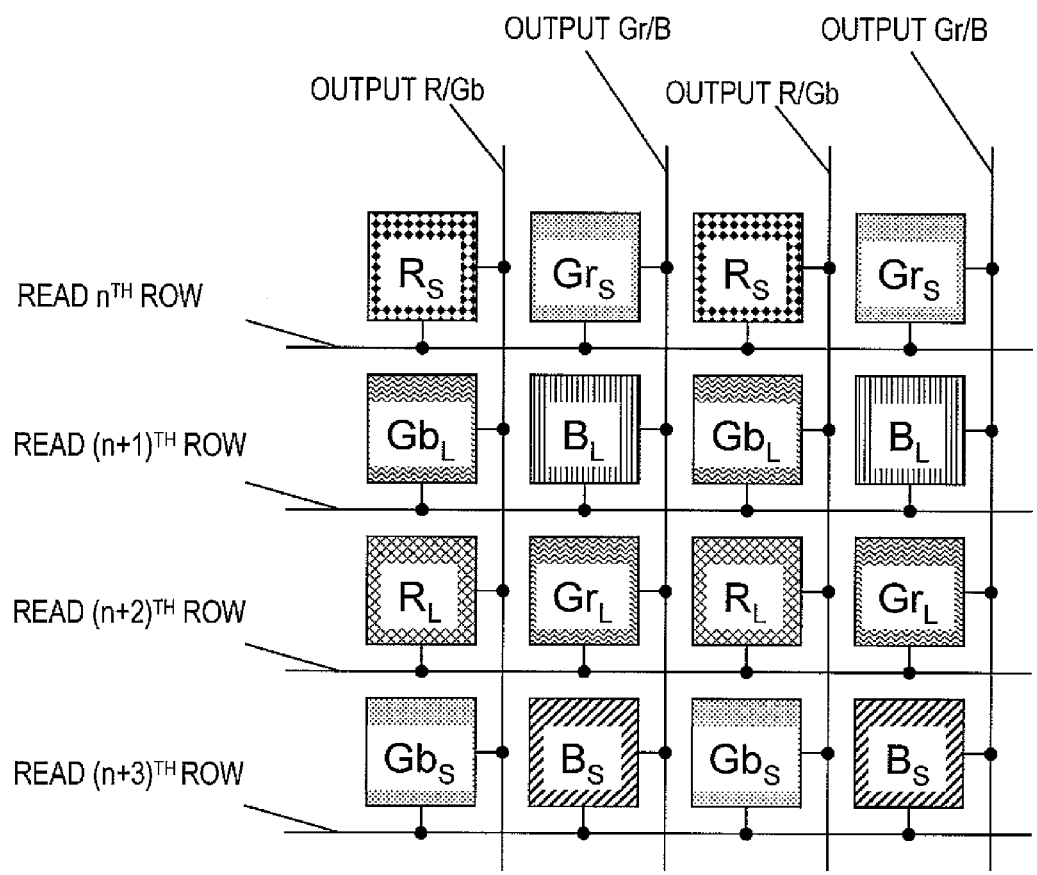
FIG. 39 illustrates an exemplary pixel arrangement according to a comparative example.

It should be noted that the image sensor of this embodiment realizes not only a broad pixel aperture area but also an output image of quality at the same time. As shown in FIG. 4, in the image sensor of this embodiment, the read signal lines 401 and 402 and the output signal lines 403 through 406 are shared by adjacent pixels, thereby cutting down the number of read signal lines and the number of output signal lines on each pixel to one each. As for the pixel arrangements shown in FIGS. 30 and 31 that have been used and compared to the image sensor of this embodiment in the foregoing description, those lines can be arranged as described above for the arrangement shown in FIG. 30 but cannot for the arrangement shown in FIG. 31 (see FIGS. 39 and 40).

Figure 40:
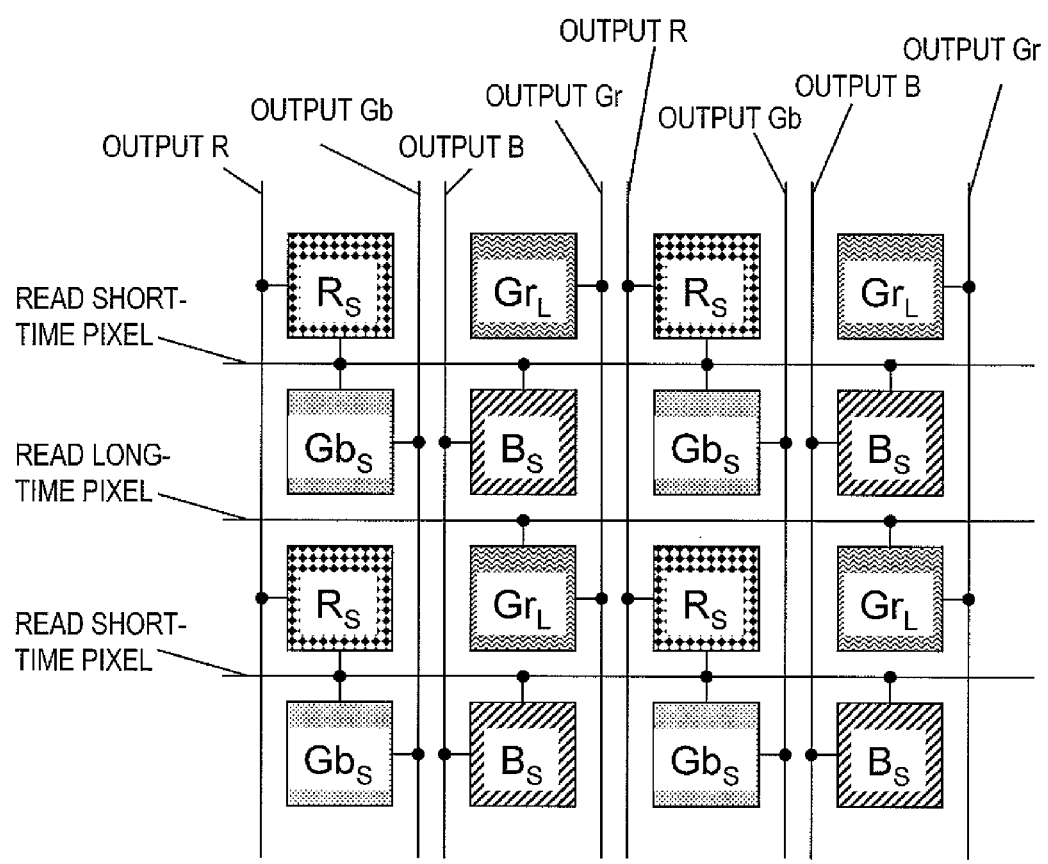
FIG. 40 illustrates an exemplary pixel arrangement according to another comparative example.

In the arrangement shown in FIG. 31, the short-time pixels are arranged vertically in a row. That is why if those pixels shared an output signal line, then the respective outputs of those pixels would mix with each other on the output signal line, and therefore, at least two output signal lines or read signal lines should be provided. In FIG. 40, two output signal lines are provided for each pixel. Consequently, the pixel arrangement shown in FIG. 31 is comparable to the image sensor of this embodiment in terms of the output image quality but is inferior to the image sensor of this embodiment in terms of the aperture area of each pixel. Stated otherwise, the image sensor of this embodiment realizes not only a broad pixel aperture area but also an output image with few artifacts at the same time, and therefore, is superior to the other arrangements including the one shown in FIG. 31.

Figure 17A:
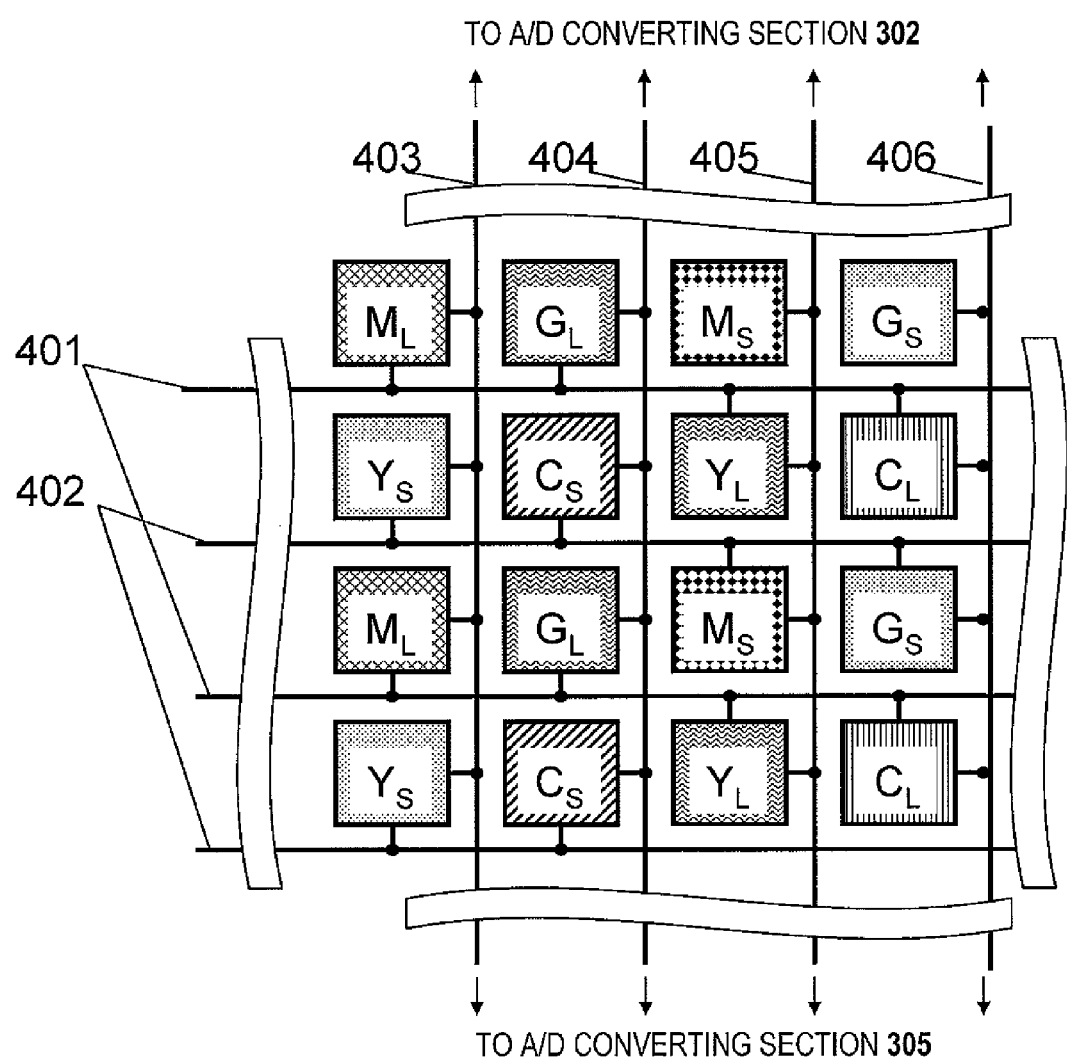
FIG. 17A illustrates another exemplary pixel arrangement that may be adopted according to the present disclosure.
Figure 17B:
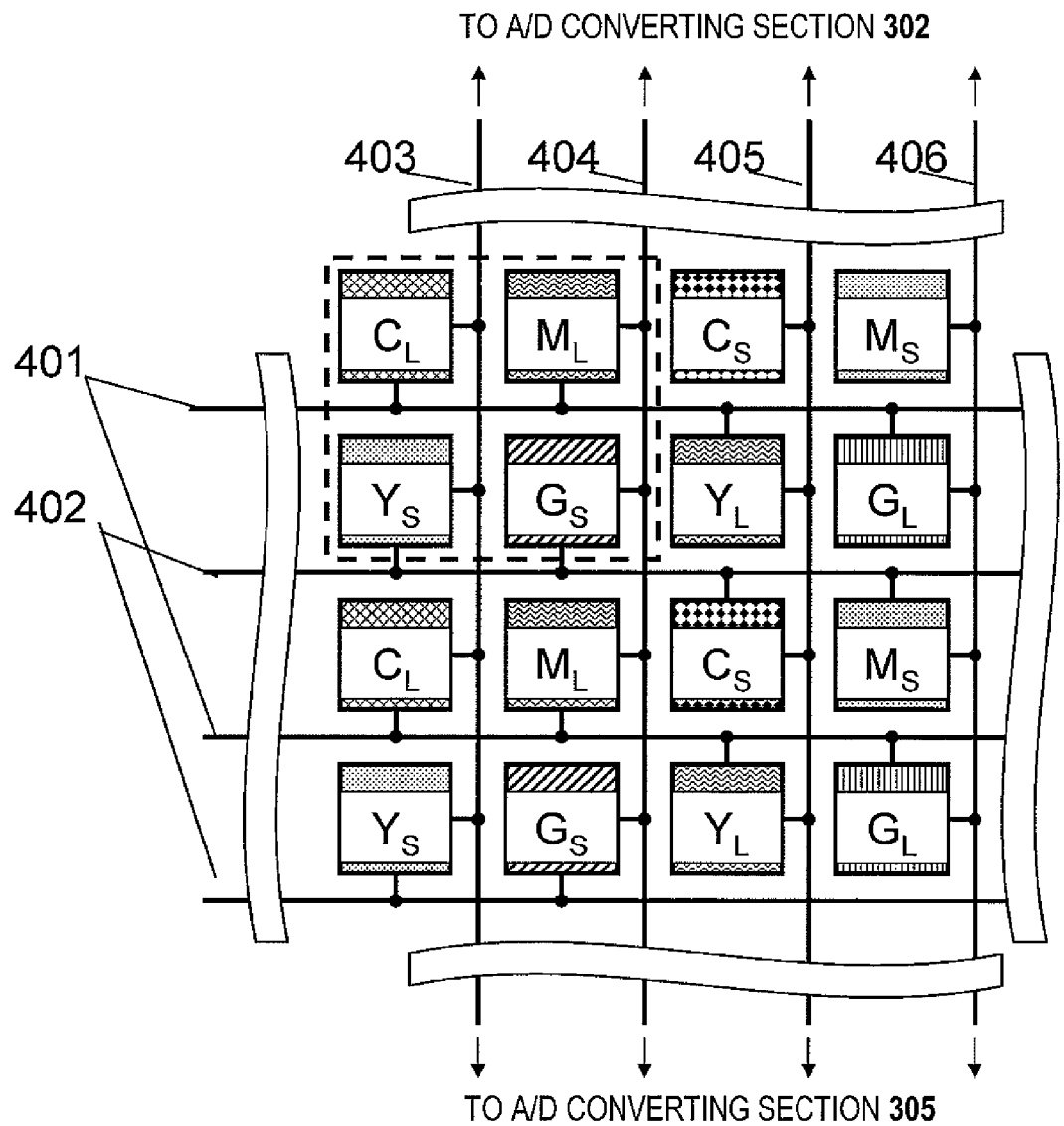
FIG. 17B illustrates still another exemplary pixel arrangement that may be adopted according to the present disclosure.

FIG. 17A illustrates another pixel arrangement (made up of complementary colors) according to this embodiment. In this pixel arrangement, an image can be captured with respect to the color components of cyan (C), magenta (M), yellow (Y) and G. In this case, M, C, G and Y pixels may be arranged where the R, B, Gr and Gb pixels are arranged in FIG. 4. Also, in FIG. 17A, the respective subscripts S and L have the same meanings as what is used in FIG. 4. By adopting such an arrangement, signals representing images that have been captured through long and short exposure processes can be obtained for each of the C, M, Y and G pixels, and those pixels can also be arranged symmetrically. FIG. 17B illustrates still another pixel arrangement (also made up of complementary colors) according to this embodiment.

In the embodiment described above, the pixel array 301 is supposed to have a pixel arrangement in which R and G pixels are alternately arranged horizontally to form one row and in which B and G pixel are alternately arranged horizontally to form another row. However, the image sensor of this embodiment does not always have to have such a pixel arrangement.

By adopting the configuration of this embodiment, in an image capture device including a single-panel color image sensor which captures an image by reading pixel output signals from a single image sensor at two different frame rates and outputting in parallel the output signals of multiple pixels that cover multiple rows or columns, the image quality of the image that has been subjected to the image quality improvement processing can be improved by symmetrically arranging the respective color component pixels and the pixels to capture images through long and short exposure processes. Furthermore, even if the pixels have a very small size, a sufficiently large aperture area can still be secured for each pixel and the sensitivity of shooting can be increased as well.

Embodiment 2

Hereinafter, a second embodiment of an image sensor according to the present disclosure will be described with reference to FIG. 18. In this embodiment, the pixel output signals supplied from the pixel array 301 are sorted out differently from in the first embodiment described above.

Figure 18:
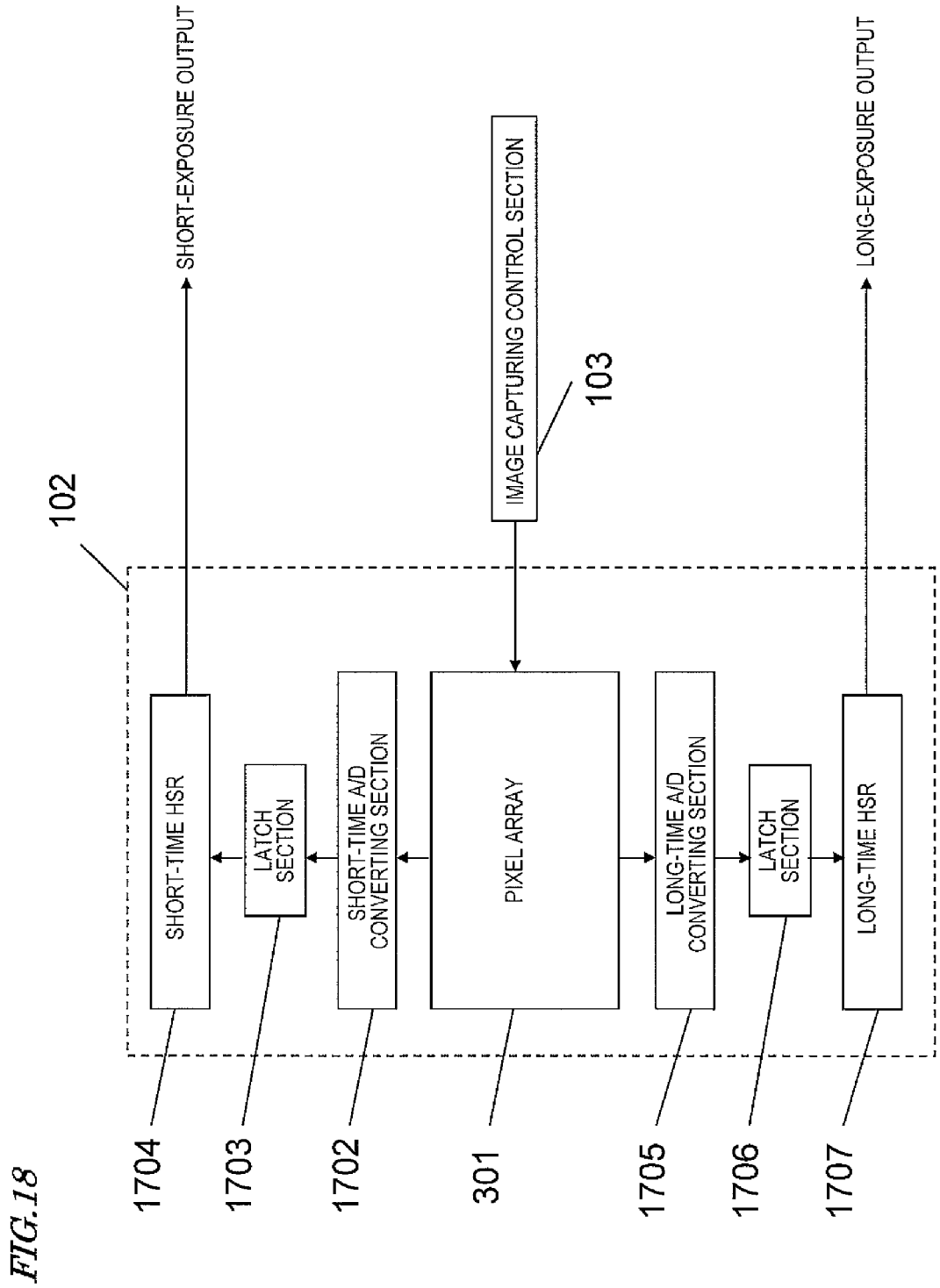
FIG. 18 illustrates an exemplary configuration for an image sensor according to a second embodiment of the present disclosure.

FIG. 18 illustrates a configuration for an image sensor 102 as a second embodiment of the present disclosure. The image sensor 102 includes the pixel array 301, a short-time A/D converting section 1702, a short-time HSR 1704, a long-time A/D converting section 1705, a long-time HSR 1707, and the latch sections 1703 and 1706. The short- and long-time A/D converting sections 1702 and 1705 perform analog-to-digital conversion on the pixel output signals of the short- and long-time pixels, respectively. The short- and long-time HSRs 1704 and 1707 pass the respective outputs of the A/D converting sections to a device outside of the image sensor 102. That is to say, in this embodiment, the methods of outputting the signals from the pixel array 301 are changed according to the length of the exposure time of the pixels.

In this embodiment, the pixel output signals from the pixel array 301 are sorted into those of the short-time pixels and those of the long-time pixels. Actually, there are four different kinds of pixels (R, B, Gr, Gb) for each of the two groups of pixels that capture an image in two different exposure times. Even though each of the short-time A/D converting section 1702, short-time HSR 1704, long-time A/D converting section 1705, and long-time HSR 1707 is illustrated as a single block in FIG. 18, each of these A/D converting sections and $HSR_S$ actually has four internal mechanisms for R, B, Gr and Gb pixels. Thus, each of these names of the short-time A/D converting section 1702, short-time HSR 1704, long-time A/D converting section 1705, and long-time HSR 1707 is used herein to collectively refer to those A/D converting and horizontal transfer mechanisms for those four kinds of pixels.

Next, the procedure of outputting the pixel output signals according to this embodiment will be described. As in the first embodiment, the read signal of a short-time pixel will be identified herein by TRANS and the read signal of a long-time pixel will be identified herein by TRANL in this embodiment, too.

Next, it will be described with reference to FIGS. 19 and 20 how the pixel array 301 of this embodiment operates in a frame in which the read signals TRANS and TRANL both rise to the H level. In the following example, the solid-state image sensor with the configuration shown in FIG. 18 is supposed to be taken as an example.

Figure 19:
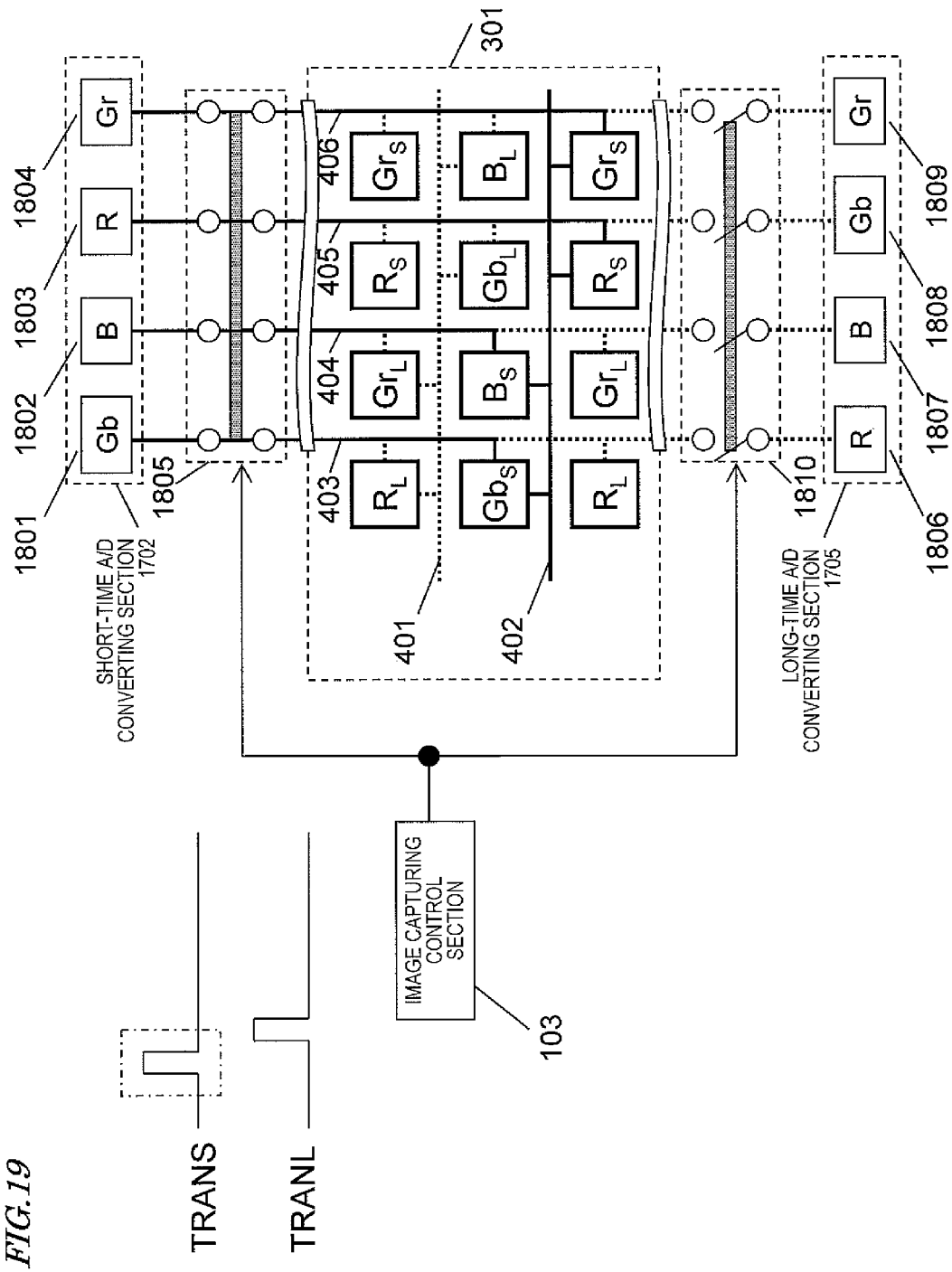
FIG. 19 illustrates conceptually how the pixel array according to the second embodiment of the present disclosure operates at a point in time when a short-time pixel read signal is asserted.

FIG. 19 illustrates how the image capturing control section 103 and the pixel array 301 operate when TRANS rises to the H level. Specifically, when TRANS rises to the H level, the signal transmitted through the second read signal line 402 indicated by the solid line in FIG. 19 also rises to the H level. At this point in time, the pixel output signals of $Gb_S$, $B_S$, $R_S$ and $Gr_S$ pixels are transmitted through the output signal lines 403, 404, 405 and 406, respectively. At this point in time, the image capturing control section 103 turns ON a switch 1805 that connects all of four output signal lines 403 through 406 to the short-time A/D converting section 1702 at a time, which is a difference from the first embodiment. As a result, the pixel output signals of the $Gb_S$, $B_S$, $R_S$ and $Gr_S$ pixels are respectively transmitted to the Gb pixel A/D converting section 1801, the B pixel A/D converting section 1802, the R pixel A/D converting section 1803 and the Gr pixel A/D converting section 1804 in the short-time A/D converting section 1702.

Thereafter, when the read operation in response to the previous TRANS signal gets done on every target short-time B pixel (e.g., in 6 μs in the example shown in FIG. 8), TRANL rises to the H level, so does the signal transmitted through the read signal line 401. FIG. 20 illustrates how the pixel array 301 operates in such a situation.

Specifically, at this point in time, the pixel output signals of $R_L$, $Gr_L$, $Gb_L$ and $B_L$ pixels are transmitted through the output signal lines 403, 404, 405 and 406, respectively. At this point in time, the image capturing control section 103 turns ON a switch 1810 that connects all of the four output signal lines 403 through 406 to the long-time A/D converting section 1705 at a time. As a result, the pixel output signals of the $R_L$, $Gr_L$, $Gb_L$ and $B_L$ pixels are respectively transmitted to the R pixel A/D converting section 1806, the Gr pixel A/D converting section 1807, the Gb pixel A/D converting section 1808 and the B pixel A/D converting section 1809 in the long-time A/D converting section 1705.

Figure 20:
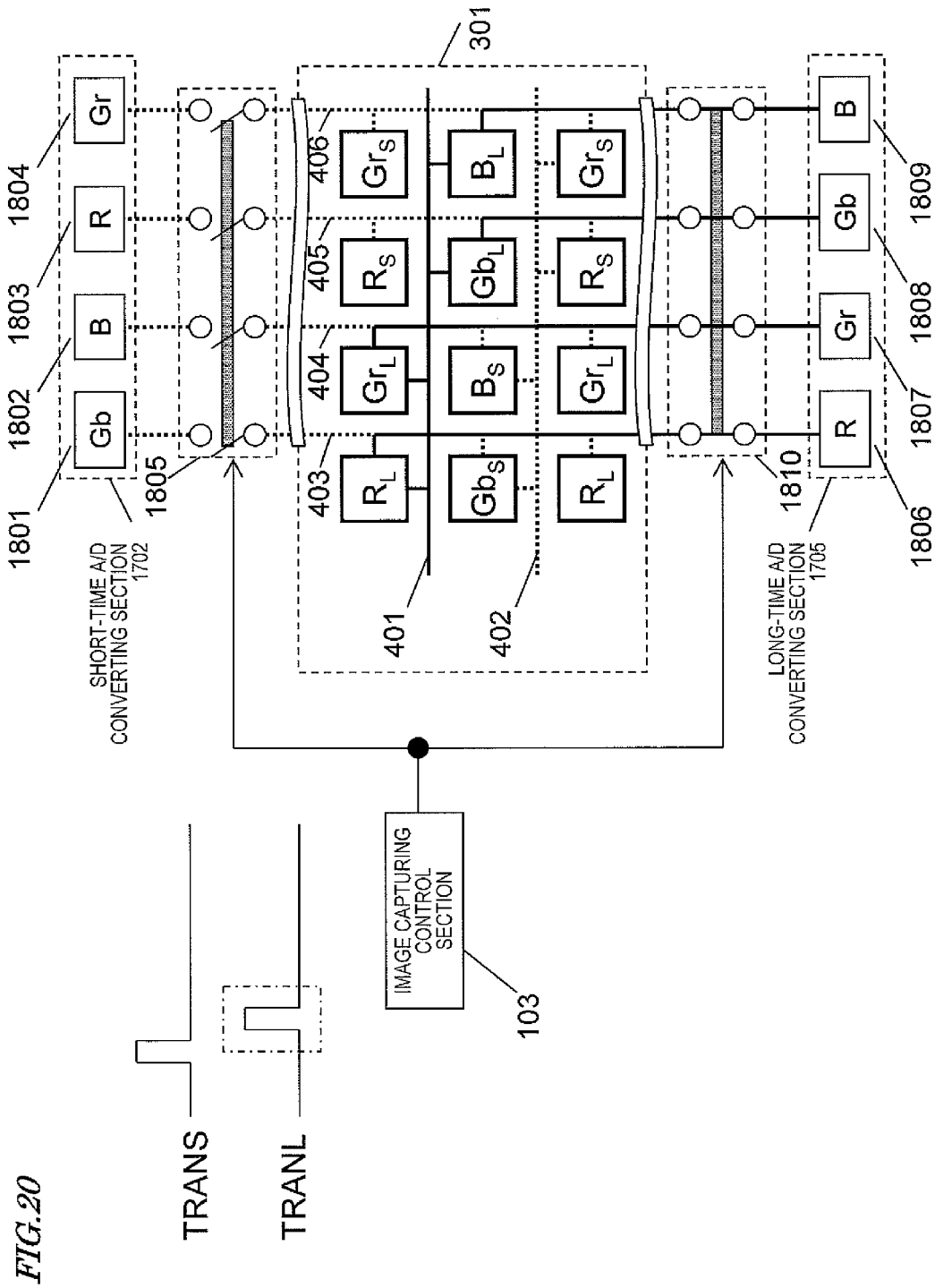
FIG. 20 illustrates conceptually how the pixel array according to the second embodiment of the present disclosure operates at a point in time when a long-time pixel read signal is asserted.

In FIGS. 19 and 20, the short-time and long-time A/D converting sections 1702 and 1705 are supposed to have an internal configuration in which an R pixel A/D converting section 1803 or 1806, a Gr pixel A/D converting section 1804 or 1807, a Gb pixel A/D converting section 1801 or 1808 and a B pixel A/D converting section 1802 or 1809 are horizontally arranged in line. However, in a real world image sensor, these A/D converting sections may be arranged arbitrarily. For example, the image sensor may also have a configuration in which these four different kinds of A/D converting sections are arranged vertically.

Also, even though the switches 1805 and 1810 shown in FIGS. 19 and 20 are supposed to control connections and disconnections of the four output signal lines 403 through 406 at a time, a switch may be provided for each of those output signal lines and an ON/OFF state control signal may be supplied to each of those switches.

Figure 21:
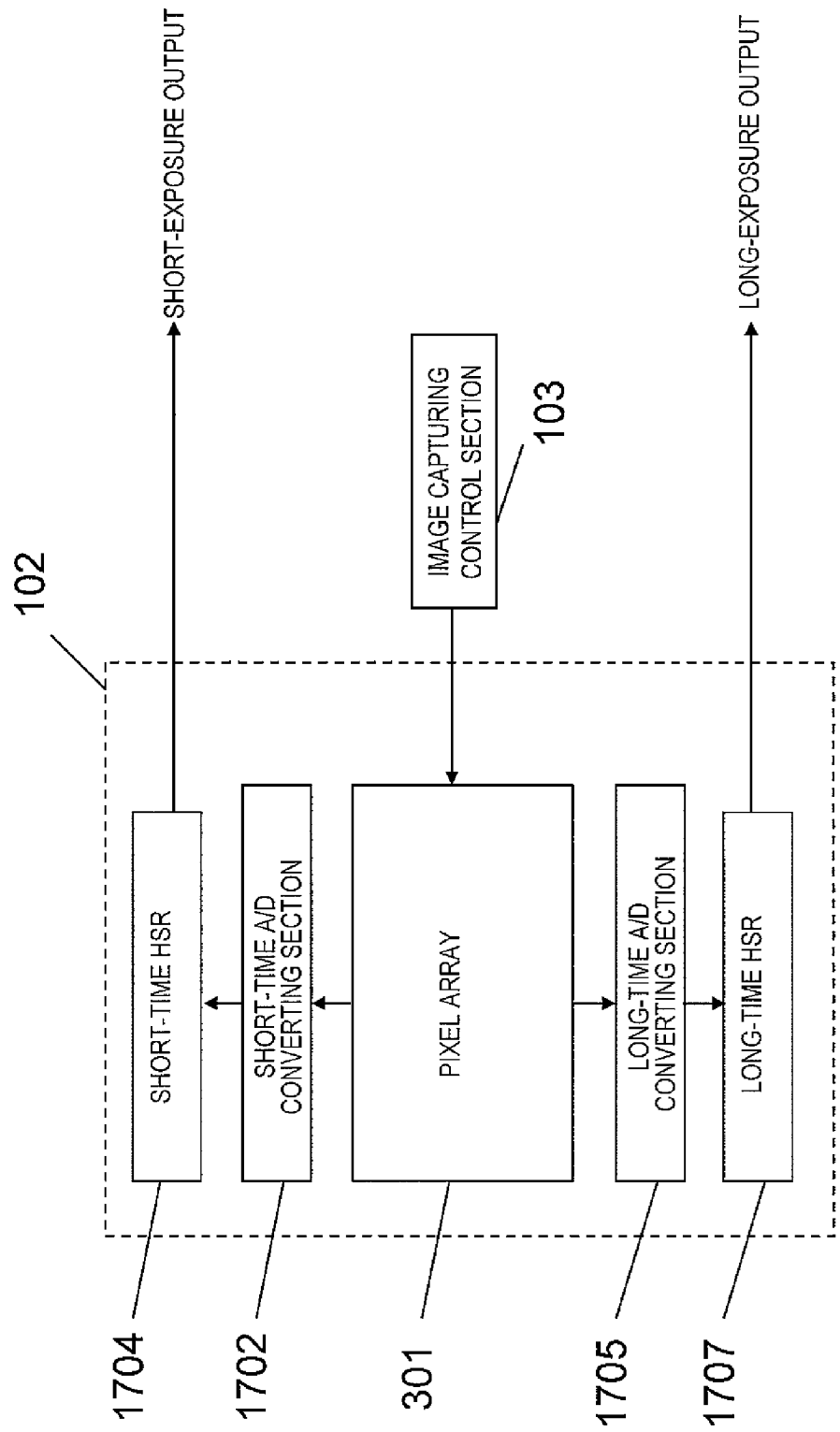
FIG. 21 illustrates another exemplary configuration for an image sensor according to the second embodiment of the present disclosure.

Furthermore, the image sensor 102 of this embodiment does not have to include the latch sections 1703 and 1706 shown in FIG. 18. Optionally, the image sensor 102 may also have a latch-free configuration as shown in FIG. 21. The reason is that the image sensor of this embodiment has separate short-time pixel output terminals and long-time pixel output terminals. Thus, even if the latch sections 1703 and 1706 are omitted, a signal processing section arranged after the image sensor (such as the image quality improvement processing section 105 shown in FIG. 2C) may receive the short- and long-time pixel outputs separately from each other and may reconstruct those pixel signal into a single image.

By adopting the configuration of this embodiment, the pixel output signals of respective pixels can be read faster than when the configuration of the first embodiment is adopted. Since the short-time pixel A/D converting section 1702 and the long-time pixel A/D converting section 1705 are arranged separately according to this embodiment, the time lag between the point in time when the read signal TRANS rises to the H level and a point in time when the read signal TRANL rises to the L level as shown in FIGS. 19 and 20 does not have to include the time for getting A/D conversion done. That is why the time lag can be shortened compared to when the configuration of the first embodiment is adopted and reading can be speeded up.

Embodiment 3

In an image sensor as a third embodiment of the present disclosure, the long- and short-time pixels are arranged differently from in the image sensor of the first and second embodiments described above.

Figure 22:
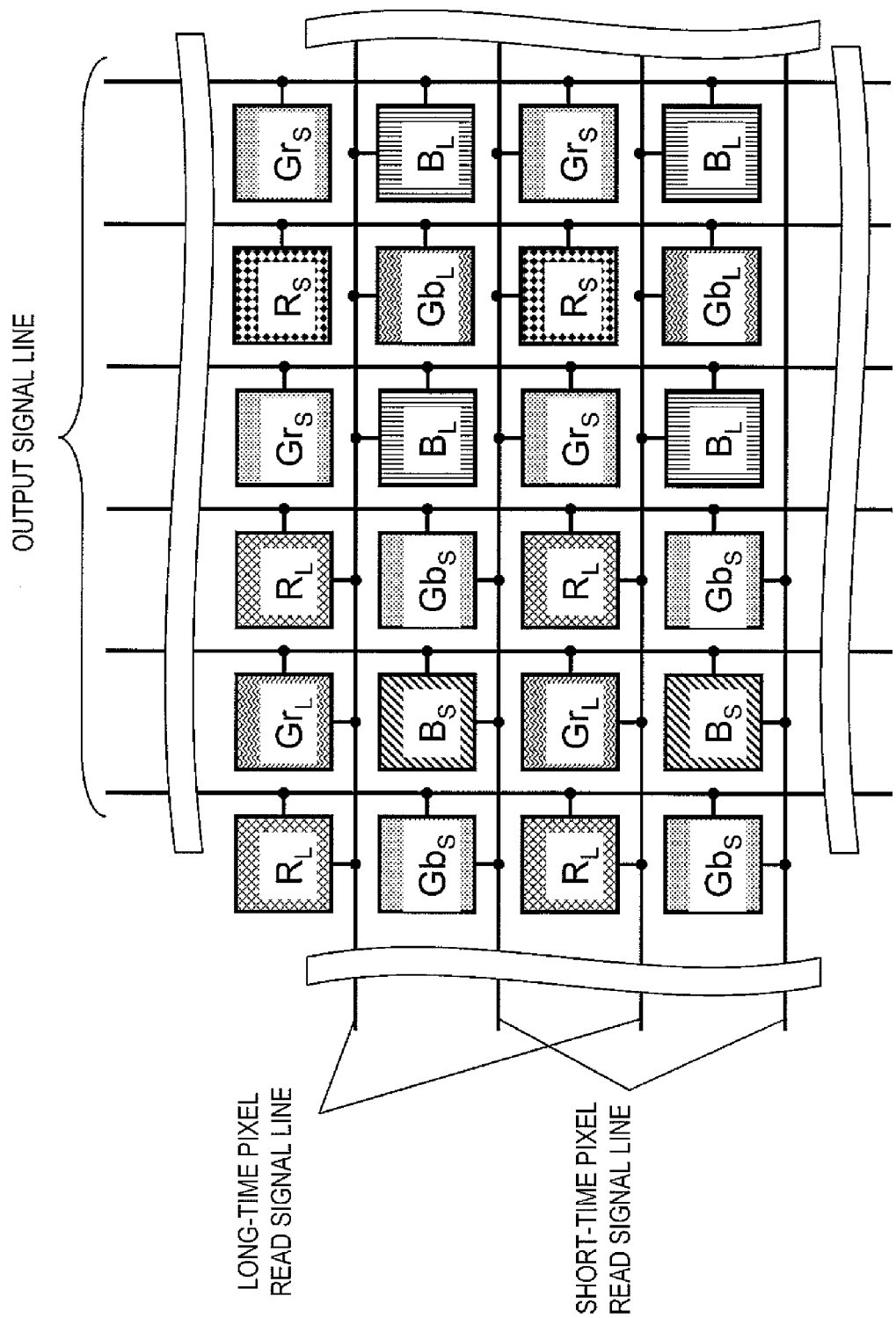
FIG. 22 illustrates yet another exemplary pixel arrangement that may be adopted according to the present disclosure.

FIG. 22 illustrates an example in which each set of long- and short-time pixels includes three pixels that are arranged horizontally in a row. As shown in FIG. 22, in the pixel array of the image sensor of this embodiment, horizontal lines, in each of which $R_L$, $G_L$ and $R_L$ pixels and $Gr_S$, $R_S$ and $Gr_S$ pixels are repeatedly arranged horizontally in this order, vertically alternate with horizontal lines, in each of which $Gb_S$, $B_S$ and $Gb_S$ pixels and $B_L$, $Gb_L$ and $B_L$ pixels are repeatedly arranged horizontally in this order. When the configuration shown in FIG. 22 is adopted, the wiring method that uses a smaller number of lines than a traditional method can be used as already described for the first embodiment.

By modifying the configuration shown in FIG. 22, the number of long- or short-time pixels to be arranged horizontally in a row as a set can be easily increased from three to four, five or more. However, as the number of long- or short-time pixels to be arranged in a row increases, it will be more and more difficult for the central one of the long-time pixels that are arranged horizontally in a row as a set to get high frame rate information from its surrounding short-time pixels in response to a horizontal motion of the subject, in particular. For that reason, in practice, it is recommended that the number of long- or short-time pixels to be arranged horizontally in a row be at most four.

Figure 23A:
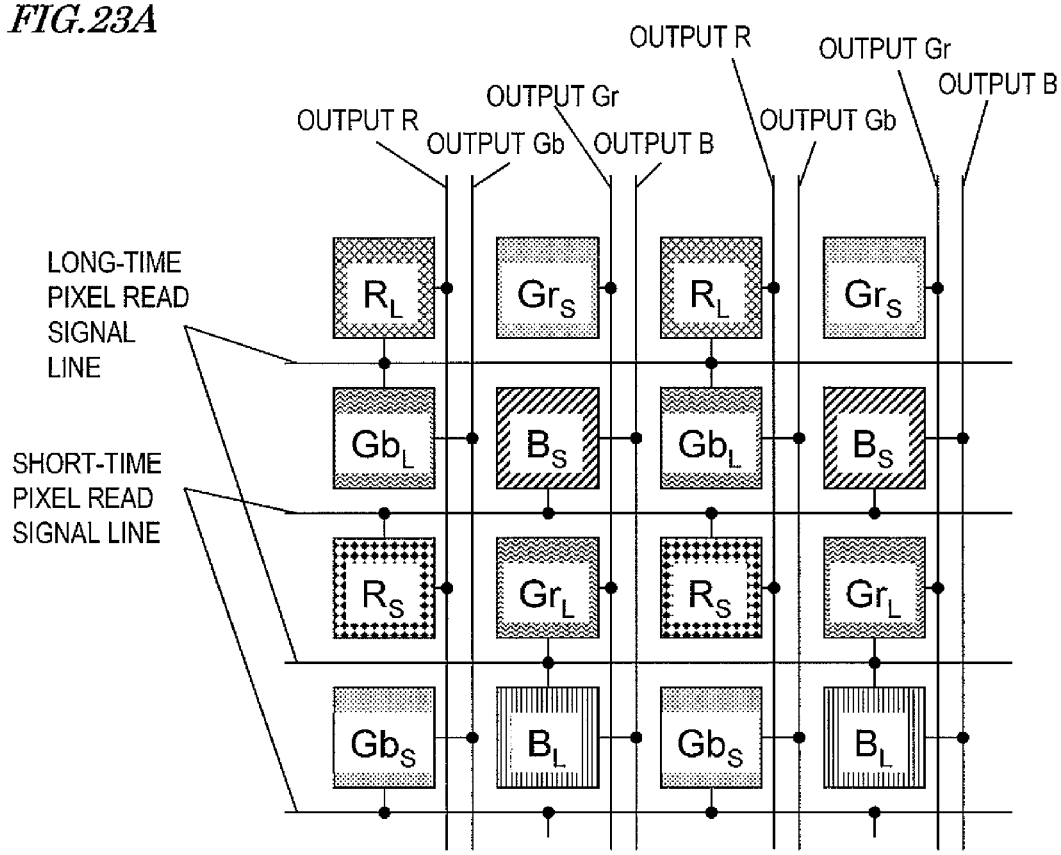
FIG. 23A illustrates yet another exemplary pixel arrangement that may be adopted according to the present disclosure.

FIG. 23A illustrates an exemplary arrangement for the pixel array of an image sensor according to the present disclosure in which long- and short-time pixels vertically alternate every two pixels. Even by adopting the arrangement shown in FIG. 23A, the arrangement of those color component pixels and the arrangement of long- and short-time pixels can still be kept symmetrical.

Figure 23B:
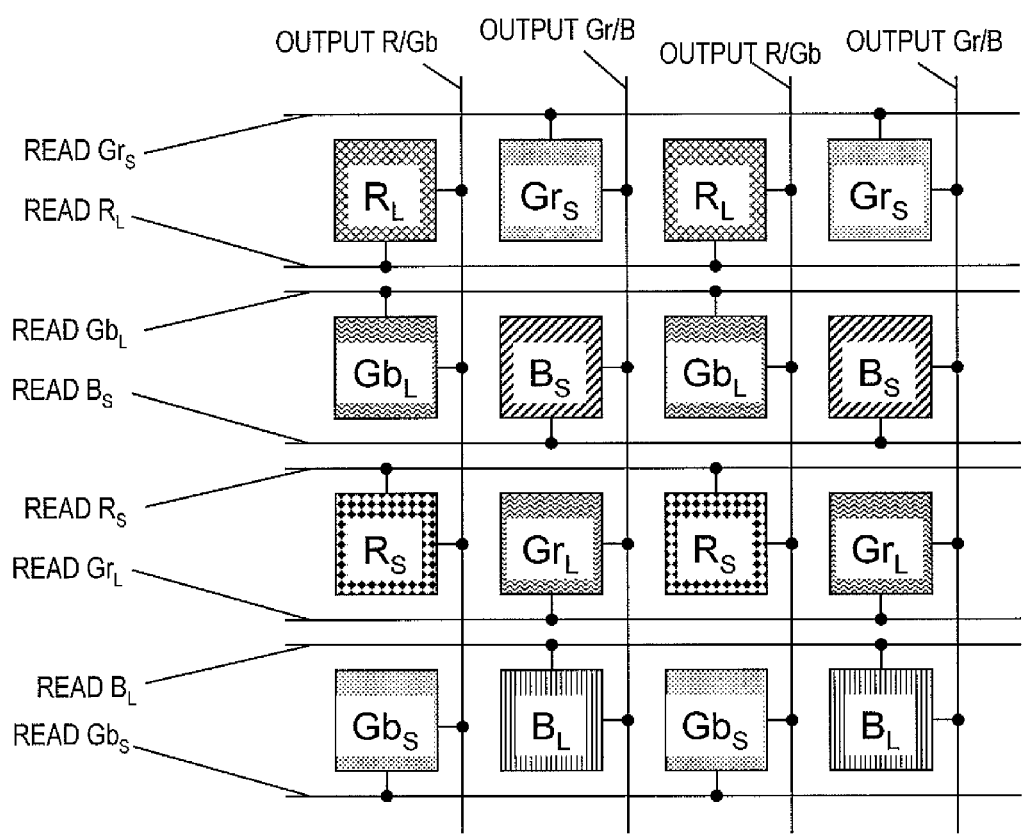
FIG. 23B illustrates yet another exemplary pixel arrangement that may be adopted according to the present disclosure.

However, as shown in FIG. 23A, when this configuration is adopted, the number of lines cannot be reduced as significantly as when the configuration of the first embodiment is adopted, and either two read signal lines or two output signal lines are arranged at each pixel location. FIG. 23A illustrates an example in which two output signal lines are arranged, while FIG. 23B illustrates an example in which two read signal lines are arranged. According to the configuration shown in FIG. 23A, every pixel output can be read with two kinds of read signals obtained from short- and long-time pixels. On the other hand, according to the configuration shown in FIG. 23B, different read signals need to be obtained from $R_L$ and $Gb_L$ pixels, both of which are long-time pixels, and do not have to rise to the H level simultaneously but need to have some time lag between them. The same can be said about $Gr_L$ and $B_L$ pixels, and about $R_S$ and $Gb_S$ pixels and about $Gr_S$ and $B_S$ pixels, which are short-time pixels. Also, the time lag to be left between the timings when the respective read signals rise to the H level may be 6 µs as in the first embodiment shown in FIG. 8.

Figure 24:
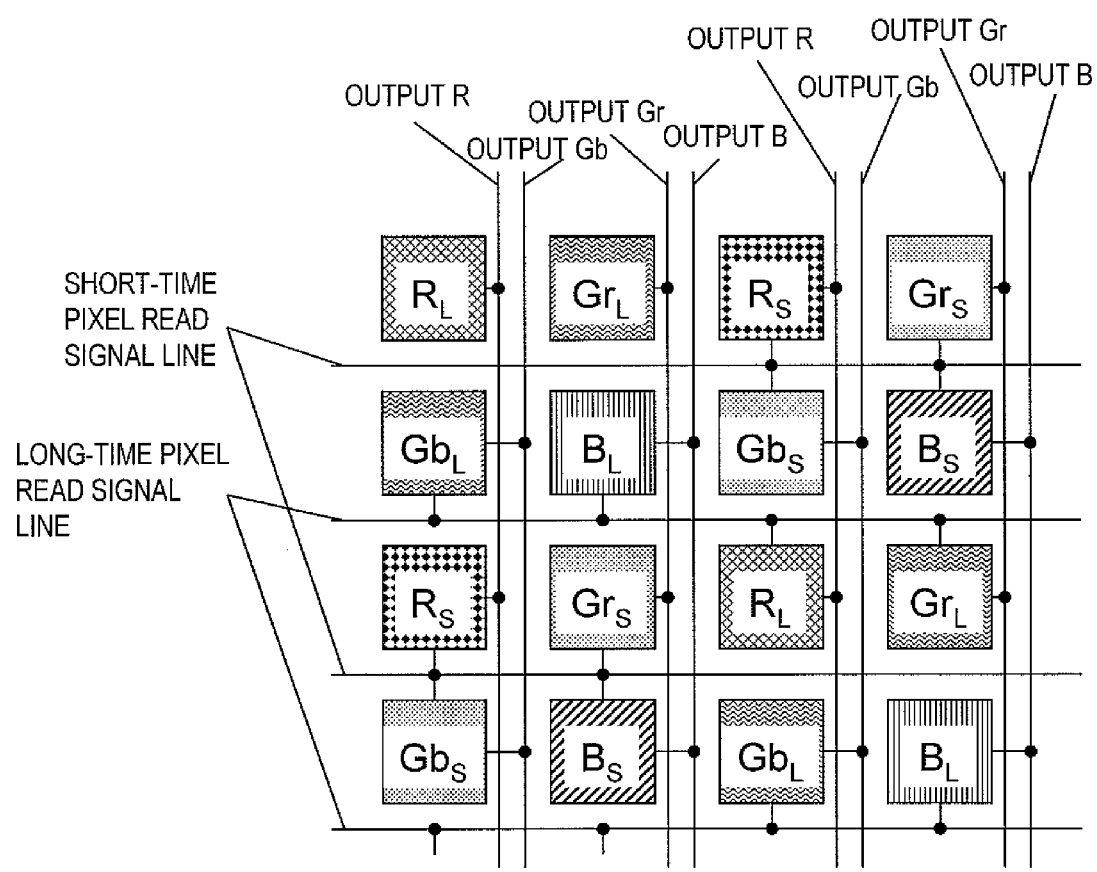
FIG. 24 illustrates yet another exemplary pixel arrangement that may be adopted according to the present disclosure.
Figure 25:
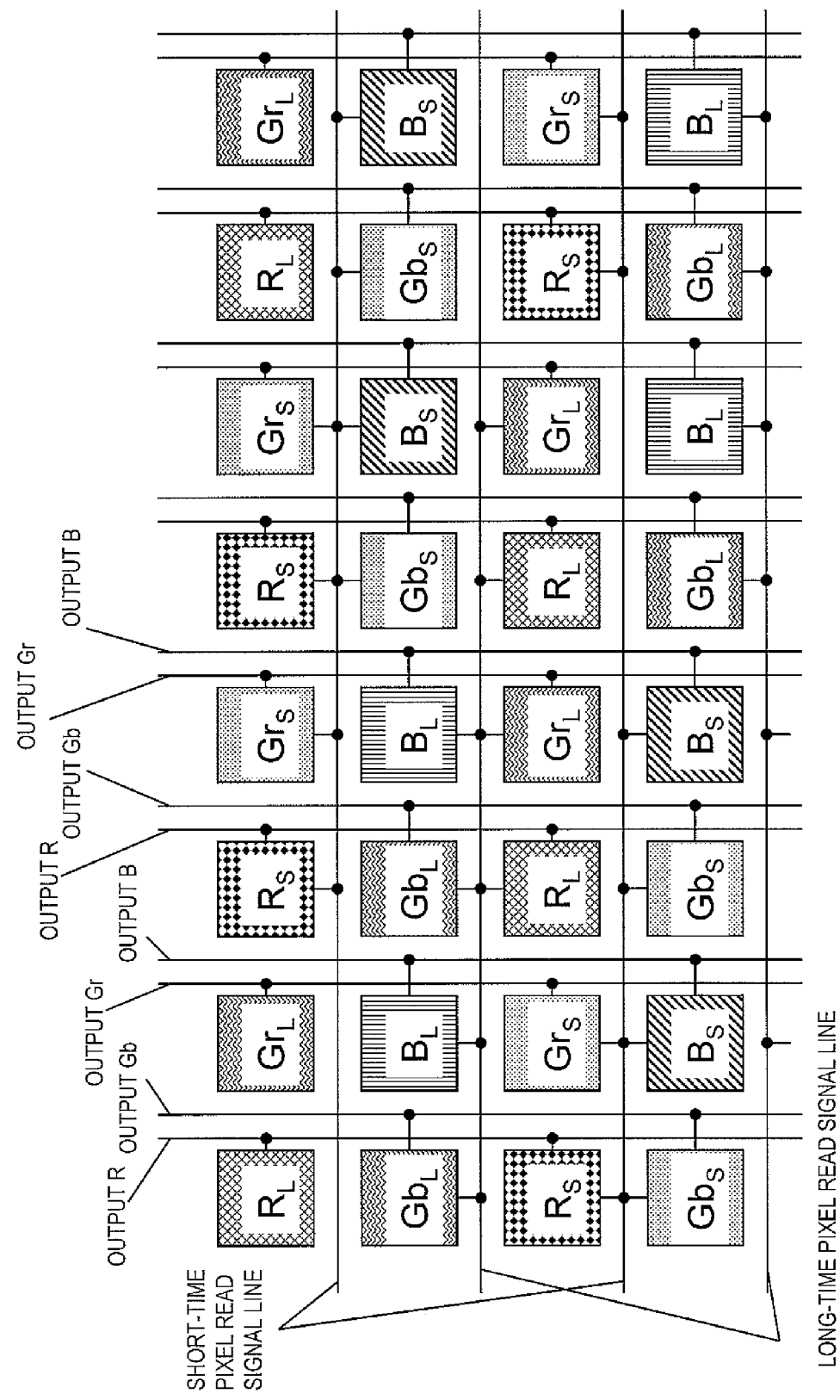
FIG. 25 illustrates yet another exemplary pixel arrangement that may be adopted according to the present disclosure.

FIGS. 24 and 25 illustrate examples in which long- and short-time pixels alternate both vertically and horizontally every two pixels in the pixel array of an image sensor according to the present disclosure. In the example illustrated in FIGS. 24 and 25, one read signal line and two output signal lines are provided for each pixel. However, even in the configurations shown in FIGS. 24 and 25, two read signal lines and two output signal lines may also be provided for each pixel as in the configuration shown in FIG. 23B. Even by adopting the arrangement shown in FIG. 24 or 25, the arrangement of those color component pixels and the arrangement of long- and short-time pixels can still be kept symmetrical.

According to the configurations shown in FIGS. 23A through 25, either two read signal lines or two output signal lines are provided for each pixel as shown in those drawings. That is why compared to the configuration of the first embodiment, the aperture area of each pixel, and eventually the sensitivity of the pixel, may decrease. Nevertheless, as two read signal lines AND two output signal lines are provided for each pixel in the known configuration disclosed in the article "A 2.2/3-inch 4K2K CMOS Image Sensor Based on Dual Resolution and Exposure Technique", the number of lines required can still be reduced in the configuration of this embodiment compared to the known arrangement because the image sensor of this embodiment can operate with either two read signal lines or two output signal lines provided for each pixel. For that reason, this embodiment is advantageous in terms of the apparatus area.

As already stated in the foregoing description of this embodiment, the image sensor according to the present disclosure can be implemented by arranging the long- and short-time pixels not just as in the pattern of the first embodiment described above but also in any other pattern as well.

Embodiment 4

Figure 37:
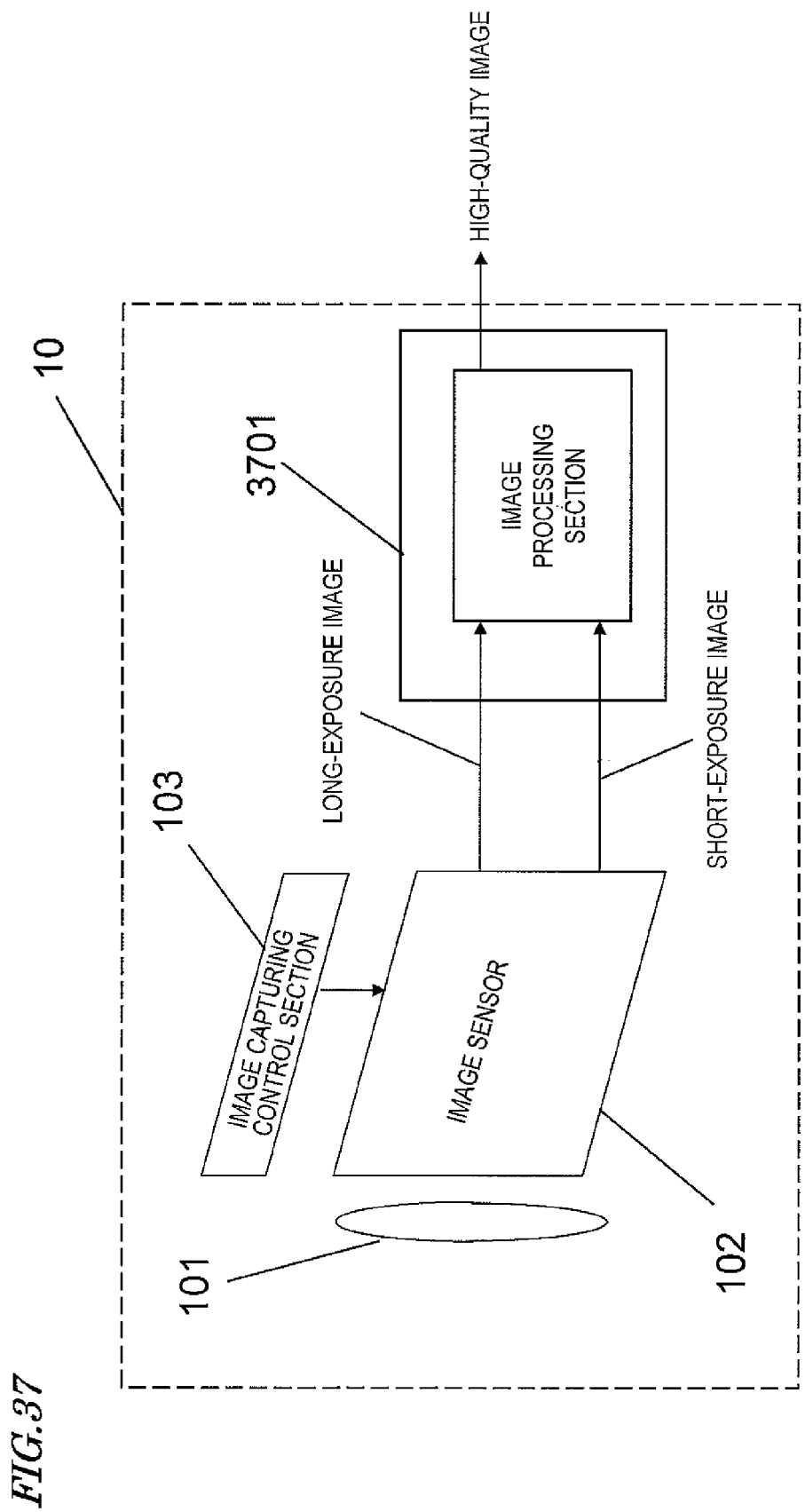
FIG. 37 shows an exemplary configuration for an image capture device according to a fourth embodiment of the present disclosure.

In the first embodiment described above, the image quality improvement processing section 105 is supposed to perform its processing using basically all of the deterioration constraint defined by Equation (10), the motion constraint defined by Equation (34) and the smoothness constraint defined by Equation (11). In the following description of this fourth embodiment, it will be described what if the motion constraint is not used. FIG. 37 illustrates a configuration for an image capture device according to the present disclosure in a situation where the image quality improvement processing section 105 performs its processing without using any motion constraint. In FIG. 37, any component having substantially the same function as its counterpart shown in FIG. 2A is identified by the same reference numeral and description thereof will be omitted herein. This configuration does not include the motion detecting section 1101 of the first embodiment shown in FIG. 12. By adopting such a configuration, the computational load can be lightened. According to the known technique, unless motion constraint is used, the image quality will deteriorate significantly as a result of the processing. According to the present disclosure, however, the motion constraint can be omitted without causing such significant deterioration in image quality. The reason is that as pixels of an image that has been shot through a short exposure process and pixels of an image that has been shot through a long exposure process are both included in each color channel of RGB, those pixels of an image that has been shot through a short exposure process can minimize the occurrence of color smearing when image quality improvement processing is performed without using any motion constraint.

Hereinafter, it will be described how the image quality improvement processing section 3701 performs its image quality improvement processing.

If M of Equation (4) is 2, if Equation (11) or (12) is used as Q, if m in those equations is 2, and if one of Equations (14), (15) and (16) is used as differential expansion of first- or second-order differentiation or if P of Equation (38) is 2, then the evaluation function J becomes a quadratic function of f. In that case, as in Equation (45) or (46) of the first embodiment, f can be obtained by solving a simultaneous linear equation. And as in Equation (46), that simultaneous equation is supposed to be $$Af = b \qquad (50)$$

Figure 38:
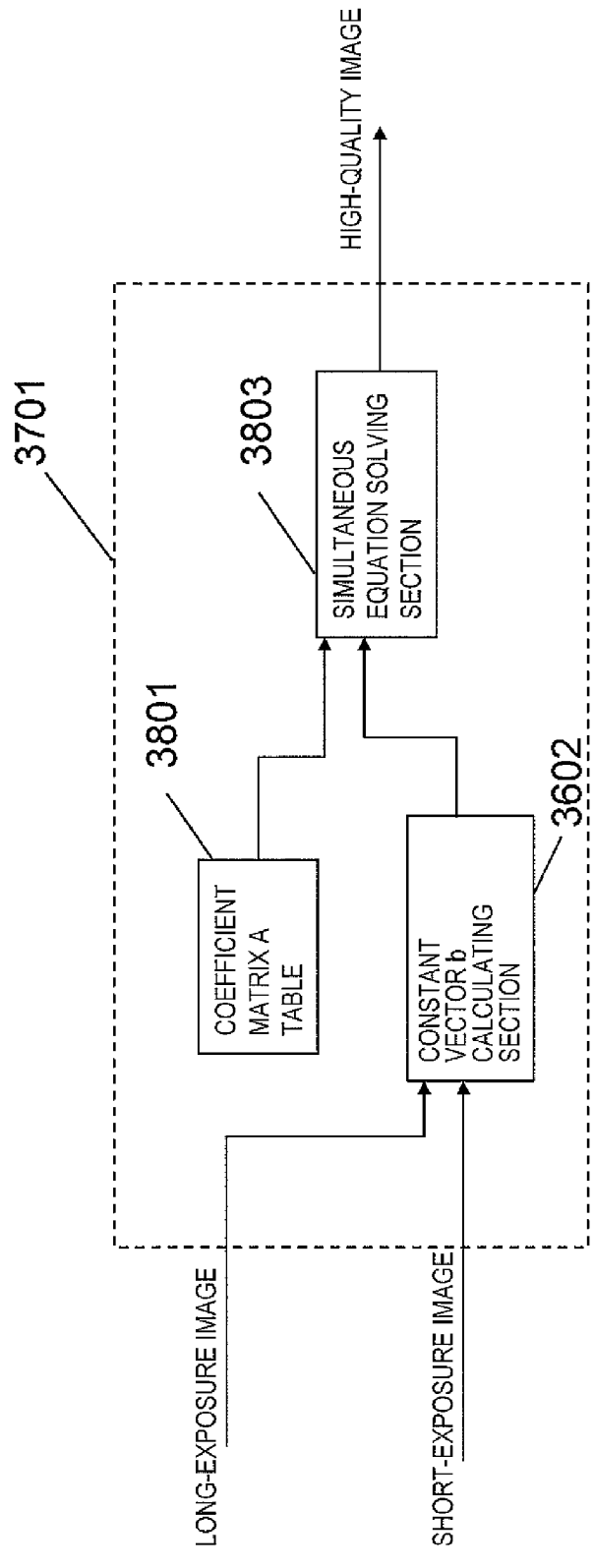
FIG. 38 shows an exemplary internal configuration for an image processing section according to the fourth embodiment of the present disclosure.

FIG. 38 illustrates an exemplary internal configuration for the image quality improvement processing section 3701 that solves this simultaneous equation (50). As the motion of the short-exposure image is not used according to this embodiment to solve the equation f, the coefficient matrix A does not depend on the content. That is why as shown in FIG. 38, the values may be stored in advance on the coefficient matrix A table 3801. Optionally, the inverse matrix of A may also be stored on the coefficient matrix A table 3801.

The simultaneous equation solving section 3803 may perform the operation of directly multiplying the right side b by the inverse matrix of A in order to obtain f. Also, if A has the form of a circulant matrix, the matrix can be diagonalized and the number of times of multiplications to get b multiplied by the inverse matrix of A can be further reduced by performing a fast Fourier transform. That is why the simultaneous equation solving section 3803 may have the function of performing a fast Fourier transform on either the coefficient matrix A or the right side vector b. In a situation where the simultaneous equation solving section 3803 has such a function of performing a fast Fourier transform, if the Fourier transform matrix is represented by W, then the coefficient matrix A is diagonalized as:

$$A = W\Lambda W^{-1} \qquad (51)$$

And f is eventually obtained as:

$$f = A^{-1}b = W^{-1}\Lambda^{-1}Wb \qquad (52)$$

By adopting the configuration of this embodiment, there is no need to calculate the coefficient matrix A according to the input, and the number of times of multiplications to get done can be further reduced if the matrix can be diagonalized. As a result, the computational load can be lightened and the time for getting computations done can be shortened.

Embodiment 5

In the first through fourth embodiments described above, the number of pixels that form a group of long-time pixels (which will be referred to herein as a "first pixel group") to be arranged in a row on the image capturing plane is equal to that of pixels that form a group of short-time pixels (which will be referred to herein as a "second pixel group") to be arranged in a row on the image capturing plane. However, this is just an example of an image capture device according to the present disclosure. Alternatively, the number of long-time pixels that form the first pixel group may be larger than that of short-time pixels that form the second pixel group. Furthermore, in the image sensor of the present disclosure, the configurations of the first and second pixel groups do not have to be the same over the entire image capturing plane. Optionally, the first and second pixel groups may be made up of different numbers of pixels from one location to another on the image capturing plane. In this embodiment, the configurations of the first and second pixel groups do not remain the same.

It should be noted that even if the number of pixels that form the first pixel group is different from that of pixels that form the second pixel group, the first and second pixel groups still need to alternate with each other either horizontally or vertically.

Figure 42:
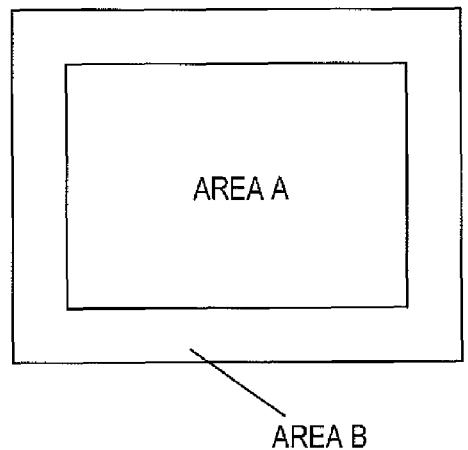
FIG. 42 illustrates an exemplary configuration for an image sensor according to a fifth embodiment of the present disclosure.

FIG. 42 illustrates an example of an image sensor according to this embodiment. As shown in FIG. 42, in the image sensor of this embodiment, the pixels that form the first and second pixel groups are arranged differently in the central area A of the image capturing plane from in the peripheral area B thereof.

Figure 43A:
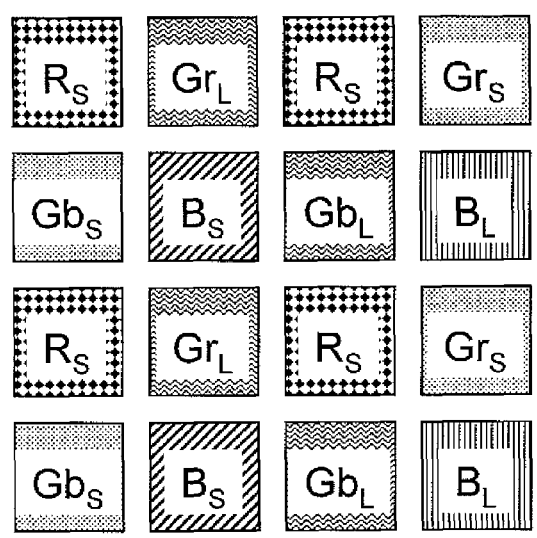
FIG. 43A illustrates an exemplary arrangement for area A in the image sensor according to the fifth embodiment of the present disclosure.
Figure 43B:
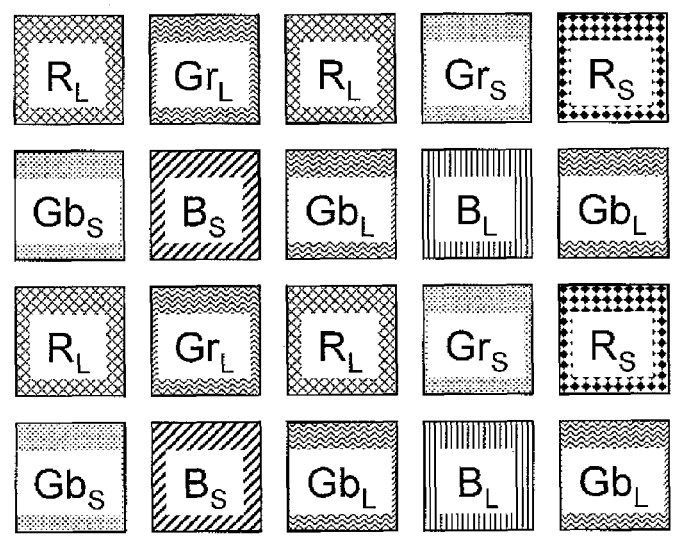
FIG. 43B illustrates an exemplary arrangement for area B in the image sensor according to the fifth embodiment of the present disclosure.

In the area A, long-time pixels and short-time pixels horizontally alternate every two pixels as shown in FIG. 43A. That is to say, the first and second pixel groups are each made up of two horizontally adjacent pixels. On the other hand, in the area B, three long-time pixels that are horizontally arranged in a row alternate with two short-time pixels that are also horizontally arranged in a row as shown in FIG. 43B. That is to say, the first pixel group is made up of three horizontally consecutive pixels and the second pixel group is made up of two horizontally consecutive pixels.

The area A may be defined by horizontally removing one-sixteenth of the effective pixel area from the right and left ends of the image capturing plane and by vertically removing one-ninth of the effective pixel area from the top and bottom of the image capturing plane. Even when such an arrangement is adopted, one read signal line and one output signal line may be provided for each horizontal row of pixels and each vertical column of pixels as in FIG. 4.

By adopting such a configuration, even if the quantity of light incident on the image sensor decreases in the peripheral area of the image capturing plane due to the property of the lens, a sufficient quantity of light can be secured in the peripheral area of the image capturing plane because a lot of long-time pixels are arranged in the peripheral area. As a result, it is possible to reduce the influence of a decrease in the quantity of light incident on the peripheral area on the image captured and on the image quality improvement processing to be performed later.

As already described about this embodiment, the image sensor of the present disclosure may also have a configuration in which the number of pixels that form the first pixel group is different from that of pixels that form the second pixel group or a configuration in which the internal configurations of the first and second pixel groups vary from one location to another on the image capturing plane. By adopting such a configuration, the influence of non-uniformity in the quantity of light incident on the image capturing plane or the output signal, which is observed as a decrease in the quantity of light incident on a peripheral portion of a lens or pixel shading, on the image quality improvement processing to be performed later can be minimized.

An image processing method according to the present disclosure includes the steps of: receiving, from the solid-state image sensor of the present disclosure, a first moving picture that has been captured in a first exposure time and a second moving picture that has been captured in a second exposure time; and performing image quality improvement processing by generating, based on the first and second moving pictures, a color moving picture having a higher frame rate than the first moving picture. The pixel value of each frame of the output color moving picture is suitably determined so as to reduce a difference in the pixel value of each frame between a situation where the output color moving picture is subjected to temporal sampling so that the frame rate corresponds to the second exposure time and a situation where an image is captured in the second exposure time.

The step of performing the image quality improvement processing includes: specifying a constraint, which the value of a pixel of the output color moving picture to generate needs to satisfy in order ensure continuity with the values of pixels that are temporally and spatially adjacent to the former pixel; and generating the output color moving picture so as to maintain the constraint specified. In a preferred embodiment, the method further includes the step of detecting the motion of an object based on a moving picture that has been captured in the second exposure time. The step of performing the image quality improvement processing includes generating the output color moving picture so that the value of each pixel of the new moving picture to generate maintains the constraint to be satisfied based on a result of the motion detection.

A computer program according to the present disclosure makes a computer perform the image processing method described above so as to generate a new moving picture based on a plurality of moving pictures. Such a computer program is suitably stored on a tangible storage medium and used. Examples of such storage media include semiconductor integrated circuit chips, hard disk drives and optical discs.

According to an embodiment of the present disclosure, pixels of a color component image (e.g., G pixels) that have been read through a long exposure process (i.e., at a low frame rate) according to the traditional technology are classified into two different types of pixels, namely, long-exposure (i.e., low-frame-rate) pixels and short-exposure (i.e., high-frame-rate) pixels, and signals are read from those two types of pixels. As a result, an image signal can be obtained with color smearing, which will be caused by movement of the subject, reduced significantly compared to a situation where every pixel signal has been obtained through a long-exposure process.

The present disclosure can be used in an image capture device which captures a color moving picture and in a video appliance or system, a video synthesizer, a video editor, or a video restoration device in which such an image capture device is built. The present disclosure can also be implemented as a computer program that describes the image capturing control operation by the image capture device.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:
1. A solid-state image sensor comprising:
a pixel array including a plurality of pixels that are arranged in columns and rows;
a plurality of read signal lines, each of which is connected to a number of pixels that are arranged in a row direction;
a plurality of output signal lines, each of which is connected to a number of pixels that are arranged in a column direction; and
a color filter array which defines the color components of light rays to be incident on the plurality of pixels,
wherein in the pixel array, first pixel groups, each of which is made up of a plurality of pixels that captures an image in a first exposure time, and second pixel groups, each of which is made up of a plurality of pixels that captures an image in a second exposure time that is shorter than the first exposure time, are alternately arranged in either the row direction or the column direction, each of the first and second pixel groups being made up of pixels that are arranged in one row and L columns (where L is an integer that is equal to or greater than two), and
wherein the plurality of read signal lines are classified into a first type of read signal lines that are connected to the first pixel groups and a second type of read signal lines that are connected to the second pixel groups, each said read signal line of the first type being connected to the first pixel group that is located on a row that is adjacent to the read signal line on one side and to the first pixel group that is located on a row that is adjacent to the read signal line on the other side, each said read signal line of the second type being connected to the second pixel group that is located on a row that is adjacent to the read signal line on one side and to the second pixel group that is located on a row that is adjacent to the read signal line on the other side, and
wherein the color filter array makes light rays with mutually different color components incident on a number of pixels that are included in each said first pixel group and also makes light rays with mutually different color components incident on a number of pixels that are included in each said second pixel group.

2. The solid-state image sensor of claim 1, wherein in the entire range of the pixel array, the first and second pixel groups are arranged alternately either in the row direction or in the column direction.

3. The solid-state image sensor of claim 1, wherein the color filter array makes light rays with the same color component incident on at least one of the pixels that form each said first pixel group and on at least one of the pixels that form each said second pixel group, respectively.

4. The solid-state image sensor of claim 3, wherein the color filter array makes green light rays incident on at least one of the pixels that form each said first pixel group and on at least one of the pixels that form each said second pixel group, respectively.

5. The solid-state image sensor of claim 1, wherein the color filter array makes light rays in one combination of colors incident on the first pixel group that is located on one of two adjacent rows and also makes light rays in another combination of colors incident on the first pixel group that is located on the other one of the two adjacent rows.

6. The solid-state image sensor of claim 1, wherein the first and second pixel groups are each comprised of pixels that are arranged in one row and two columns.

7. The solid-state image sensor of claim 1, wherein the first and second pixel groups are alternately arranged not only in the row direction but also in the column direction.

8. The solid-state image sensor of claim 1, wherein each said read signal line of the first type is located between $(2K-1)^{th}$ and $2K^{th}$ rows (where K is an integer that is equal to or greater than one), and
wherein each said read signal line of the second type is located between $2K^{th}$ and $(2K+1)^{th}$ rows.

9. The solid-state image sensor of claim 1, wherein each said read signal line of the second type is located between $(2K-1)^{th}$ and $2K^{th}$ rows (where K is an integer that is equal to or greater than one), and
wherein each said read signal line of the first type is located between $2K^{th}$ and $(2K+1)^{th}$ rows.

10. The solid-state image sensor of claim 1, wherein each of the first and second pixel groups is comprised of pixels that are arranged in one row and two columns, and
wherein the color filter array has a configuration in which first, second and third color component filters which transmit first, second and third color components, respectively, are arranged, and
wherein the first pixel group which is located on a $(2K-1)^{th}$ row (where K is an integer that is equal to or greater than one) includes pixels on which light rays with the first and third color components are respectively incident, and
wherein the second pixel group which is located on the $(2K-1)^{th}$ row includes pixels on which light rays with the first and third color components are respectively incident, and
wherein the first pixel group which is located on the $2K^{th}$ row includes pixels on which light rays with the second and third color components are respectively incident, and
wherein the second pixel group which is located on the $2K^{th}$ row includes pixels on which light rays with the second and third color components are respectively incident.

11. The solid-state image sensor of claim 10, wherein the first color component is one of the colors red and blue, the second color component is the other of the colors red and blue and the third color component is the color green.

12. The solid-state image sensor of claim 10, wherein each of the first and second pixel groups is comprised of pixels that are arranged in one row and two columns, and
wherein the color filter array has a configuration in which first, second, third and fourth color component filters which transmit first, second, third and fourth color components, respectively, are arranged, and
wherein the first pixel group which is located on a $(2K-1)^{th}$ row (where K is an integer that is equal to or greater than one) includes pixels on which light rays with the first and fourth color components are respectively incident, and
wherein the second pixel group which is located on the $(2K-1)^{th}$ row includes pixels on which light rays with the first and fourth color components are respectively incident, and
wherein the first pixel group which is located on the $2K^{th}$ row includes pixels on which light rays with the second and third color components are respectively incident, and
wherein the second pixel group which is located on the $2K^{th}$ row includes pixels on which light rays with the second and third color components are respectively incident.

13. The solid-state image sensor of claim 12, wherein a set of the first, second, third and fourth color components is a set of the colors cyan, magenta, yellow and green.

14. An image capture device comprising:
the solid-state image sensor of claim 1;
an image capturing control section which outputs two different kinds of read signals, which are asserted in two non-overlapping periods, to the first and second types of read signal lines of the solid-state image sensor, respectively; and
an image quality improvement processing section which improves the image quality of a moving picture with a frame rate corresponding to the second exposure time based on a pixel signal associated with the first exposure time and obtained from the first pixel group of the solid-state image sensor and a pixel signal associated with the second exposure time and obtained from the second pixel group, thereby generating a color moving picture.

15. The image capture device of claim 14, wherein the image quality improvement processing section determines the pixel value of each frame of the color moving picture so as to reduce a difference in the pixel value of each frame between a situation where temporal sampling is carried out so that the frame rate corresponds to the second exposure time and a situation where an image is captured in the second exposure time.

16. The image capture device of claim 14, wherein the image quality improvement processing section specifies a constraint, which the value of a pixel of the color moving picture to generate needs to satisfy in order ensure continuity with the values of pixels that are temporally and spatially adjacent to the former pixel, and generates the color moving picture so as to maintain the constraint specified.

17. The image capture device of claim 14 further comprising a motion detecting section that detects the motion of an object based on a moving picture that has been captured in the second exposure time,
wherein the image quality improvement processing section generates the color moving picture so that the value of each pixel of the new moving picture to generate maintains the constraint to be satisfied based on a result of the motion detection.

18. An image processing method comprising the steps of:
  receiving, from the solid-state image sensor of claim 1, a first moving picture that has been captured in the first exposure time and a second moving picture that has been captured in the second exposure time; and
  performing image quality improvement processing by generating, based on the first and second moving pictures, a color moving picture having a higher frame rate than the first moving picture.

19. The image processing method of claim 18, wherein the pixel value of each frame of the output color moving picture is determined so as to reduce a difference in the pixel value of each frame between a situation where the output color moving picture is subjected to temporal sampling so that the frame rate corresponds to the second exposure time and a situation where an image is captured in the second exposure time.

20. The image processing method of claim 18, wherein the step of performing the image quality improvement processing includes: specifying a constraint, which the value of a pixel of the output color moving picture to generate needs to satisfy in order ensure continuity with the values of pixels that are temporally and spatially adjacent to the former pixel; and generating the output color moving picture so as to maintain the constraint specified.

21. The image processing method of claim 18, further comprising the step of detecting the motion of an object based on a moving picture that has been captured in the second exposure time,
  wherein the step of performing the image quality improvement processing includes generating the output color moving picture so that the value of each pixel of the new moving picture to generate maintains the constraint to be satisfied based on a result of the motion detection.

22. A computer program, stored on a non-transitory tangible medium, for generating a new moving picture based on a plurality of moving pictures,
  wherein the computer program makes a computer which executes the computer program perform the image processing method of claim 18.

23. A storage medium having stored thereon the computer program of claim 22.

* * * * *